United States Patent
Kim et al.

(10) Patent No.: US 9,455,407 B2
(45) Date of Patent: Sep. 27, 2016

(54) COMPOUND AND ORGANIC LIGHT-EMITTING DEVICE INCLUDING THE SAME

(71) Applicant: SAMSUNG DISPLAY CO., LTD., Yongin, Gyeonggi-Do (KR)

(72) Inventors: Jong-Woo Kim, Yongin (KR); Young-Kook Kim, Yongin (KR); Jin-O Lim, Yongin (KR); Seok-Hwan Hwang, Yongin (KR); Hyoung-Kun Kim, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 97 days.

(21) Appl. No.: 14/303,771

(22) Filed: Jun. 13, 2014

(65) Prior Publication Data

US 2015/0255723 A1  Sep. 10, 2015

(30) Foreign Application Priority Data

Mar. 5, 2014  (KR) .................. 10-2014-0026210

(51) Int. Cl.
*H01L 27/146* (2006.01)
*C07D 311/78* (2006.01)
(Continued)

(52) U.S. Cl.
CPC ......... *H01L 51/0032* (2013.01); *H01L 51/504* (2013.01); *H01L 51/5024* (2013.01); *H01L 51/5056* (2013.01); *H01L 51/5072* (2013.01); *H01L 51/5092* (2013.01)

(58) Field of Classification Search
CPC ........................ H01L 51/0032; H01L 51/50
USPC ......... 549/43, 382; 257/258; 528/8; 563/427
See application file for complete search history.

(56) References Cited

U.S. PATENT DOCUMENTS 5,668,438 A * 9/1997 Shi ............... H01L 51/5012
                                                  313/504
6,737,800 B1 * 5/2004 Winters ............ C09K 11/06
                                                  313/113
(Continued)

FOREIGN PATENT DOCUMENTS

KR  10-2006-0006760 A   1/2006
KR  10-2006-0115372 A  11/2006
KR  10-2007-0015209 A   2/2007

OTHER PUBLICATIONS

Patrick M. Donovan et al, "Elaboration of diaryl ketones into naphthalenes fused on two or four sides: a naphthoannulation procedure", Journal of the American Chemical Society, vol. 126 (2004) pp. 3108-3112.*

(Continued)

*Primary Examiner* — Caridad Everhart
(74) *Attorney, Agent, or Firm* — Lee & Morse, P.C.

(57) ABSTRACT

A compound, an organic light-emitting device, and a flat panel display device, the compound being represented by Formula 1, below:

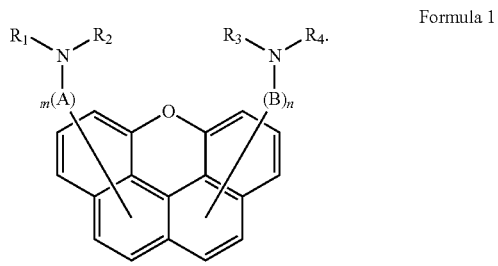

Formula 1

21 Claims, 1 Drawing Sheet

(51) Int. Cl.
*H01L 51/00* (2006.01)
*H01L 51/50* (2006.01)

(56) References Cited

U.S. PATENT DOCUMENTS

| | | | |
|---|---|---|---|
| 6,998,493 B2* | 2/2006 | Banning | C09B 11/12 |
| | | | 502/150 |
| 7,053,255 B2 | 5/2006 | Ikeda et al. | |
| 7,233,019 B2 | 6/2007 | Ionkin et al. | |
| 9,034,920 B2* | 5/2015 | Lam | C09B 7/0092 |
| | | | 514/459 |
| 2004/0214035 A1 | 10/2004 | Ikeda et al. | |
| 2005/0156164 A1 | 7/2005 | Sotoyama | |
| 2005/0238910 A1 | 10/2005 | Ionkin et al. | |
| 2007/0063638 A1 | 3/2007 | Tokairin et al. | |
| 2007/0114487 A1 | 5/2007 | Minor | |
| 2010/0013381 A1* | 1/2010 | Stoessel | C07C 13/62 |
| | | | 313/504 |
| 2010/0096982 A1* | 4/2010 | Eum | C09K 11/06 |
| | | | 313/504 |
| 2011/0037063 A1* | 2/2011 | Buesing | C07C 13/62 |
| | | | 257/40 |
| 2011/0108819 A1* | 5/2011 | Kathirgamanathan | C07D 263/57 |
| | | | 257/40 |
| 2011/0278551 A1* | 11/2011 | Yabunouchi | C07D 405/12 |
| | | | 257/40 |
| 2015/0102308 A1* | 4/2015 | Kobayashi | C07D 493/06 |
| | | | 257/40 |

OTHER PUBLICATIONS

Ommid Anamimoghadam et al , "Naphthoxanthenyl, a new stable phenalenyl type radical stabilized by electronic effects", Organic Letters, vol. 15, No. 12 (2013) pp. 2970-2973.*
1,8,9-Perinaphthoxanthene, 191-37-7, LookChemical.com.

* cited by examiner

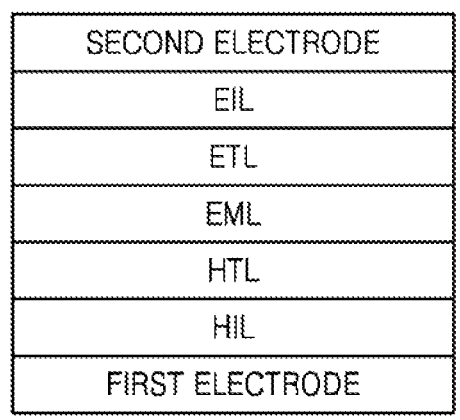

COMPOUND AND ORGANIC LIGHT-EMITTING DEVICE INCLUDING THE SAME

CROSS-REFERENCE TO RELATED APPLICATION

Korean Patent Application No. 10-2014-0026210, filed on Mar. 5, 2014, in the Korean Intellectual Property Office, and entitled: "Compound and Organic Light-Emitting Device Comprising the Same," is incorporated by reference herein in its entirety.

BACKGROUND

1. Field

Embodiments relate to a compound and an organic light-emitting device including the same.

2. Description of the Related Art

Organic light-emitting devices, which are self-emitting devices, may have advantages such as a wide viewing angle, excellent contrast, quick response, high brightness, and excellent driving voltage characteristics, and may provide multicolored images.

An organic light-emitting device may have a structure including a substrate, and an anode, a hole transport layer (HTL), an emission layer (EML), an electron transport layer (ETL), and a cathode which are sequentially stacked on the substrate. In this regard, the HTL, the EML, and the ETL may be organic thin films respectively formed of organic compounds.

An operating principle of an organic light-emitting device having the above-described structure may be as follows.

When a voltage is applied between the anode and the cathode, holes injected from the anode may move to the EML via the HTL, and electrons injected from the cathode may move to the EML via the ETL. Carriers (such as the holes and electrons) may recombine in the EML to generate excitons. When the excitons drop from an excited state to a ground state, light may be emitted.

SUMMARY

Embodiments are directed to a compound and an organic light-emitting device including the same.

According to one or more embodiments, a compound is represented by Formula 1 below:

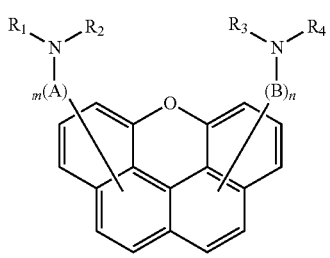

Formula 1 wherein $R_1$ to $R_4$ are each independently a substituted or unsubstituted $C_6$-$C_{60}$ aryl group, a substituted or unsubstituted $C_1$-$C_{60}$ heteroaryl group, or a substituted or unsubstituted $C_6$-$C_{60}$ condensed polycyclic group, A and B are each independently a substituted or unsubstituted $C_6$-$C_{60}$ arylene group or a substituted or unsubstituted $C_1$-$C_{60}$ heteroarylene group, and m and n are each independently an integer of 0 or 1.

According to one or more embodiments, an organic light-emitting device includes: a first electrode; a second electrode; and an organic layer interposed between the first electrode and second electrode, wherein the organic layer includes the compound represented by Formula 1.

According to one or more embodiments, a flat panel display device includes the organic light-emitting device, wherein the first electrode of the organic light-emitting device is electrically connected to a source electrode or a drain electrode of a thin-film transistor.

BRIEF DESCRIPTION OF THE DRAWING

Features will be apparent to those of skill in the art by describing in detail exemplary embodiments with reference to the attached drawing in which:

FIG. 1 illustrates a schematic cross-sectional view of an organic light-emitting device according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

A compound according to an embodiment may be represented by Formula 1, below.

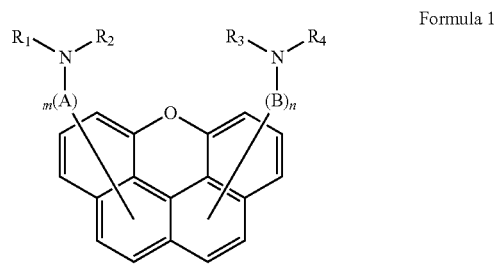

Formula 1

In Formula 1, $R_1$ to $R_4$ may be each independently a substituted or unsubstituted $C_6$-$C_{60}$ aryl group, a substituted or unsubstituted $C_1$-$C_{60}$ heteroaryl group, or a substituted or unsubstituted $C_6$-$C_{60}$ condensed polycyclic group, A and B may be each independently a substituted or unsubstituted $C_6$-$C_{60}$ arylene group or a substituted or unsubstituted $C_1$-$C_{60}$ heteroarylene group, and m and n may be each independently an integer of 0 or 1.

The compound according to an embodiment may be suitable for a light-emitting material used in organic light-emitting devices. For example, the compound represented by Formula 1 may have a high glass transition temperature (Tg) or melting point due to an introduction of a heterocyclic group. Thus, the compound may have high thermal resistance against Joule heat generated in an organic layer, between organic layers, and/or between an organic layer and a metallic electrode when light emission occurs, and may have high durability in a high-temperature environment. An organic light-emitting device manufactured using the compound of Formula 1 may have high durability when stored or operated.

Substituents of Formula 1 will be described below in more detail.

According to an embodiment, $R_1$ to $R_4$ may be each independently selected from the group of moieties represented by Formulae 2a to 2d, below.

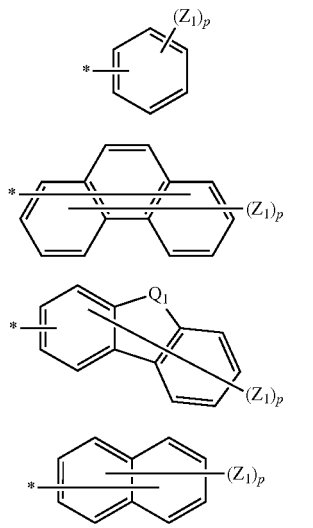

In Formulae 2a to 2d, $Q_1$ may be —C($R_{31}$)($R_{32}$)—, —S—, or —O—, $Z_1$, $R_{31}$, and $R_{32}$ may be each independently, a hydrogen atom, a deuterium atom, a substituted or unsubstituted $C_1$-$C_{20}$ alkyl group, a $C_1$-$C_{20}$ alkylsilyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen-containing group, a cyano group, a nitro group, a hydroxyl group, or a carboxyl group, P may be an integer of 1 to 9, and * is a binding site (e.g., to an N atom of Formula 1).

In an implementation, A and B may be each independently a moiety represented by Formula 3a, below.

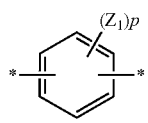

In Formula 3a, $Z_1$ may be a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen-containing group, a cyano group, a nitro group, a hydroxyl group, or a carboxyl group, P may be an integer of 1 to 4, and the *s are binding sites (e.g., to a N atom and/or to the core moiety of Formula 1).

In an implementation, the compound represented by Formula 1 may be represented by one of Formula 2, 3, 4, or 5.

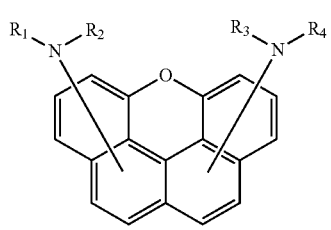

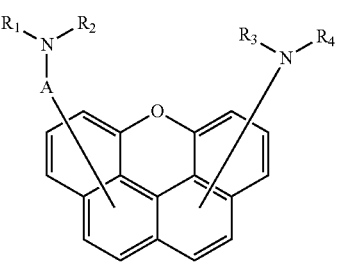

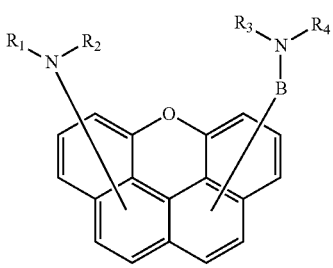

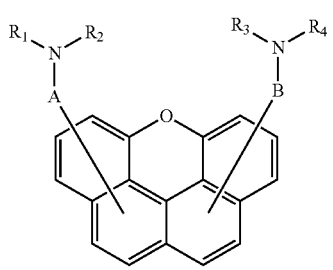

Substituents of Formulae 2 to 5 may be as defined above with reference to Formula 1.

Substituents used herein will now be described in detail. In this regard, the numbers of carbon atoms in the substituents are presented only for illustrative purposes and do not limit the characteristics of the substituents. Substituents that are not defined herein are defined as well known in the art.

The unsubstituted $C_1$-$C_{60}$ alkyl group may be linear or branched. Examples of the alkyl group may include, but are not limited to, methyl, ethyl, propyl, isobutyl, sec-butyl, pentyl, iso-amyl, hexyl, heptyl, octyl, nonanyl, and dodecyl. At least one hydrogen atom of the alkyl group may be substituted with a deuterium atom, a halogen atom, a hydroxyl group, a nitro group, a cyano group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, a $C_1$-$C_{10}$ alkylsilyl group, a $C_1$-$C_{10}$ alkoxy group, a $C_2$-$C_{10}$ alkenyl group, a $C_2$-$C_{10}$ alkynyl group, a $C_6$-$C_{16}$ aryl group, a $C_4$-$C_{16}$ heteroaryl group, or an organosilyl group.

The unsubstituted $C_2$-$C_{60}$ alkenyl group refers to a hydrocarbon group having at least one carbon-carbon double bond within or at a terminal of the alkyl group. Examples of the unsubstituted $C_2$-$C_{60}$ alkenyl group include ethenyl, propenyl, and butenyl. At least one hydrogen atom of the unsubstituted $C_2$-$C_{60}$ alkenyl group may be substituted with the same substituents as described above in connection with the alkyl group.

The unsubstituted $C_2$-$C_{60}$ alkynyl group refers to a hydrocarbon group having at least one carbon-carbon triple bond within or at a terminal of the alkyl group. Examples of the unsubstituted $C_2$-$C_{60}$ alkynyl group include acetylene, propyne, phenylacetylene, naphthylacetylene, isopropylacetylene, t-butylacetylene, and diphenylacetylene. At least one hydrogen atom of the unsubstituted $C_2$-$C_{60}$ alkynyl group may be substituted with the same substituents as described above in connection with the alkyl group.

The unsubstituted $C_3$-$C_{60}$ cycloalkyl group refers to a $C_3$-$C_{60}$ cyclic alkyl group. At least one hydrogen atom of the cycloalkyl group may be substituted with the same substituent group described above in connection with the $C_1$-$C_{10}$ alkyl group.

The unsubstituted $C_1$-$C_{60}$ alkoxy group refers to a group having a structure of —OA in which A is an unsubstituted $C_1$-$C_{60}$ alkyl group as described above. Examples of the $C_1$-$C_{60}$ alkoxy group include methoxy, ethoxy, propoxy, isopropyloxy, butoxy, and pentoxy. At least one hydrogen atom of the alkoxy group may be substituted with the same substituents as described above in connection with the alkyl group.

The unsubstituted $C_6$-$C_{60}$ aryl group refers to a carbocyclic aromatic system containing at least one ring. Two or more rings may be fused to each other or linked to each other via a single bond. The term 'aryl' refers to an aromatic system, such as phenyl, naphthyl, or anthracenyl. At least one hydrogen atom of the aryl group may be substituted with the same substituents described with reference to the $C_1$-$C_{60}$ alkyl group.

Examples of the substituted or unsubstituted $C_6$-$C_{60}$ aryl group include a phenyl group, a $C_1$-$C_{10}$ alkylphenyl group (e.g., ethylphenyl group), a halophenyl group (e.g., o-, m-, and p-fluorophenyl groups, and dichlorophenyl group), a cyanophenyl group, a dicyanophenyl group, a trifluoromethoxyphenyl group, a biphenyl group, a halobiphenyl group, a cyanobiphenyl group, a $C_1$-$C_{10}$ alkyl biphenyl group, a $C_1$-$C_{10}$ alkoxybiphenyl group, o-, m-, and p-tolyl groups, o-, m-, and p-cumenyl groups, a mesityl group, a phenoxyphenyl group, an (α,α-dimethylbenzene)phenyl group, an (N,N'-dimethyl)aminophenyl group, an (N,N'-diphenyl)aminophenyl group, a pentalenyl group, an indenyl group, a naphthyl group, a halonaphthyl group (e.g., fluoronaphthyl group), a $C_1$-$C_{10}$ alkylnaphthyl group (e.g., methylnaphthyl group), a $C_1$-$C_{10}$ alkoxynaphthyl group (e.g., methoxynaphthyl group), a cyanonaphthyl group, an anthracenyl group, an azulenyl group, a heptalenyl group, an acenaphthylenyl group, a phenalenyl group, a fluorenyl group, an anthraquinolyl group, a methylanthryl group, a phenanthryl group, a triphenylene group, a pyrenyl group, a chrycenyl group, an ethyl-chrysenyl group, a picenyl group, a perylenyl group, a chloroperylenyl group, a pentaphenyl group, a pentacenyl group, a tetraphenylenyl group, a hexaphenyl group, a hexacenyl group, a rubicenyl group, a coronelyl group, a trinaphthylenyl group, a heptaphenyl group, a heptacenyl group, a pyranthrenyl group, and an ovalenyl group.

The unsubstituted $C_1$-$C_{60}$ heteroaryl group includes one, two, three, or four hetero atoms selected from the group consisting of N, O, P and S. Two or more rings may be fused to each other or linked to each other via a single bond. Examples of the unsubstituted $C_1$-$C_{60}$ heteroaryl group include a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, and a dibenzothiophene group. In addition, at least one hydrogen atom of the heteroaryl group may be substituted with the same substituents described with reference to the $C_1$-$C_{60}$ alkyl group.

The unsubstituted $C_6$-$C_{60}$ aryloxy group refers to a group represented by —$OA_1$, in which $A_1$ is a $C_6$-$C_{60}$ aryl group. Examples of the aryloxy group include a phenoxy group. In addition, at least one hydrogen atom of the heteroaryl group may be substituted with the same substituents described with reference to the $C_1$-$C_{60}$ alkyl group.

The unsubstituted $C_6$-$C_{60}$ arylthio group refers to a group represented by —$SA_1$, in which $A_1$ is a $C_6$-$C_{60}$ aryl group. Examples of the arylthio group include a benzenethio group and a naphthylthio group. In addition, at least one hydrogen atom of the arylthio group may be substituted with the same substituents described with reference to the $C_1$-$C_{60}$ alkyl group.

The unsubstituted $C_6$-$C_{60}$ condensed polycyclic group is a substituent including at least two rings in which at least one aromatic ring and at least one non-aromatic ring are fused to each other or a substituent including an unsaturated ring without having a conjugation structure. The condensed polycyclic group is distinguished from the aryl group or heteroaryl group since the condensed polycyclic group does not have an orientation.

An example of the compound of Formula 1 may include one of the following Compounds 1-102.

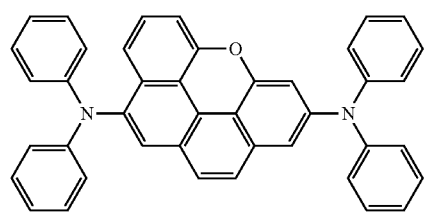

1

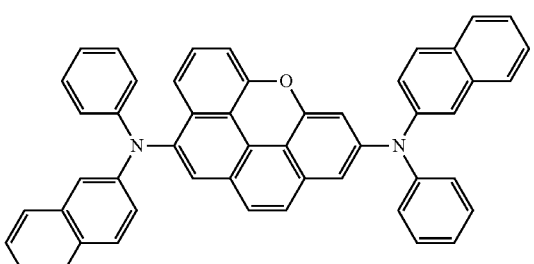

2

-continued
3
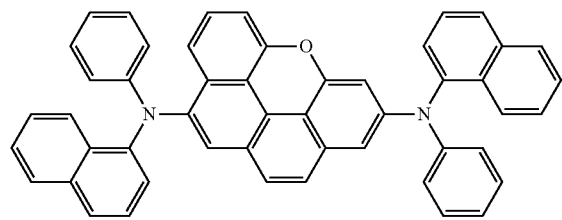
4
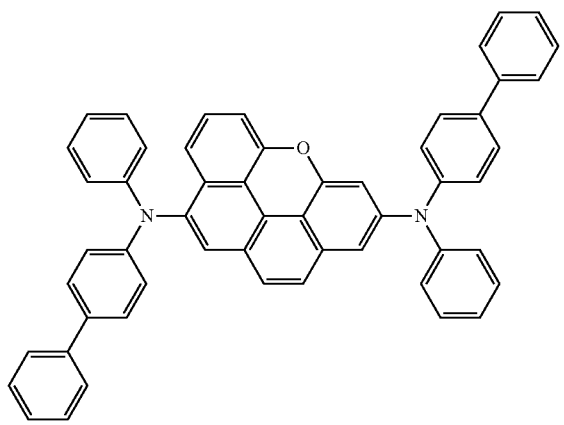
5
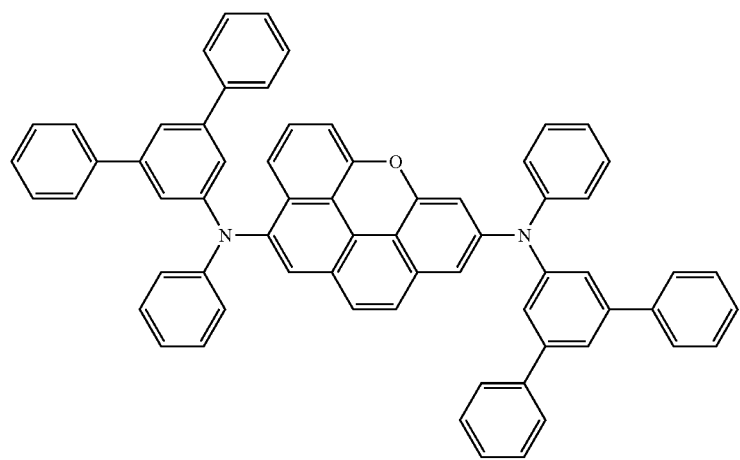
6
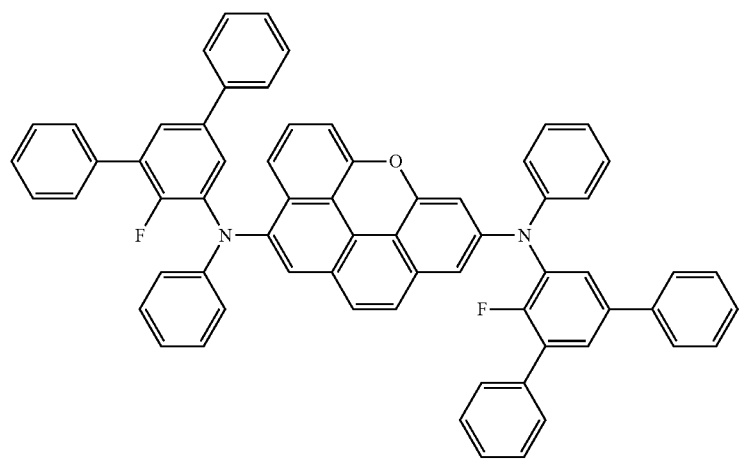

-continued
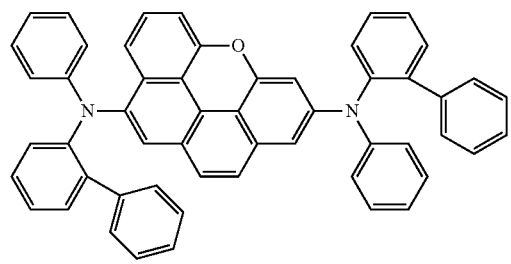
7
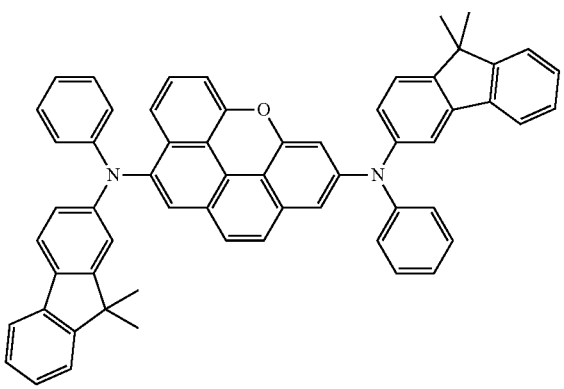
8
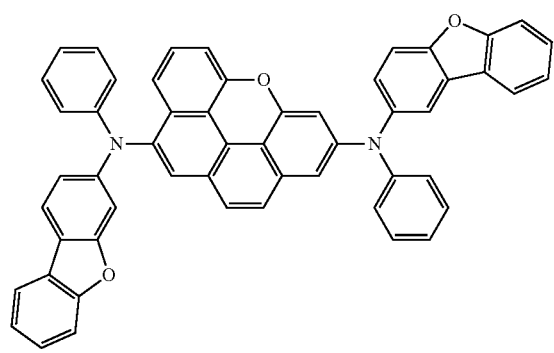
9
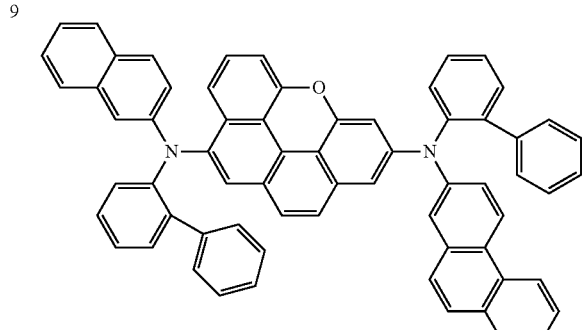
10
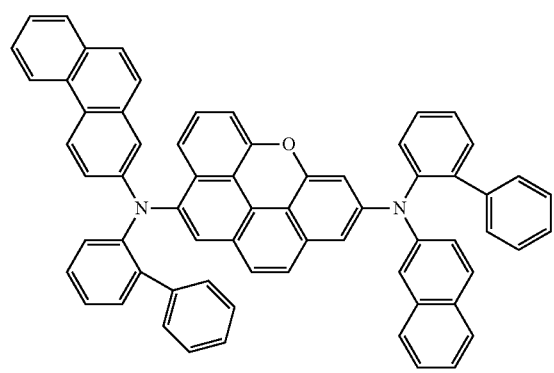
11
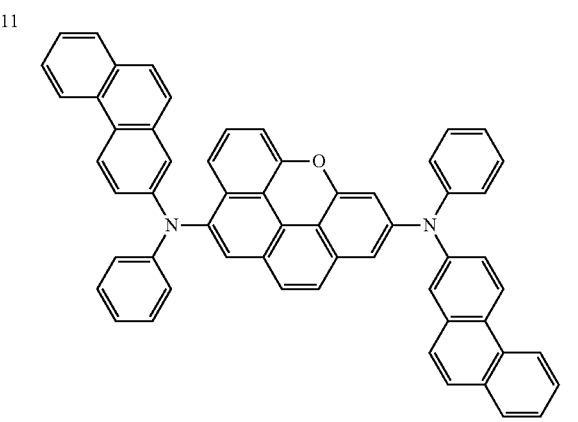
12
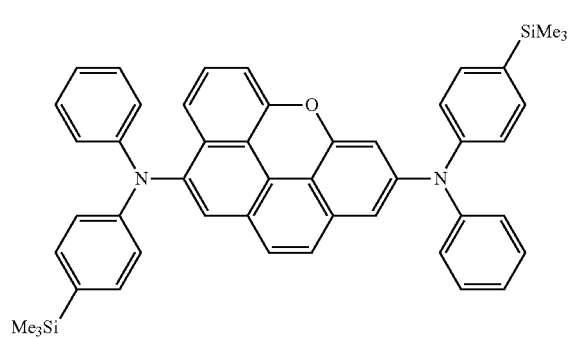
13
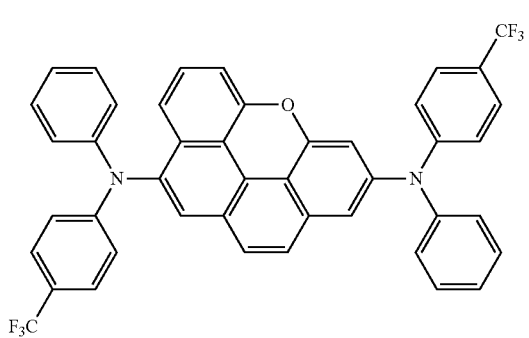
14

-continued
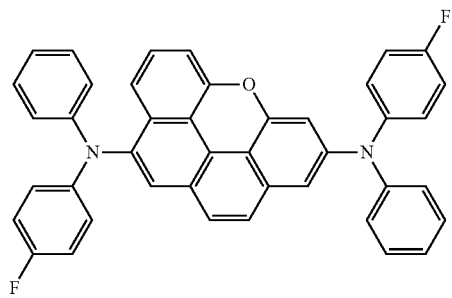
15
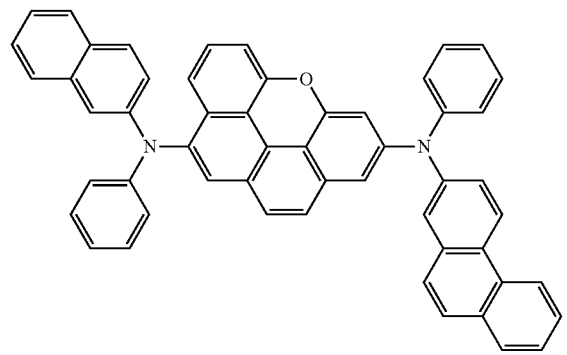
16
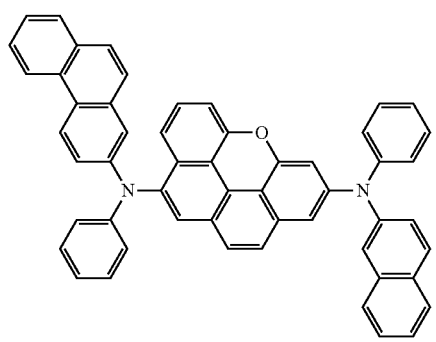
17
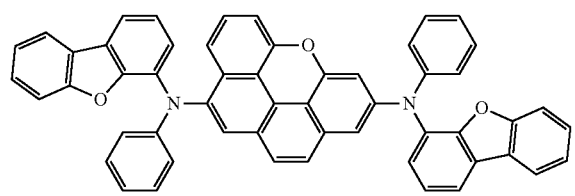
18
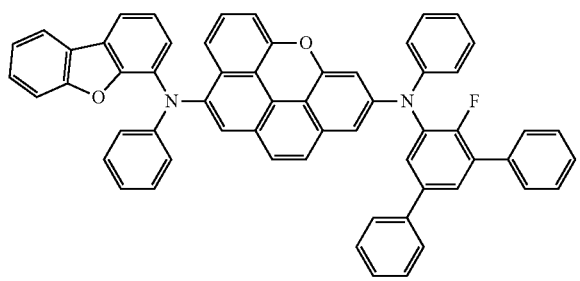
19
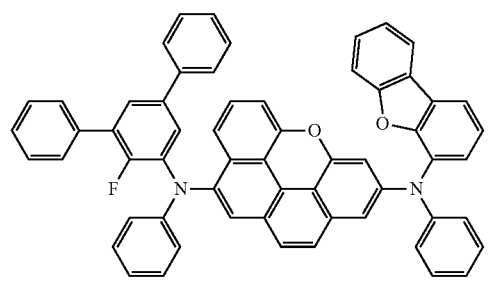
20
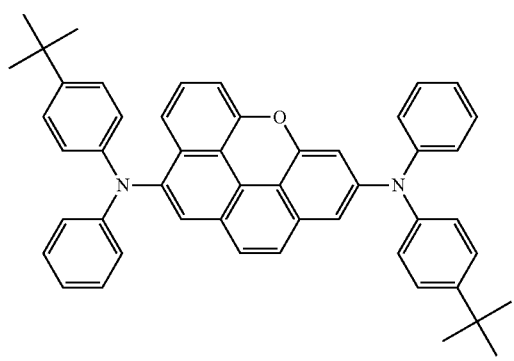
21
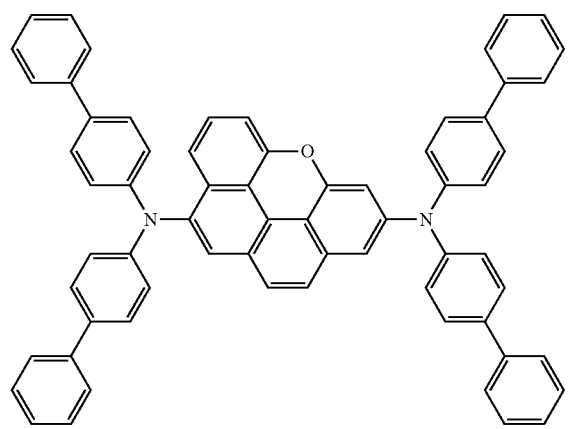
22

-continued
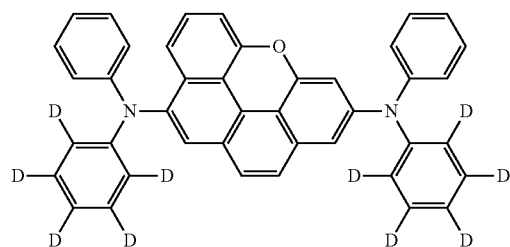
23
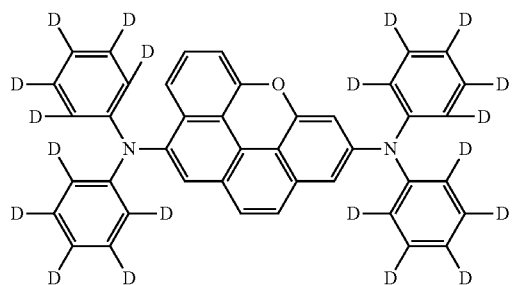
24
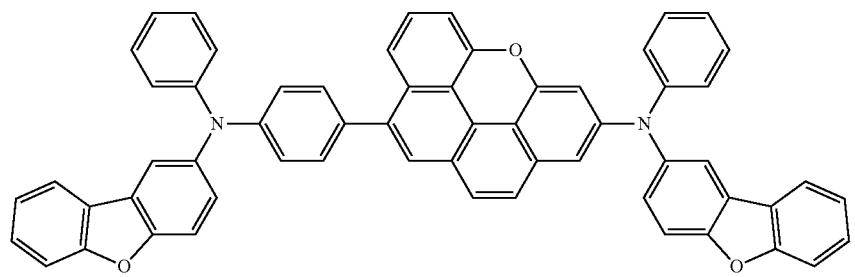
25
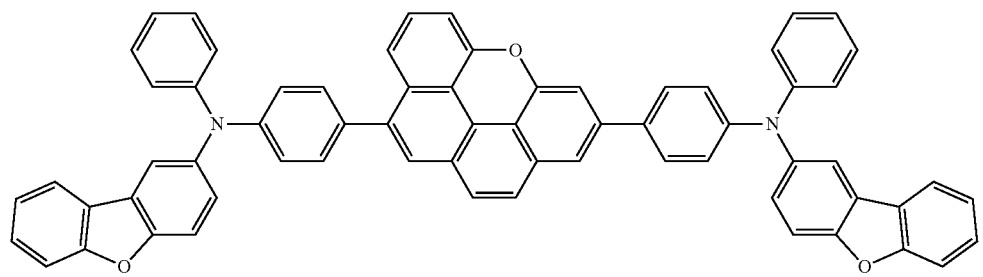
26
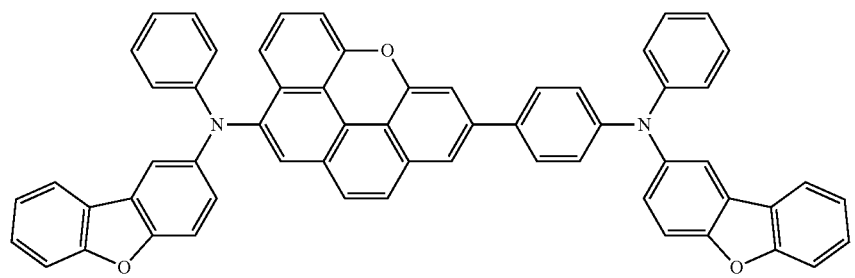
27
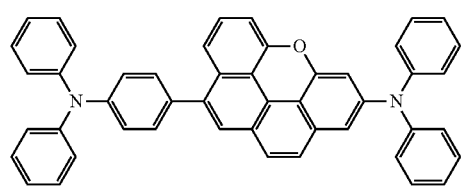
28
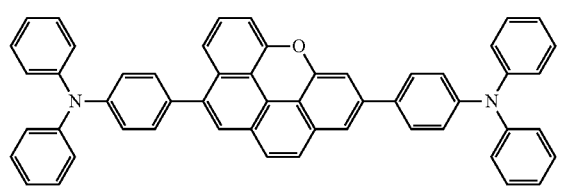
29
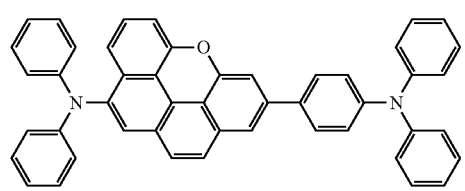
30
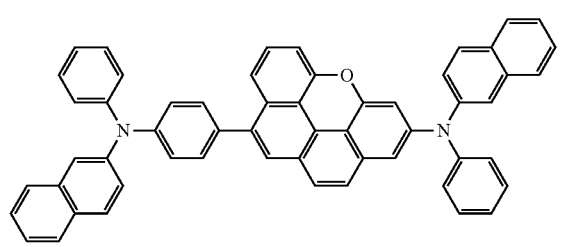
31

-continued
32
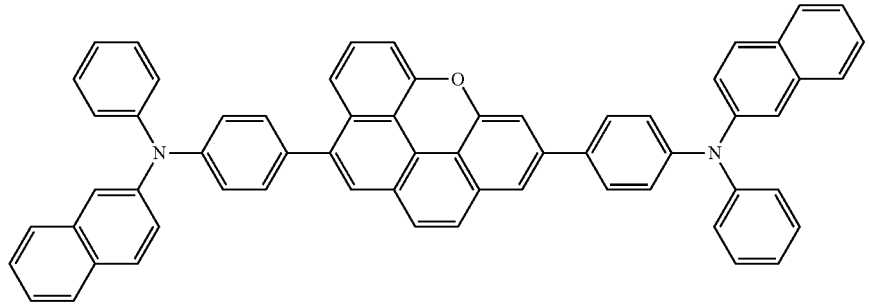
33
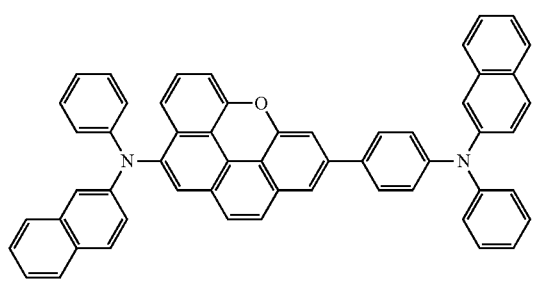
34
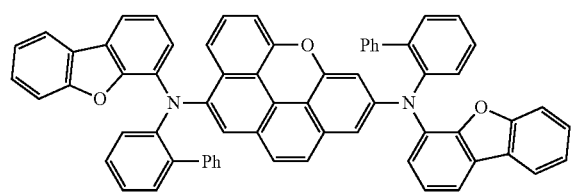
35
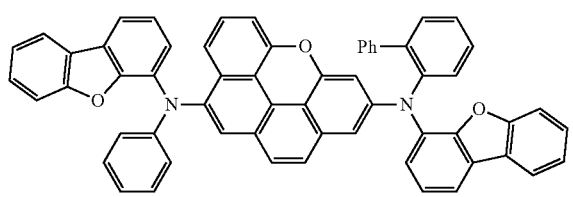
36
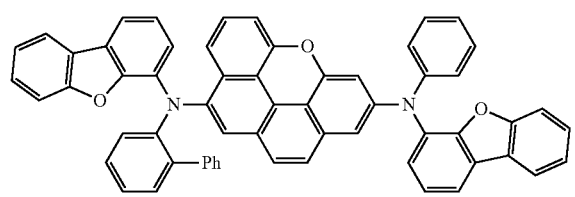
37
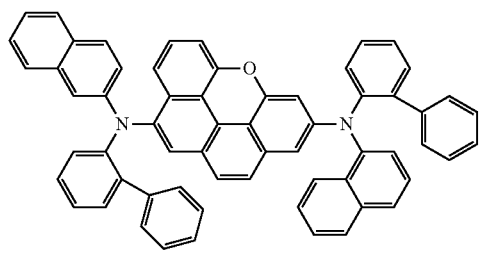
38
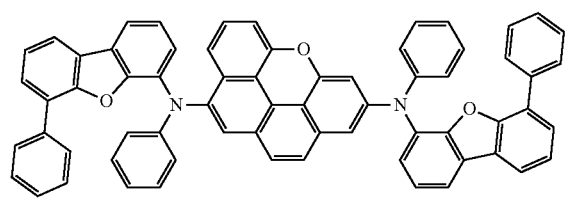
39
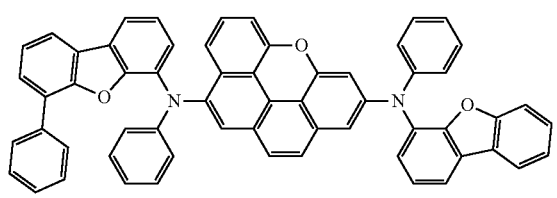
40
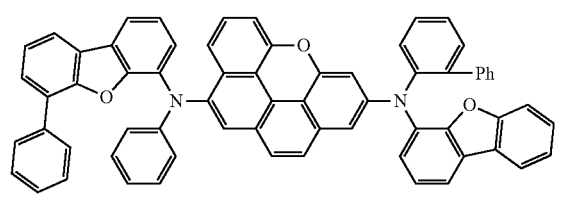
41
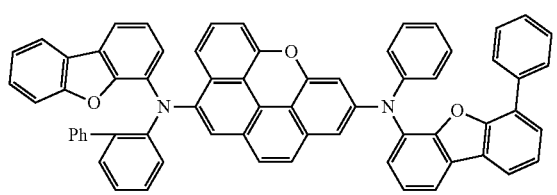
42
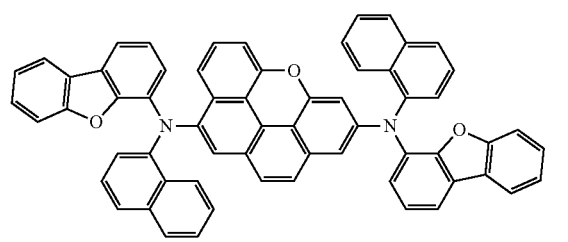

-continued
43
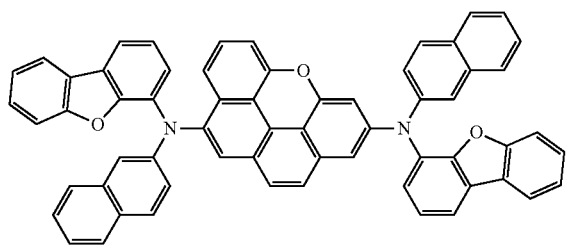
44
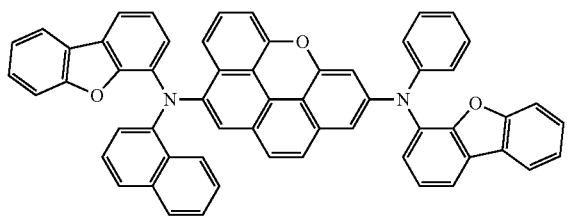
45
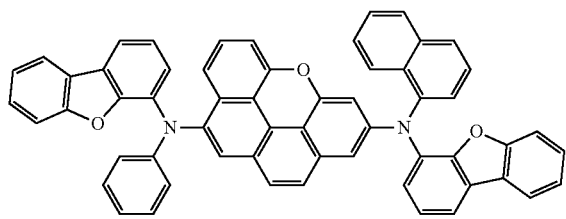
46
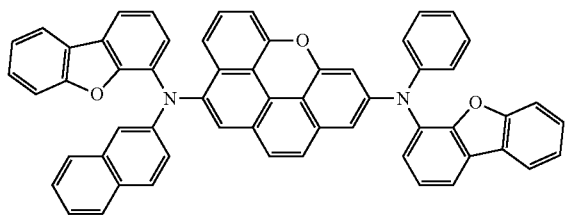
47
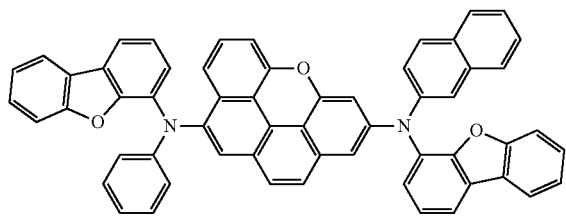
48
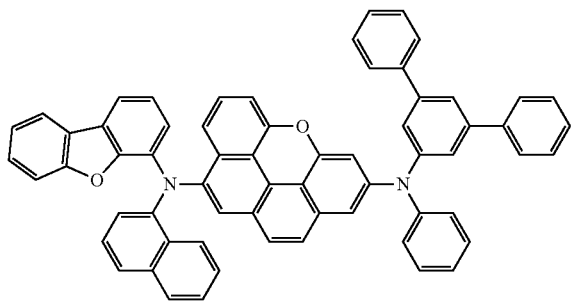
49
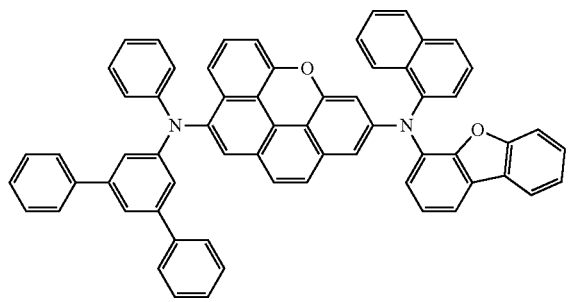
50
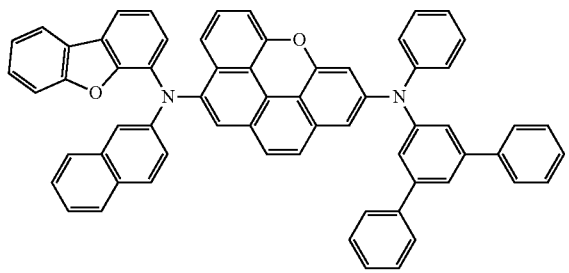
51
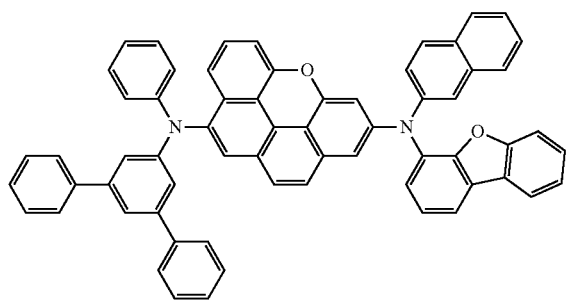
52
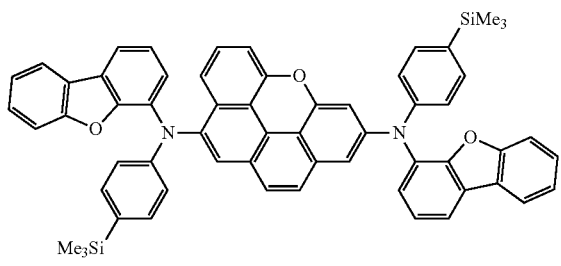

-continued
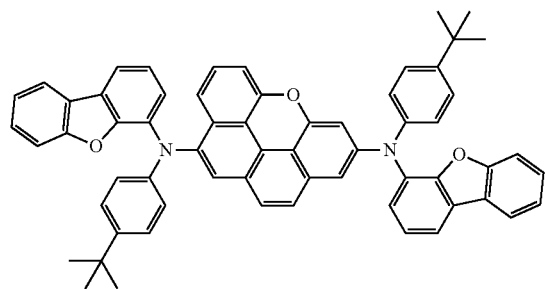
53
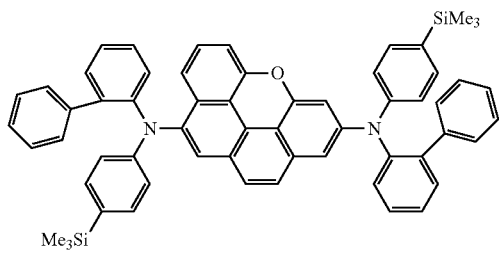
54
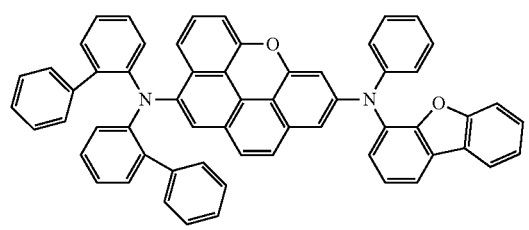
55
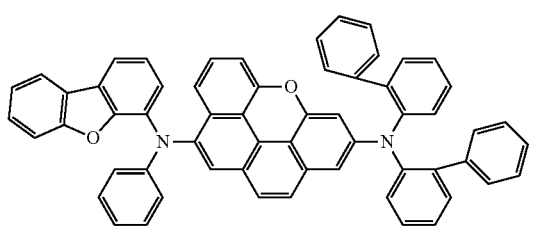
56
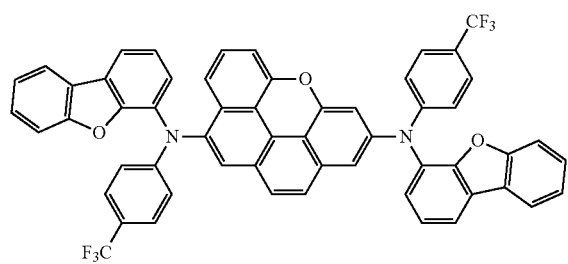
57
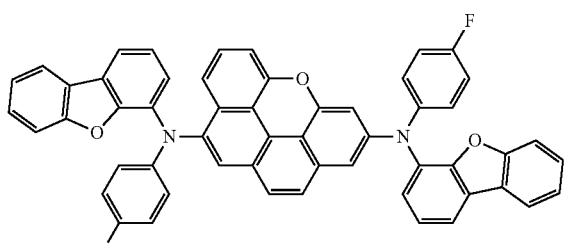
58
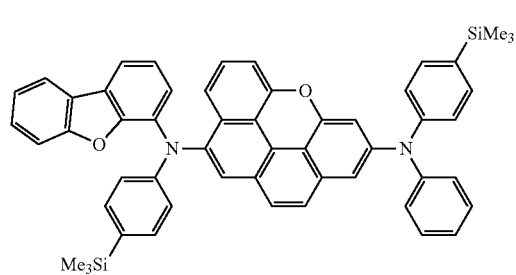
59
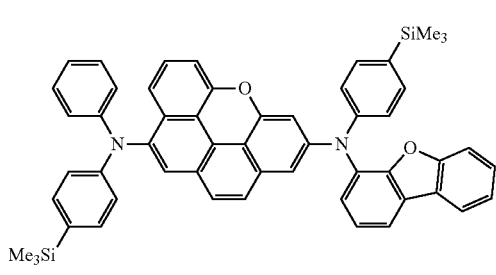
60
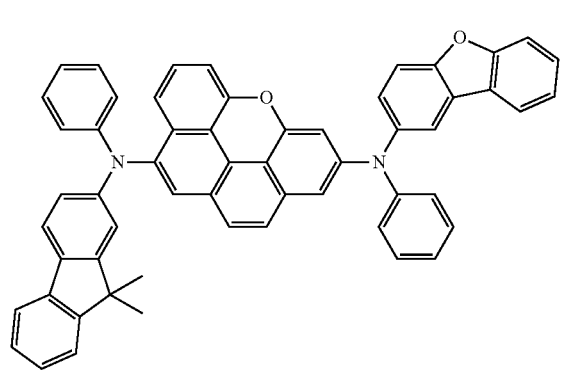
61
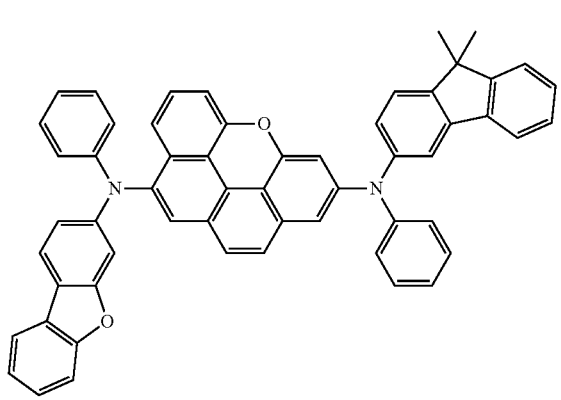
62

-continued
63
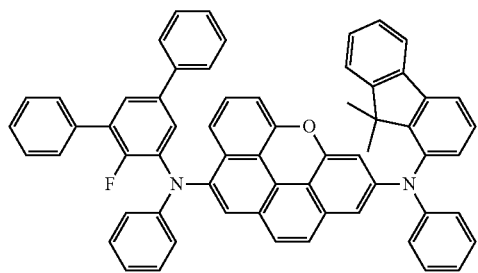
64
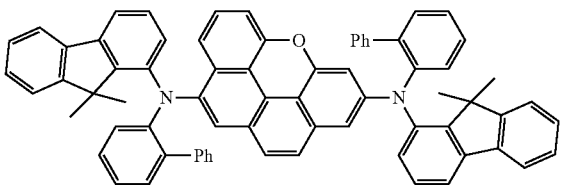
65
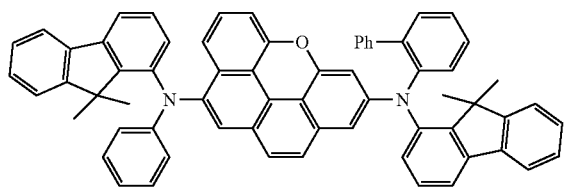
66
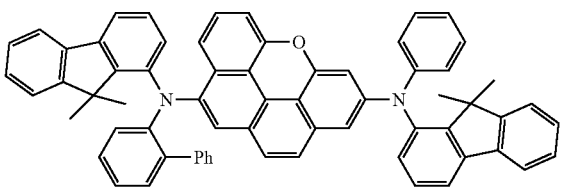
67
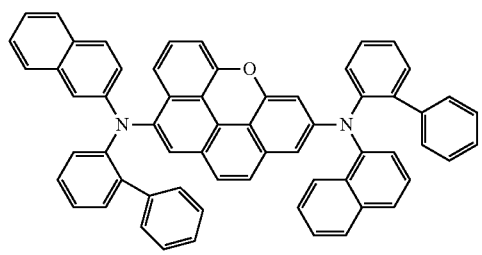
68
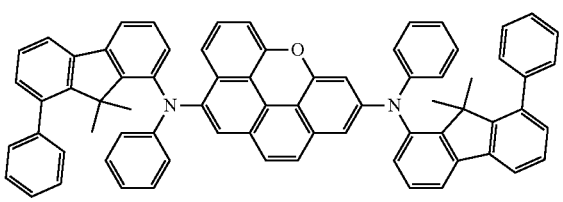
69
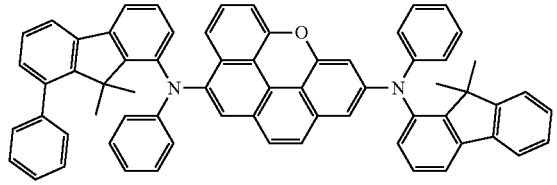
70
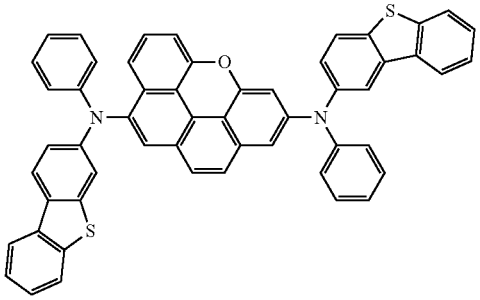
71
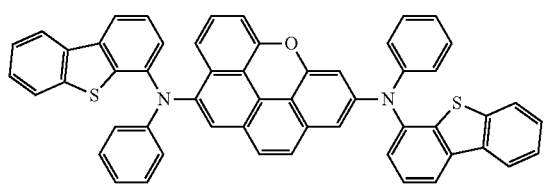
72
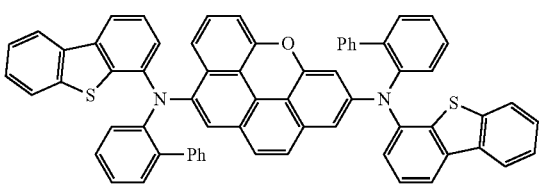
73
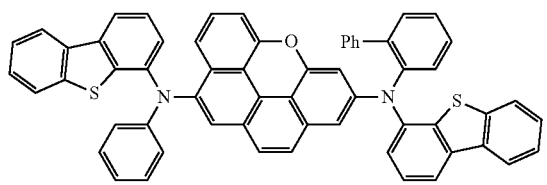
74
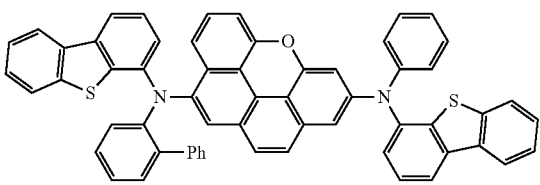

-continued
75
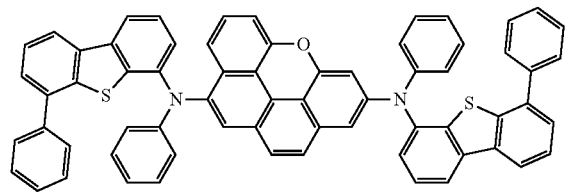
76
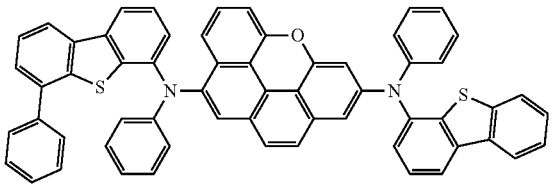
77
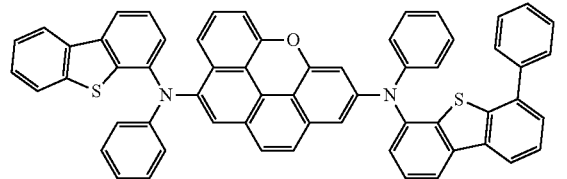
78
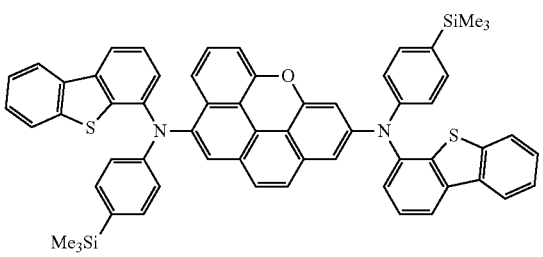
79
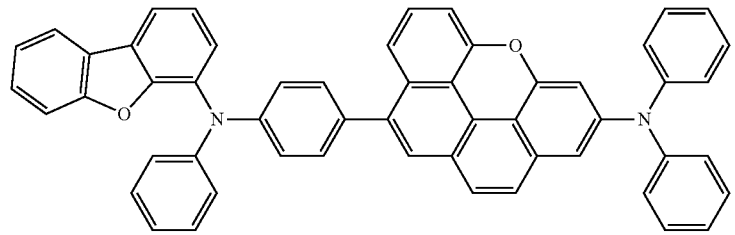
80
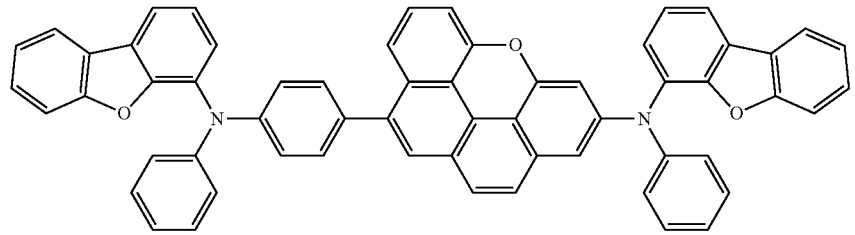
81
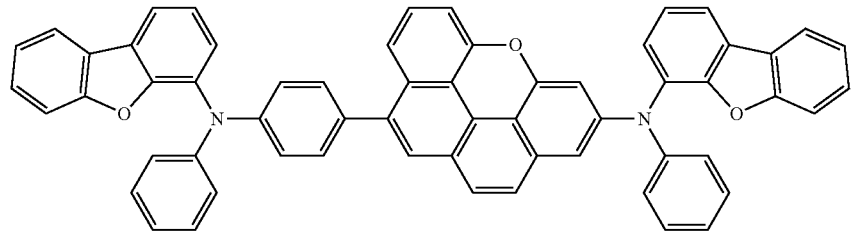
82
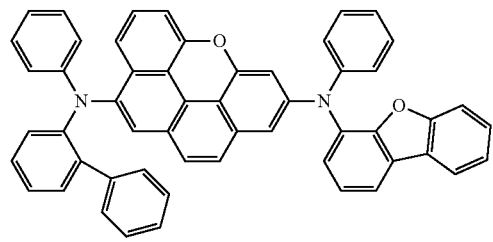
83
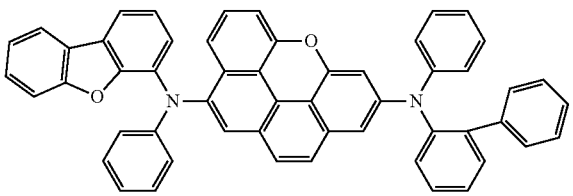

-continued
84
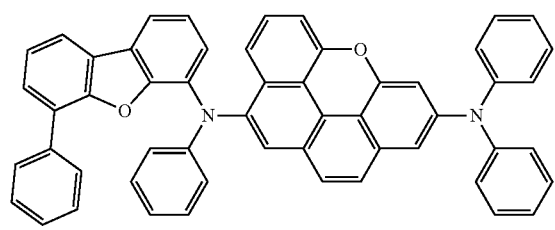
85
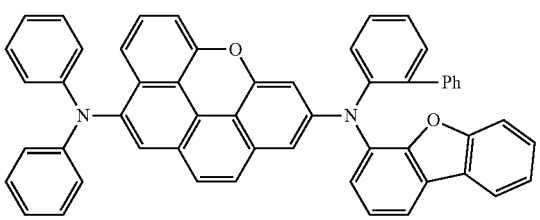
86
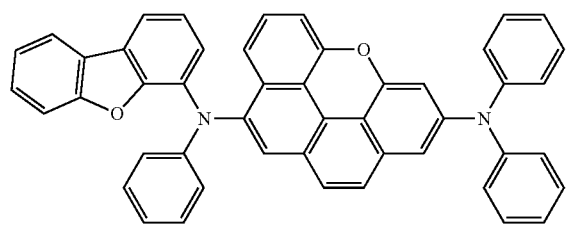
87
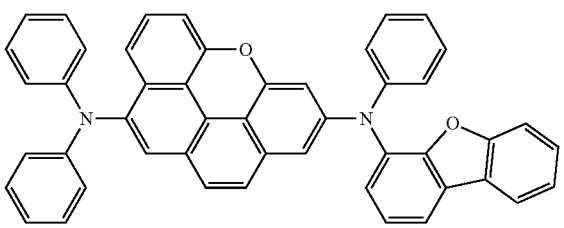
88
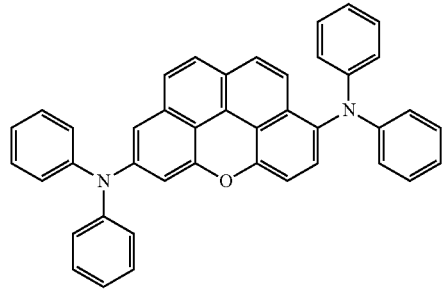
89
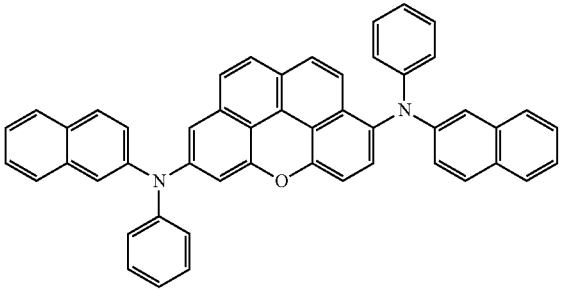
90
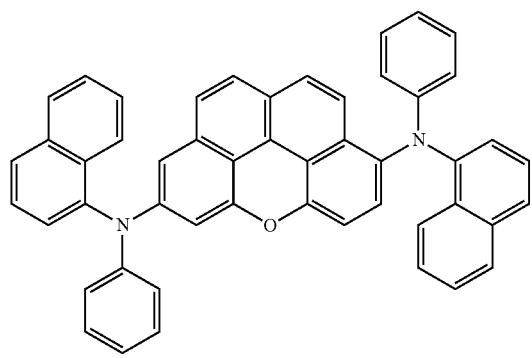
91
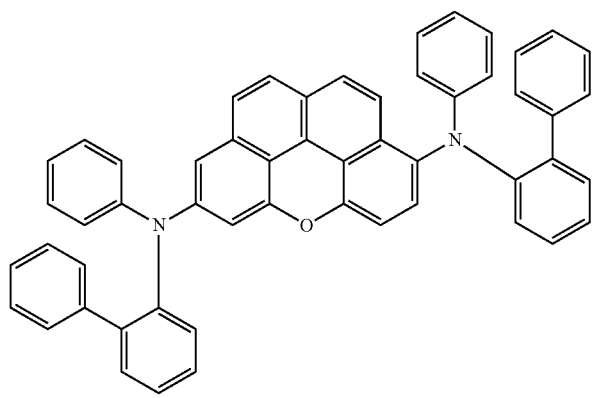
92
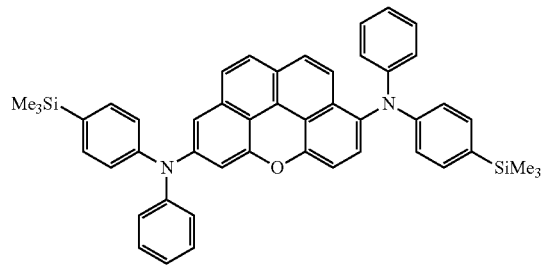
93
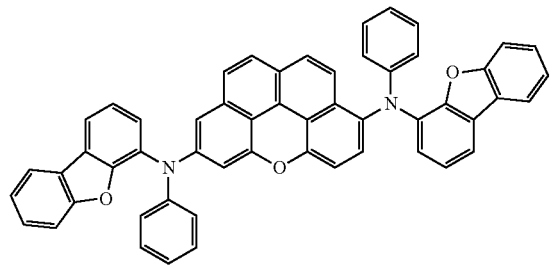

-continued
94
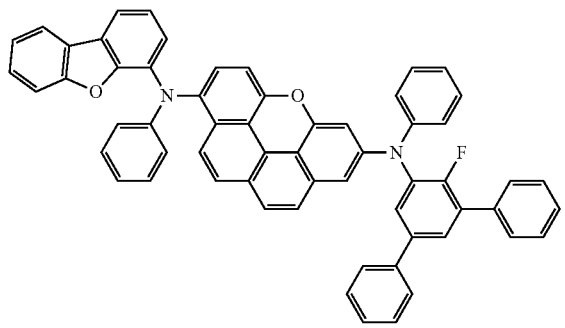
95
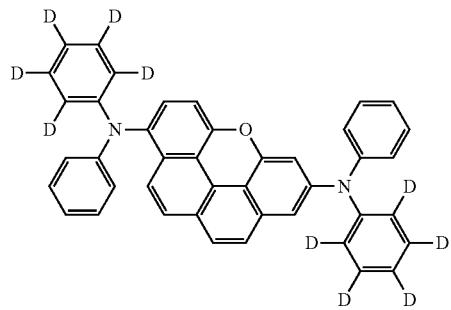
96
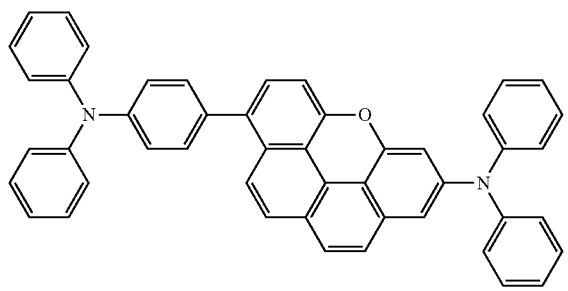
97
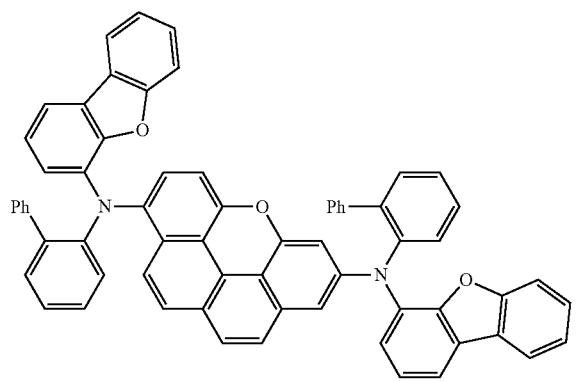
98
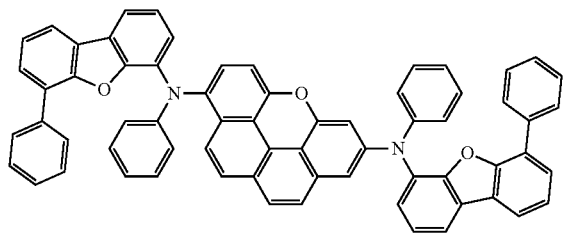
99
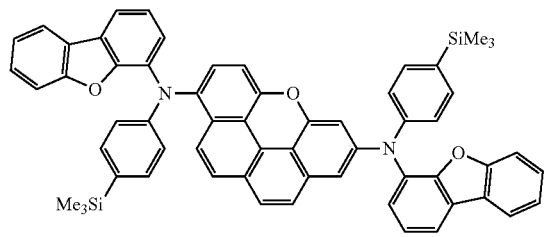
100
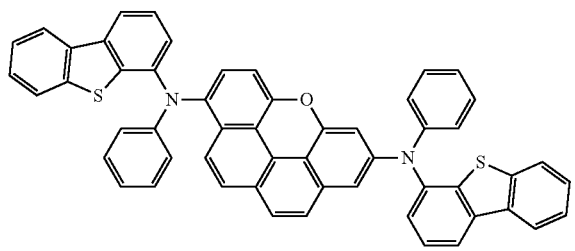
101
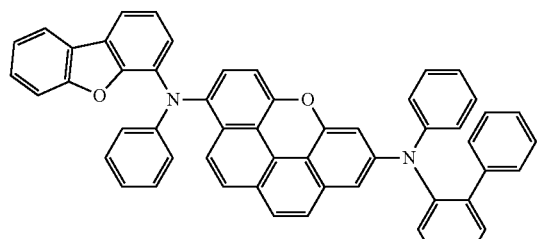
102
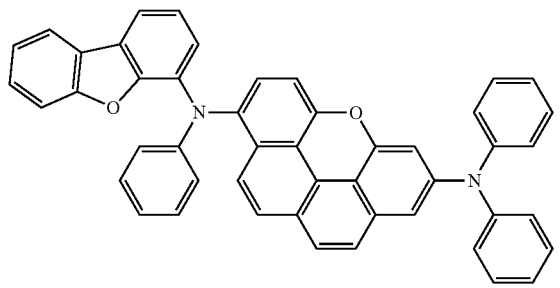

An organic light-emitting device according to another embodiment may include, e.g., a first electrode; a second electrode; and an organic layer between the first electrode and the second electrode. The organic layer may include a compound represented by Formula 1 described above.

The organic layer may include at least one layer selected from the group of a hole injection layer (HIL), a hole transport layer (HTL), a functional layer having both hole injecting and hole transporting capabilities (H-functional layer), a buffer layer, an electron blocking layer (EBL), an emission layer (EML), a hole blocking layer (HBL), an electron transport layer (ETL), an electron injection layer (EIL), and a functional layer having both electron injecting and electron transporting capabilities (E-functional layer).

For example, the organic layer may include an EML, and the compound may be a fluorescent dopant. In an implementation, the compound may be a blue fluorescent dopant.

In an implementation, the organic layer may include, e.g., an EIL, an ETL, an E-functional layer, an EML, an HIL, an HTL, or an H-functional layer. The EML may include, e.g., an anthracene-based compound, an arylamine-based compound, or a styryl-based compound.

In an implementation, the organic light-emitting device may include, e.g., an EIL, an ETL, an E-functional layer, an EML, an HIL, an HTL, or an H-functional layer. One of a red layer, a green layer, a blue layer, or a white layer of the EML may include a phosphorescent compound. The HIL, the HTL, or the H-functional layer may further include a charge-generating material. In an implementation, the charge-generating material may be a p-dopant. The p-dopant may include, e.g., a quinone derivative, a metal oxide, or a cyano group-containing compound.

In an implementation, the organic layer may include an ETL that includes a metal complex. The metal complex may include, e.g., a Li complex.

The term "organic layer" used herein may refer to a single layer and/or a multiple layers interposed between the first and second electrodes of the organic light-emitting device.

FIG. 1 illustrates a schematic cross-sectional view of an organic light-emitting device according to an embodiment. Hereinafter, a structure of the organic light-emitting device according to an embodiment and a method of fabricating the organic light-emitting device will be described with reference to FIG. 1.

A substrate (not shown), which may be a suitable substrate used in organic light-emitting devices, may include a glass substrate or a transparent plastic substrate with excellent mechanical strength, thermal stability, transparency, surface smoothness, handling convenience, and waterproofness.

A first electrode may be formed on the substrate by depositing or sputtering a material that is used to form the first electrode. When the first electrode is an anode, the material used to form the first electrode may be a high work function material so as to facilitate hole injection. The first electrode may be a reflective electrode or a transmissive electrode. Transparent and conductive materials, e.g., indium tin oxide (ITO), indium zinc oxide (IZO), tin oxide ($SnO_2$), or zinc oxide (ZnO), may be used to form the first electrode. The first electrode may also be formed as a reflective electrode using magnesium (Mg), aluminum (Al), aluminum-lithium (Al—Li), calcium (Ca), magnesium-indium (Mg—In), magnesium-silver (Mg—Ag), or the like.

The first electrode may have a single-layered or a multi-layered structure. For example, the first electrode may have a triple-layered structure of ITO/Ag/ITO.

An organic layer may be formed on the first electrode.

The organic layer may include an HIL, an HTL, a buffer layer (not shown), an EML, an ETL, and/or an EIL.

The HIL may be formed on the first electrode by vacuum deposition, spin coating, casting, Langmuir-Blodgett (LB) deposition, or the like.

When the HIL is formed by vacuum deposition, the deposition conditions may vary according to a compound that is used to form the HIL, and the structure and thermal characteristics of the HIL to be formed. For example, the deposition conditions may include a deposition temperature of 100 to 500° C., a vacuum pressure of $10^{-8}$ to $10^{-3}$ torr, and a deposition rate of about 0.01 to about 100 Å/sec.

When the HIL is formed by spin coating, coating conditions may vary according to a compound that is used to form the HIL, and the structure and thermal characteristics of the HIL to be formed. For example, the coating conditions may include a coating speed of about 2,000 rpm to about 5,000 rpm, and a temperature of heat treatment about 80° C. to about 200° C.

A suitable hole injecting material may be used to form the HIL. Examples of the hole injecting material may include N,N'-diphenyl-N,N'-bis-[4-(phenyl-m-tolyl-amino)-phenyl]-biphenyl-4,4'-diamine (DNTPD), a phthalocyanine compound such as copperphthalocyanine, 4,4',4"-tris(3-methylphenylphenylamino)triphenylamine (m-MTDATA), N,N'-di(1-naphthyl)-N,N'-diphenylbenzidine (NPB), TDATA, 2T-NATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfonicacid (Pani/CSA), and polyaniline)/poly(4-styrene-sulfonate (PANI/PSS).

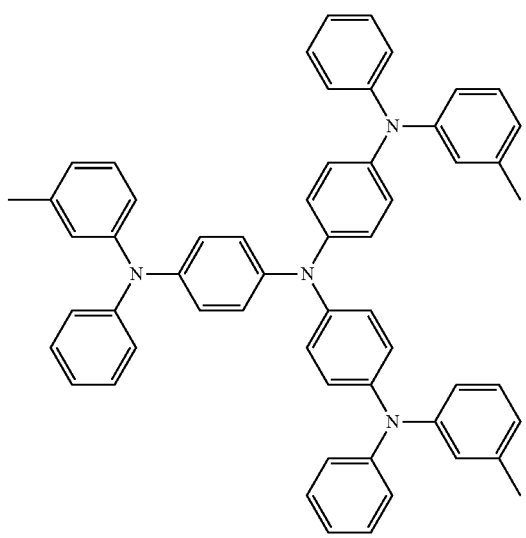

m-MTDATA

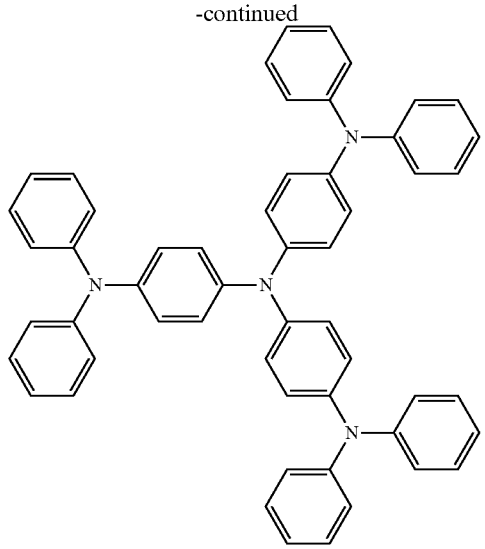

TDATA

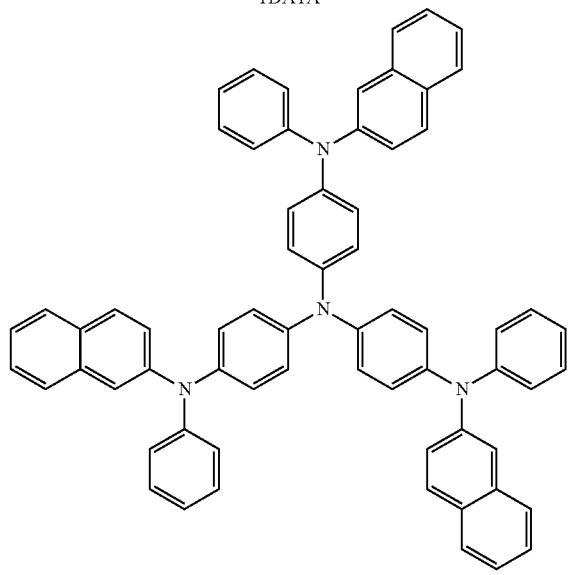

2-TNATA

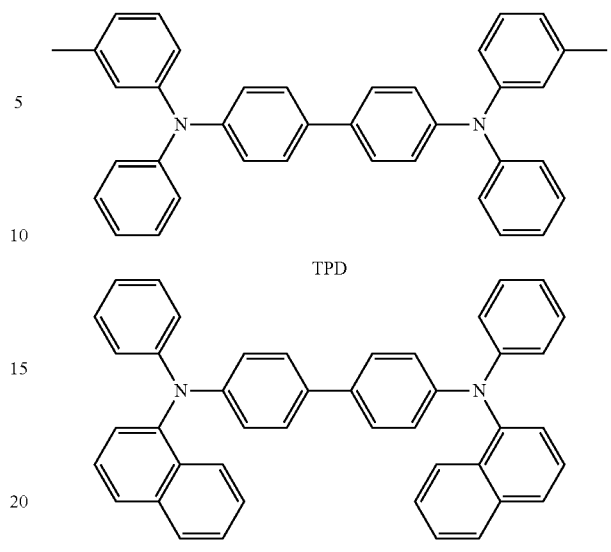

TPD

NPB

The thickness of the HTL may be about 50 to about 2,000 Å, e.g., about 100 to about 1,500 Å. When the thickness of the HTL is within the range described above, the HTL may have excellent hole transporting ability without a substantial increase in driving voltage.

The H-functional layer may include at least one of the hole injecting materials and hole transporting materials as described above, and the thickness of the H-functional layer may be in the range of about 100 Å to about 10,000 Å, e.g., about 100 Å to about 1,000 Å. When the thickness of the H-functional layer is within the range described above, the H-functional layer may have excellent hole injecting and transporting abilities without a substantial increase in driving voltage.

At least one of the HIL, HTL, and the H-functional layer may include at least one of the compounds represented by Formulae 300 and 350 below.

Formula 300

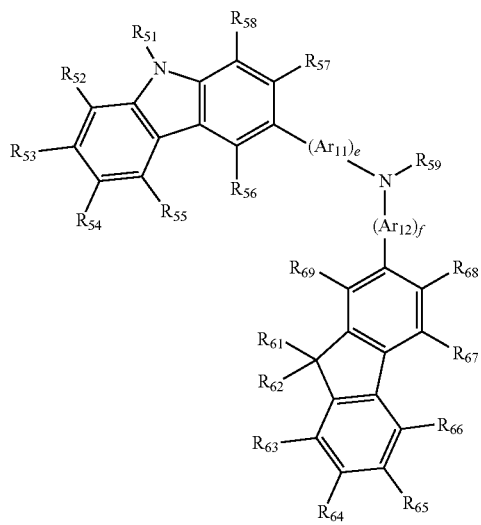

The thickness of the HIL may be about 100 to about 10,000 Å, e.g., about 100 to about 1,000 Å. When the thickness of the HIL is within this range, the HIL may have excellent hole injecting ability without a substantial increase in driving voltage.

Then, the HTL may be formed on the HIL by using vacuum deposition, spin coating, casting, LB deposition, or the like. When the HTL is formed by vacuum deposition or spin coating, the conditions for deposition and coating may be similar to those for the formation of the HIL, although the conditions for the deposition and coating may vary according to the material that is used to form the HTL.

A suitable hole transporting material may be used to form the HTL. Examples of the hole transporting material may include a carbazole derivative such as N-phenylcarbazole and polyvinyl carbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), and N,N'-di(1-naphthyl)-N,N'-diphenylbenzidine (NPB).

Formula 350

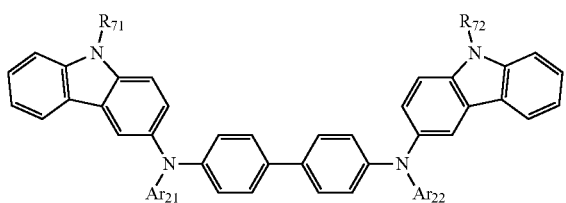

In Formulae 300 and 350, $Ar_{11}$, $Ar_{12}$, $Ar_{21}$, and $Ar_{22}$ may be each independently a substituted or unsubstituted $C_5$-$C_{60}$ arylene group.

In Formula 300, e and f may be each independently an integer from 0 to 5, or 0, 1, or 2. For example, e may be 1, and f may be 0.

In Formulae 300 and 350, $R_{51}$ to $R_{58}$, $R_{61}$ to $R_{69}$ and $R_{71}$ and $R_{72}$ may be each independently a hydrogen atom, a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. For example, $R_{51}$ to $R_{58}$, $R_{61}$ to $R_{69}$ and $R_{71}$ and $R_{72}$ may be each independently selected from the group consisting of: a hydrogen atom; a deuterium atom; a halogen atom; a hydroxyl group; a cyano group; a nitro group; an amino group; an amidino group; hydrazine; hydrazone; a carboxyl group or a salt thereof; a sulfonic acid group or a salt thereof; a phosphoric acid group or a salt thereof; a $C_1$-$C_{10}$ alkyl group (e.g., a methyl group, an ethyl group, a propyl group, a butyl group, a pentyl group, and a hexyl group); a $C_1$-$C_{10}$ alkoxy group (e.g., a methoxy group, an ethoxy group, a propoxy group, a butoxy group, and a pentoxy group); a $C_1$-$C_{10}$ alkyl group and a $C_1$-$C_{10}$ alkoxy group substituted with at least one selected from the group consisting of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group; and a phenyl group, a naphthyl group, an anthryl group, a fluorenyl group, and a pyrenyl group substituted with at least one selected from the group consisting of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group, without being limited thereto.

In Formula 300, $R_{59}$ may be: a phenyl group; a naphthyl group; an anthryl group; a biphenyl group; a pyridyl group; and a phenyl group, a naphthyl group, an anthryl group, a biphenyl group, and a pyridyl group substituted with at least one of a deuterium atom, a halogen atom, a hydroxyl group, a cyano group, a nitro group, an amino group, an amidino group, hydrazine, hydrazone, a carboxyl group of a salt thereof, a sulfonic acid group or a salt thereof, a phosphoric acid or a salt thereof, a substituted or unsubstituted $C_1$-$C_{20}$ alkyl group, and a substituted or unsubstituted $C_1$-$C_{20}$ alkoxy group.

In an implementation, the compound of Formula 300 may be represented by Formula 300A below.

Formula 300A

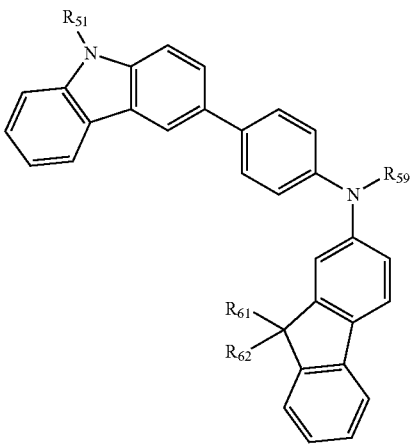

In Formula 300A, $R_{51}$, $R_{61}$, $R_{62}$, and $R_{59}$ are as defined above.

For example, at least one of the HIL, the HTL, and the H-functional layer may include at least one of Compounds 301 to 320 below.

301

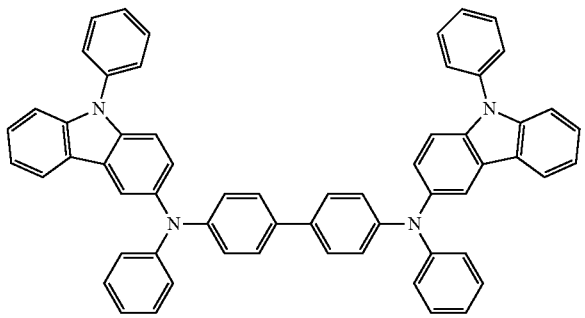

302

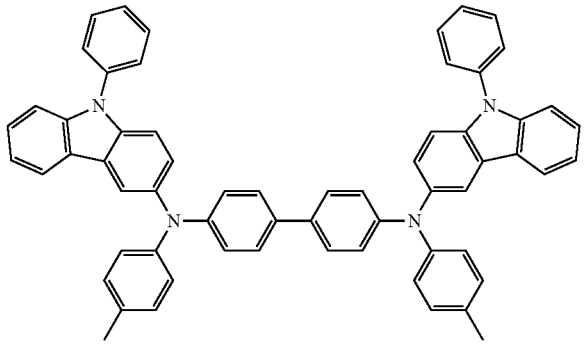

303
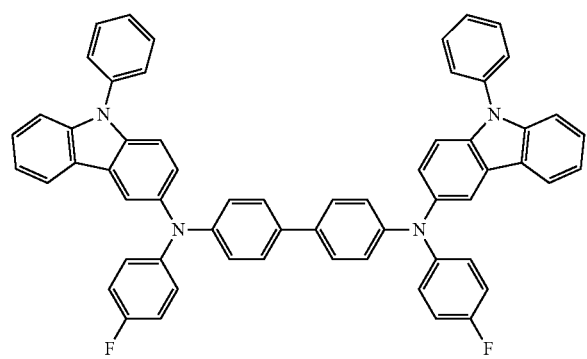
307
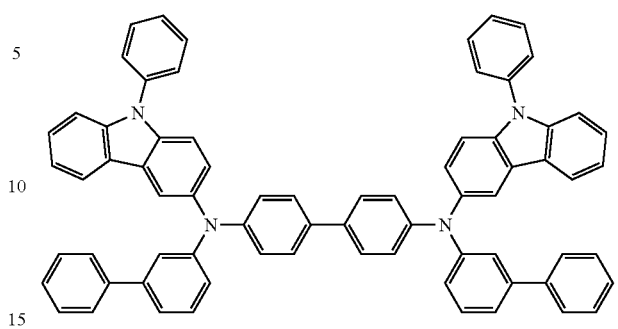
304
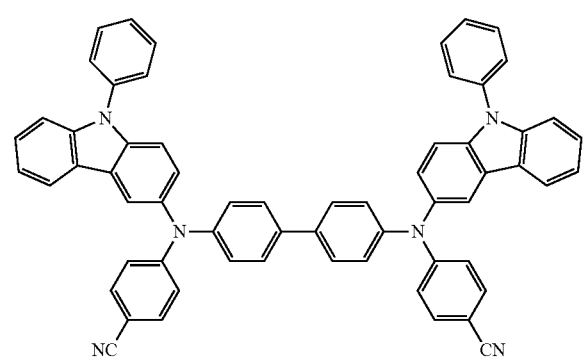
308
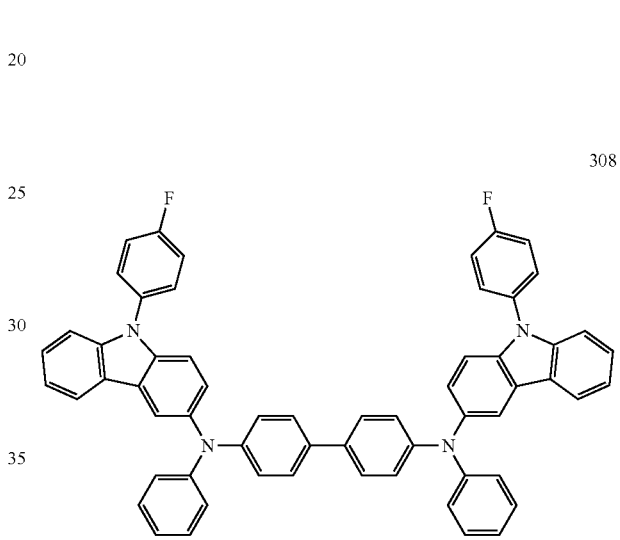
305
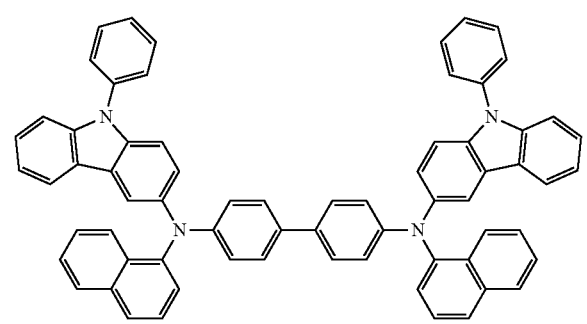
306
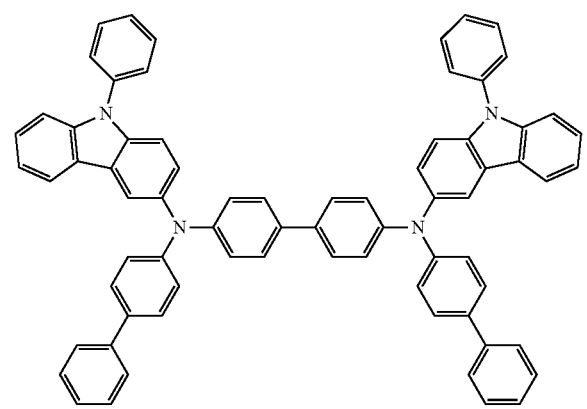
309
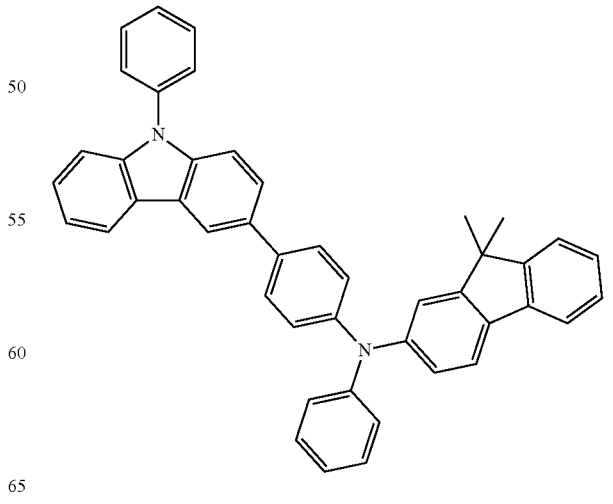

310
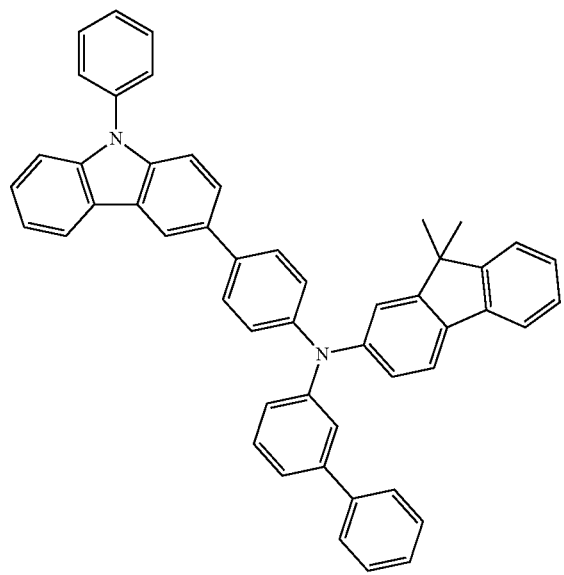
311
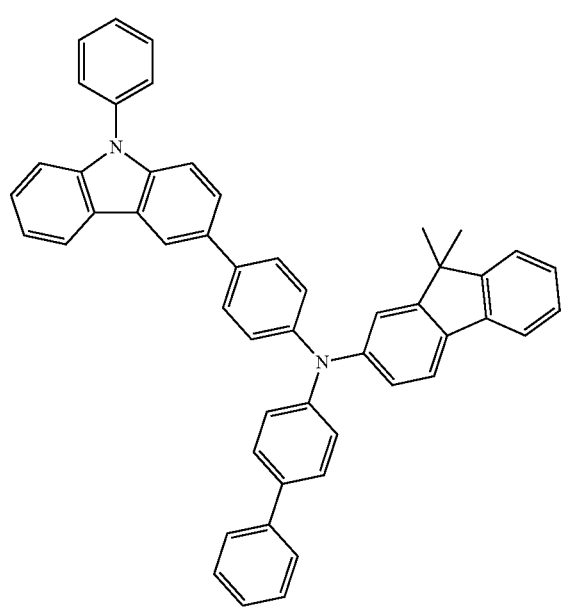
312
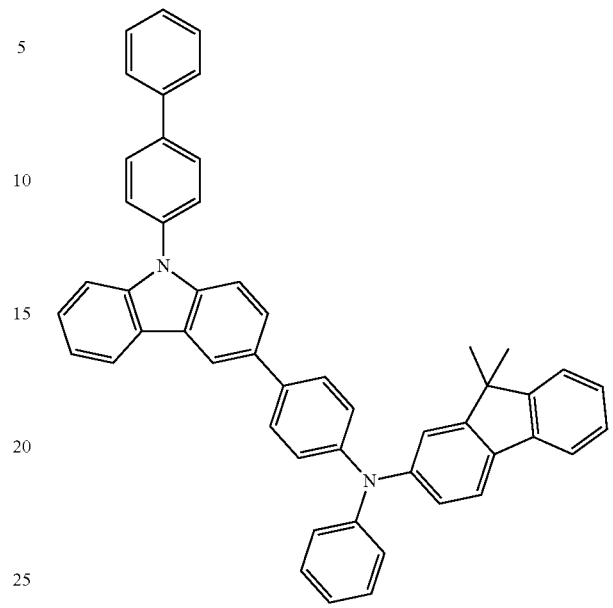
313
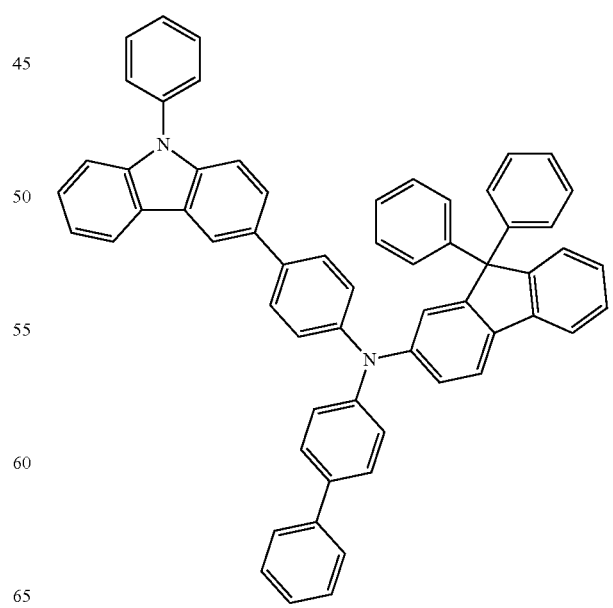

314
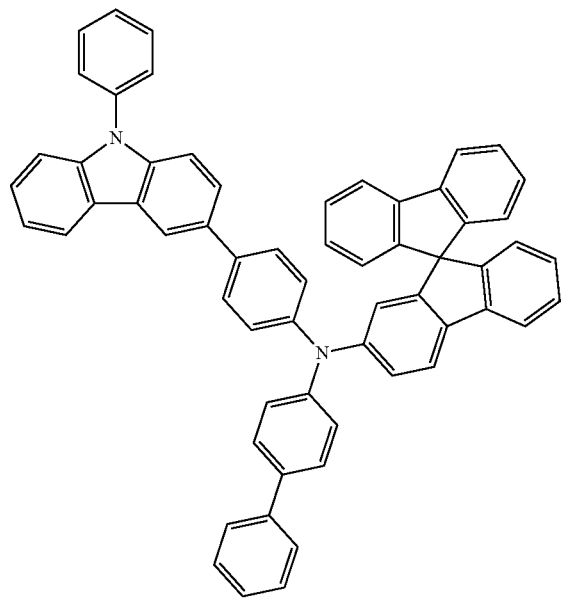
315
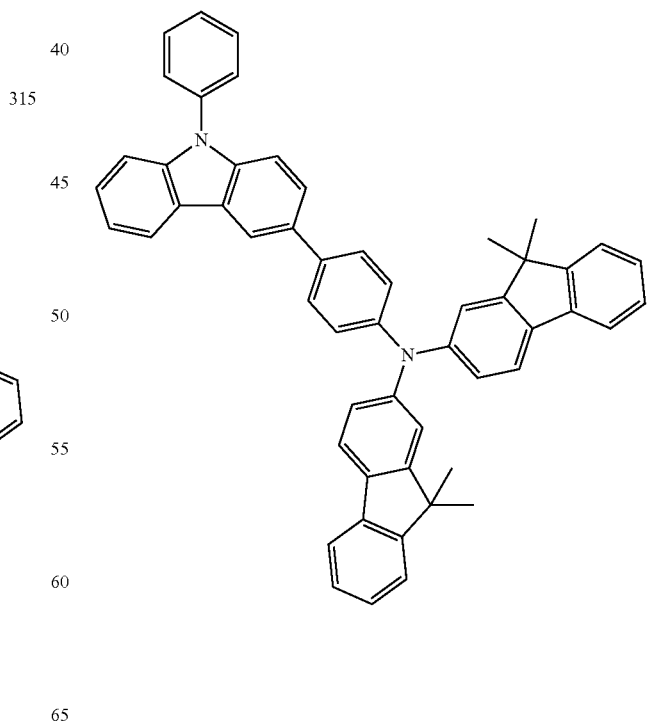
316
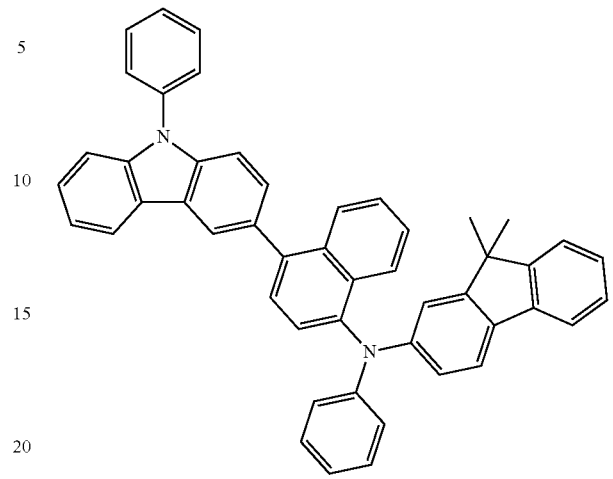
317
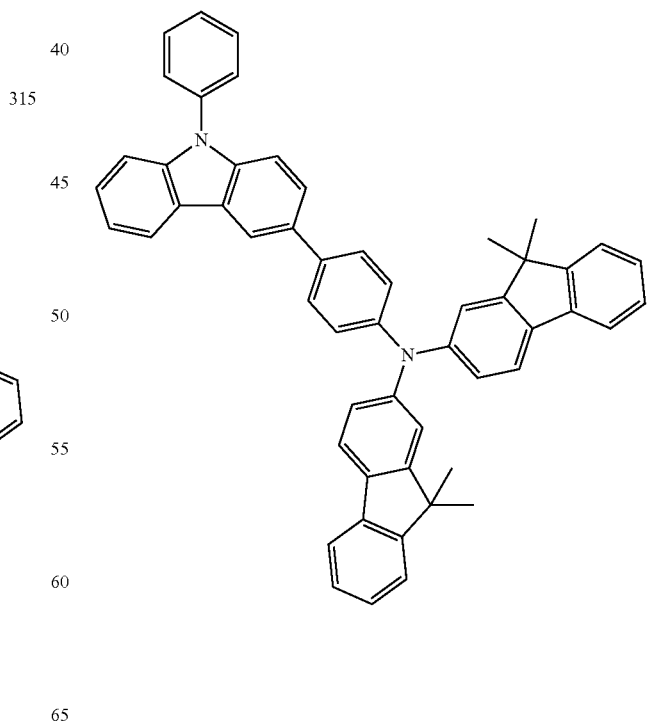

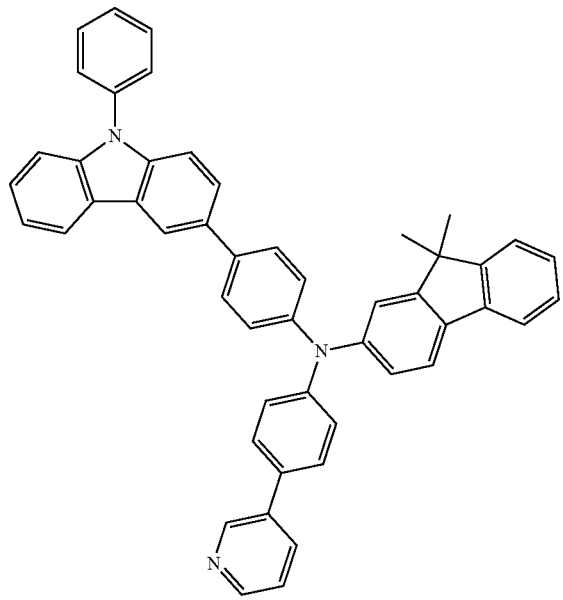

318

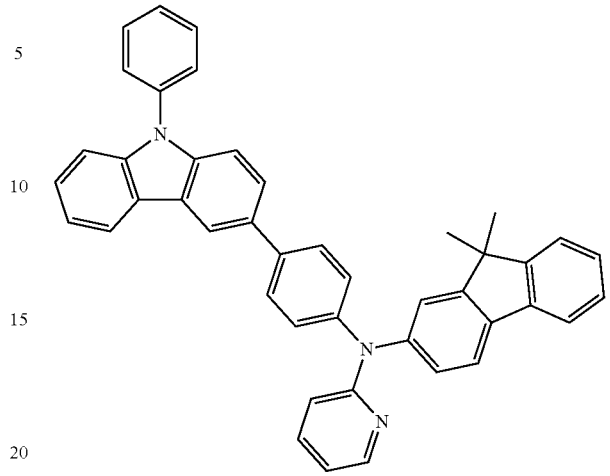

320

At least one of the HIL, the HTL, and the H-functional layer may further include a charge-generating material to help improve conductivity of the layers in addition to suitable hole injecting materials, suitable hole transporting materials, and/or materials having both hole injecting and hole transporting capabilities.

The charge-generating material may include a p-dopant. The p-dopant may be a quinone derivative, a metal oxide, or a cyano group-containing compound. Examples of the p-dopant may include: a quinone derivative such as tetracyanoquinonedimethane (TCNQ) and 2,3,5,6-tetrafluoro-tetracyano-1,4-benzoquinonedimethane (F4-TCNQ); a metal oxide such as tungsten oxide and molybdenum oxide; and a cyano group-containing compound such as Compound 200 below.

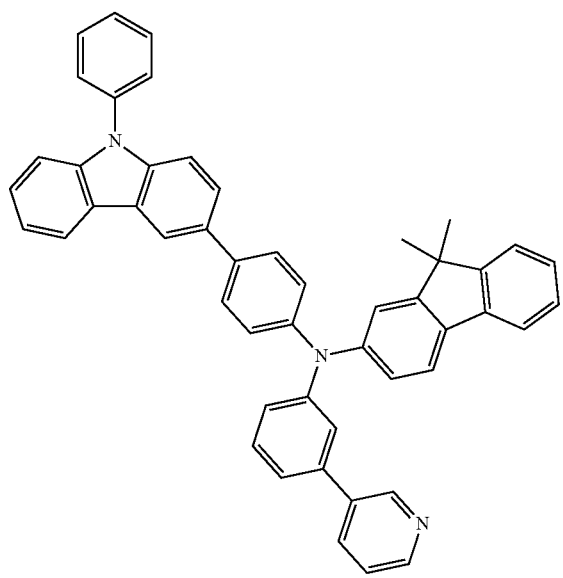

319

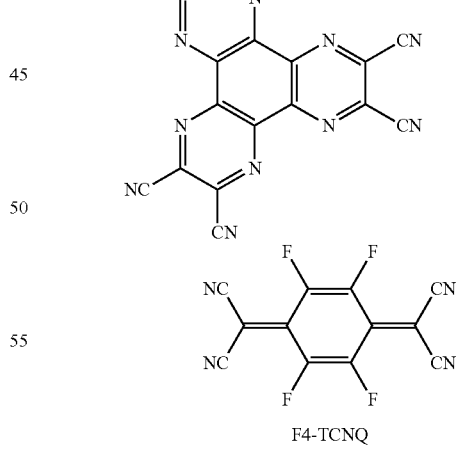

Compound 200

F4-TCNQ

If the HIL, the HTL, or the H-functional layer further includes the charge-generating material, the charge-generating material may be homogeneously or non-homogeneously dispersed in the HIL, the HTL, or the H-functional layer, or a variety of modifications may be possible.

A buffer layer may be interposed between the EML and at least one of the HIL, the HTL, and the H-functional layer.

The buffer layer may help increase efficiency by compensating an optical resonant distance according to a wavelength of light emitted from the EML. The buffer layer may include suitable hole injecting materials and/or suitable hole transporting materials. The buffer layer may also include a material that is the same as one of the materials contained in the HIL, the HTL, and the H-functional layer disposed under the buffer layer.

The EML may be formed on the HTL, the H-functional layer, or the buffer layer by vacuum deposition, spin coating, casting, LB deposition, or the like. When the EML is formed by using vacuum deposition or spin coating, the deposition and coating conditions may be similar to those used to form the HIL, although the deposition and coating conditions may vary according to a compound that is used to form the EML.

The EML may include the compound according to an embodiment. For example, the compound of Formula 1 may be used as a dopant. The EML may be formed using a variety of suitable light-emitting materials instead of the compound of Formula 1. Alternatively, the EML may also be formed using a suitable host and a dopant. The dopant for forming the EML may include either a fluorescent dopant or a phosphorescent dopant.

Examples of suitable host material may include Alq$_3$, 4,4'-N,N'-dicarbazol-biphenyl (CBP), poly(n-vinylcarbazole) (PVK), 9,10-di(naphthalene-2-yl)anthracene (ADN), TCTA, 1,3,5-tris(N-phenylbenzimidazole-2-yl)benzene (TPBI), 3-tert-butyl-9,10-di(naphth-2-yl)anthracene (TBADN), E3, distyrylarylene (DSA), dmCBP (refer to the following formula), and Compounds 501 to 509 below.

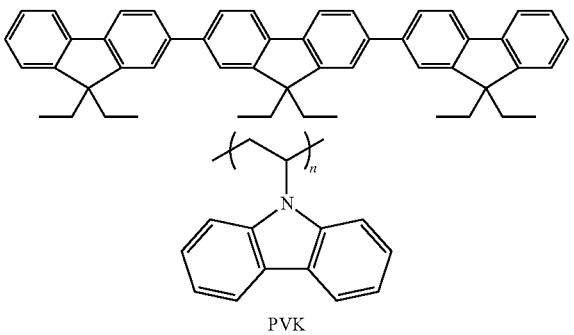

PVK

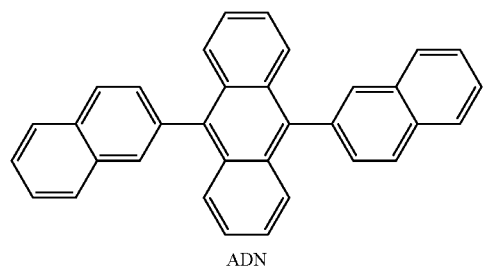

ADN

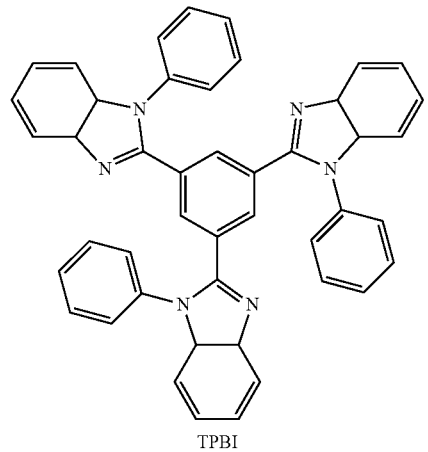

TPBI

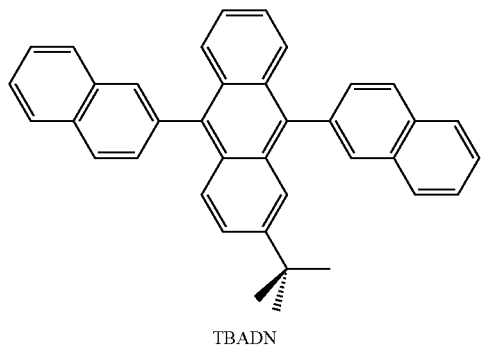

TBADN

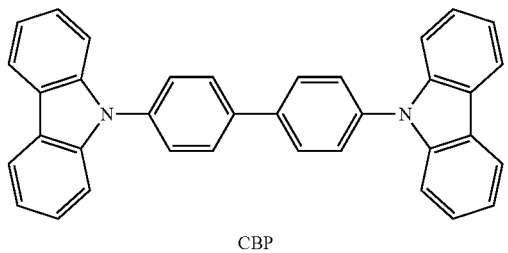

CBP

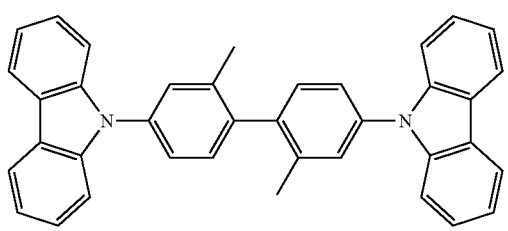

dmCBP

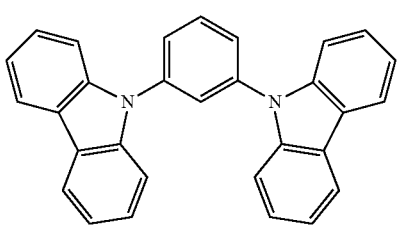

501

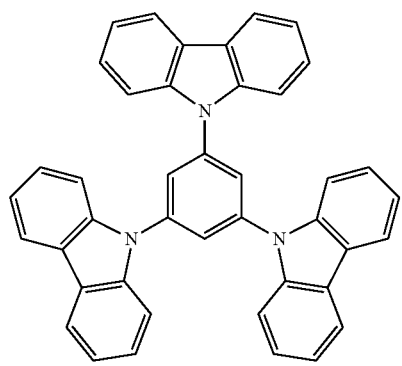
502
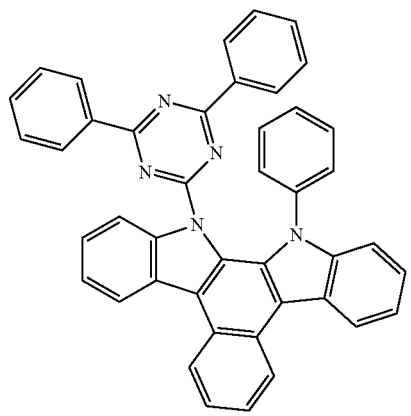
503
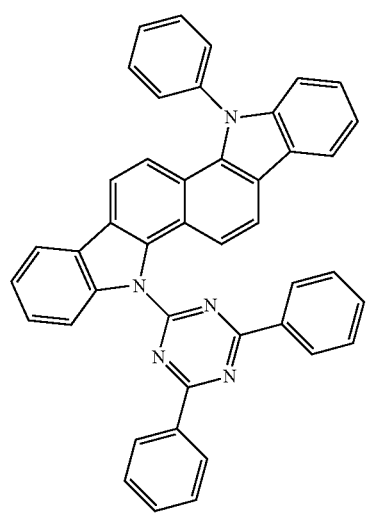
504
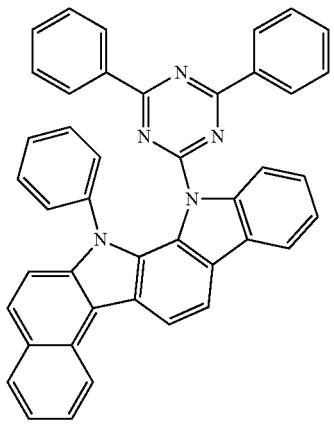
505
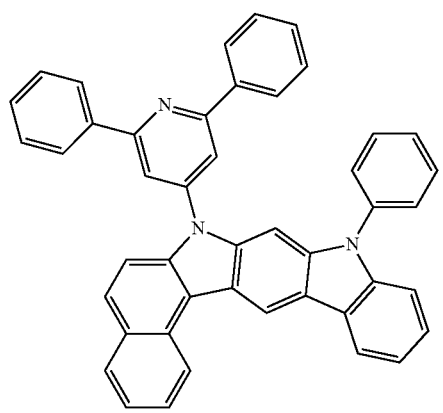
506
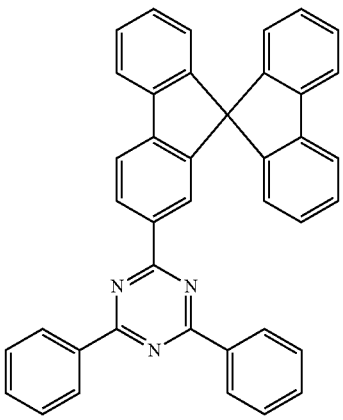
507
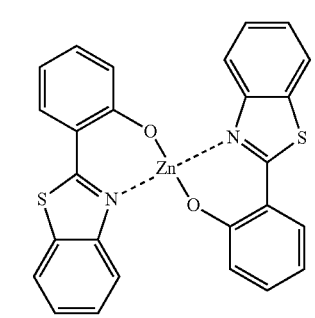
508

509

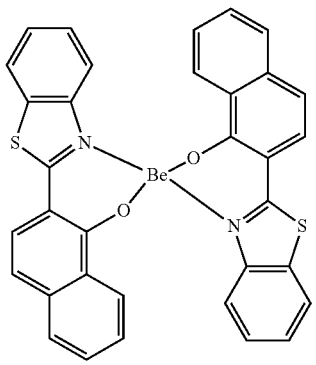

In an implementation, the host may include an anthracene-based compound represented by Formula 400 below.

Formula 400

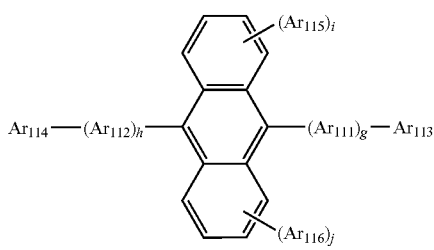

In Formula 400, $Ar_{111}$ and $Ar_{112}$ may be each independently a substituted or unsubstituted $C_5$-$C_{60}$ arylene group; $Ar_{113}$ to $Ar_{116}$ may be each independently a substituted or unsubstituted $C_1$-$C_{10}$ alkyl group or a substituted or unsubstituted $C_5$-$C_{60}$ aryl group; and g, h, i, and j may be each independently an integer of 0 to 4.

For example, in Formula 400, $Ar_{111}$ and $Ar_{112}$ may be a phenylene group, a naphthylene group, a phenanthrenylene group, or a pyrenylene group; or a phenylene group, a naphthylene group, a phenathrenylene group, a fluorenyl group, or a pyrenylene group substituted with at least one selected from the group consisting of a phenyl group, a naphthyl group, and an anthryl group.

In Formula 400, g, h, i, and j may be each independently 0, 1, or 2.

In Formula 400, $Ar_{113}$ to $Ar_{116}$ may be each independently selected from the group of: a $C_1$-$C_{10}$ alkyl group substituted with at least one selected from the group consisting of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group substituted with at least one selected from the group consisting of a deuterium atom, a halogen atom, a hydroxyl group, a cyano group, a nitro group, an amino group, an amidino group, hydrazine, hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a pyrenyl group, a phenanthrenyl group, and a fluorenyl group; and

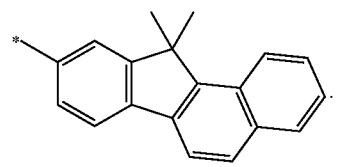 [SMILES: Cc1ccc2c(c1)C(C)(C)c1c-2ccc2ccccc12]

For example, the anthracene-based compound represented by Formula 400 may include one or the following compounds.

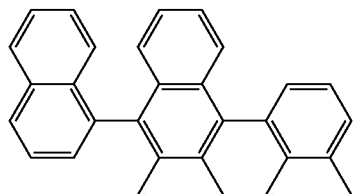

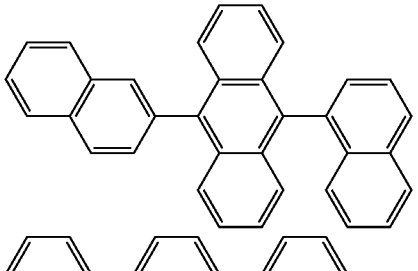

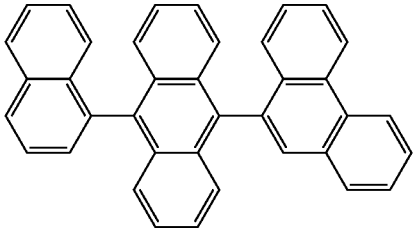

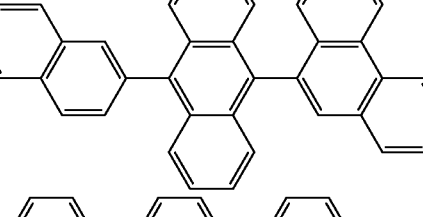

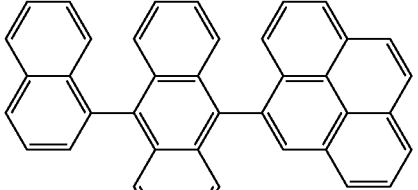

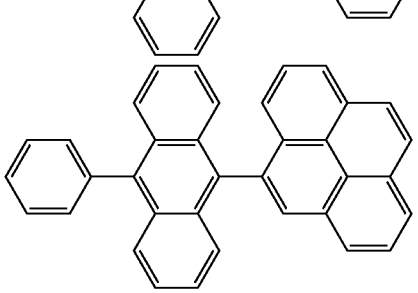

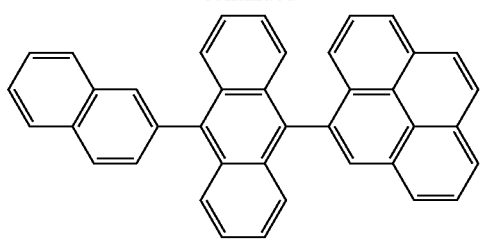
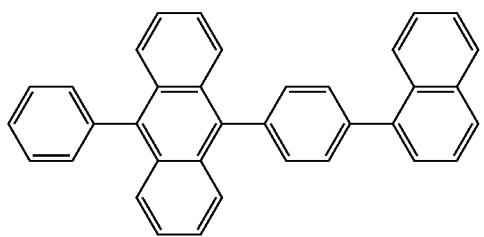
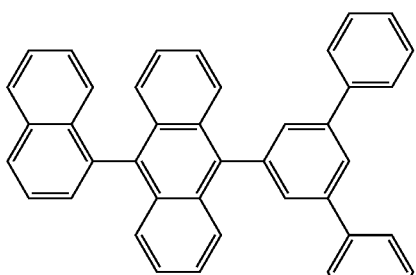
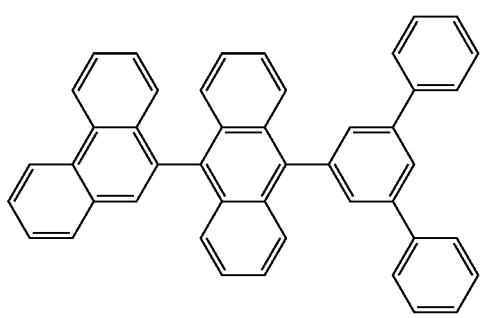
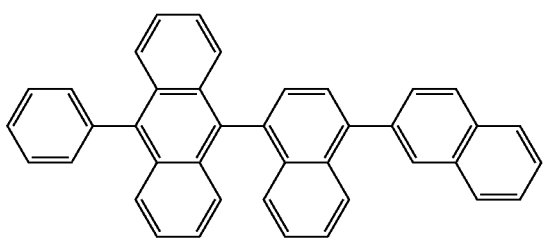
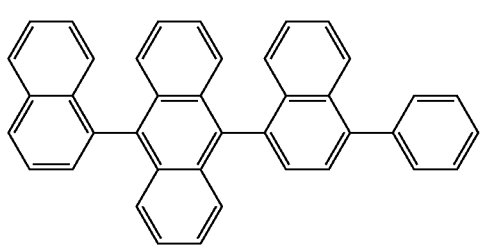
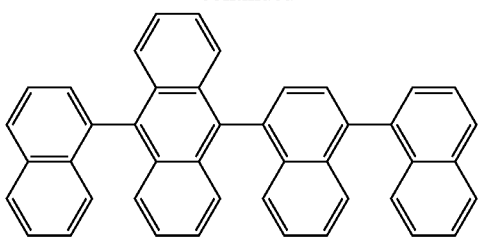
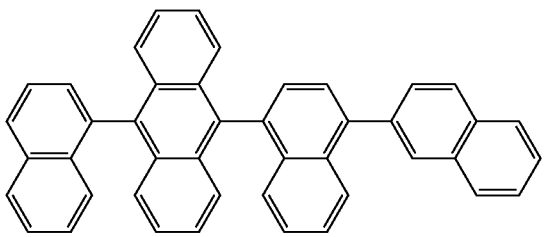
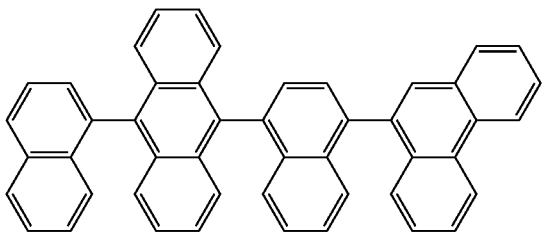
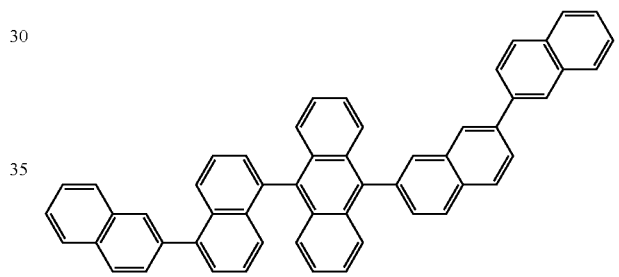
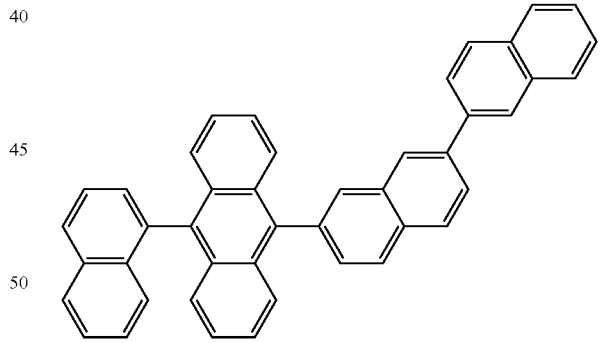
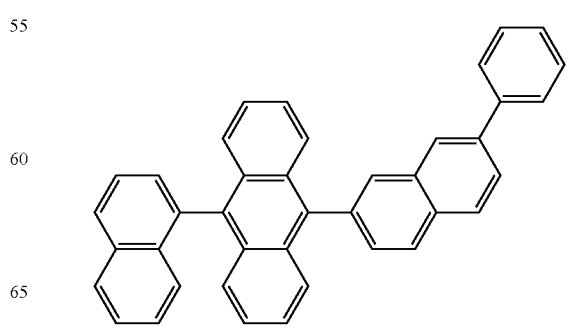

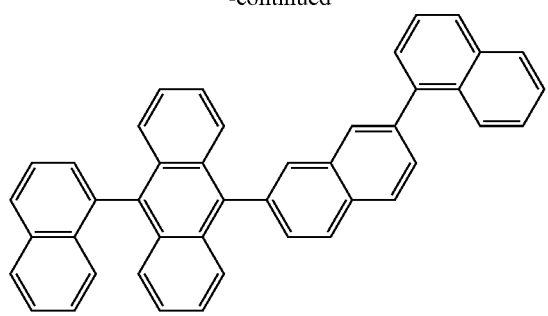
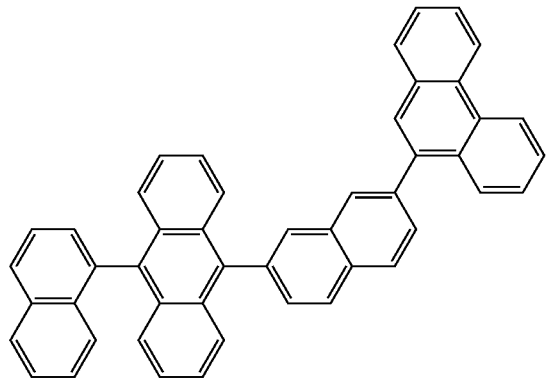
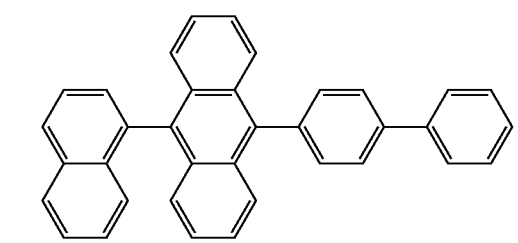
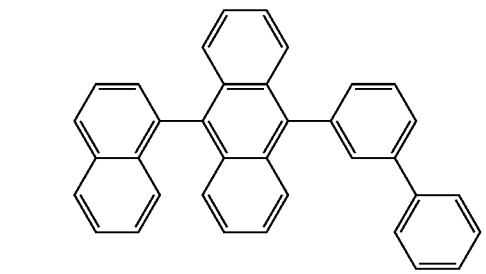
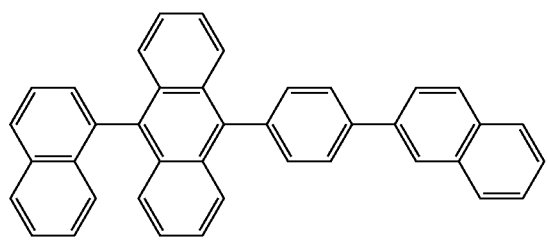
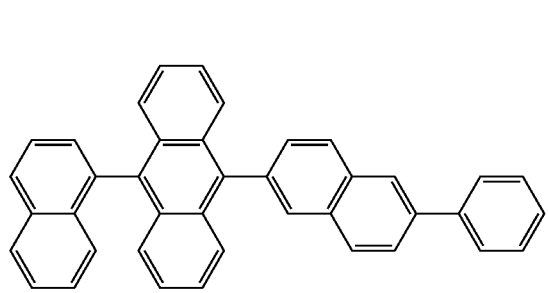
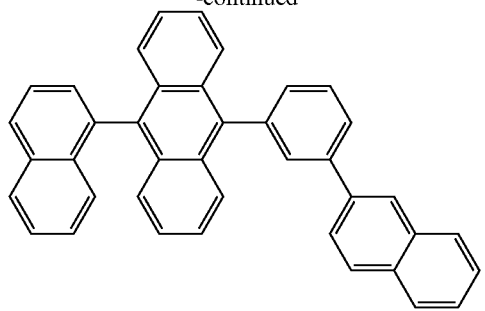
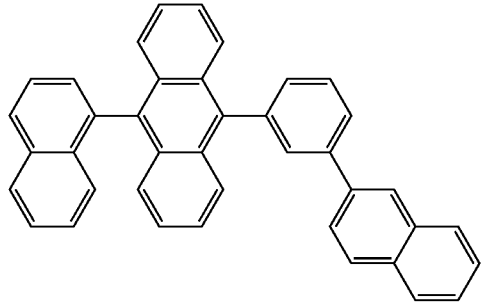
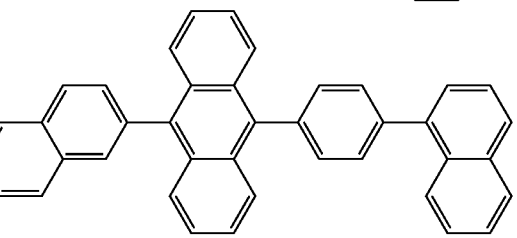
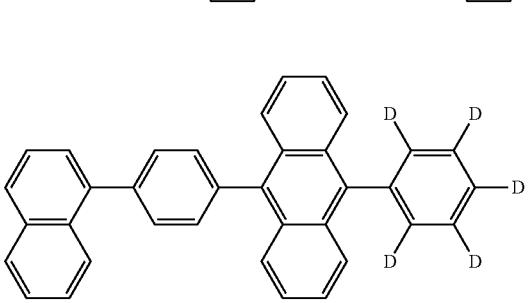
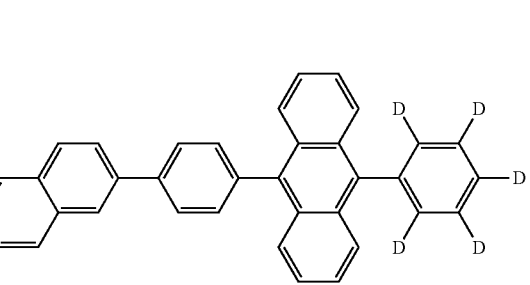
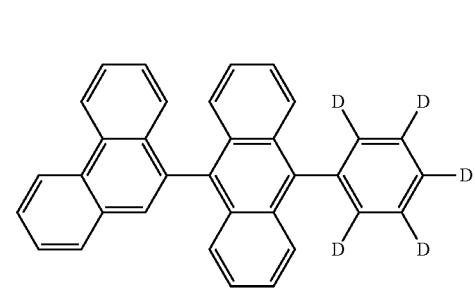

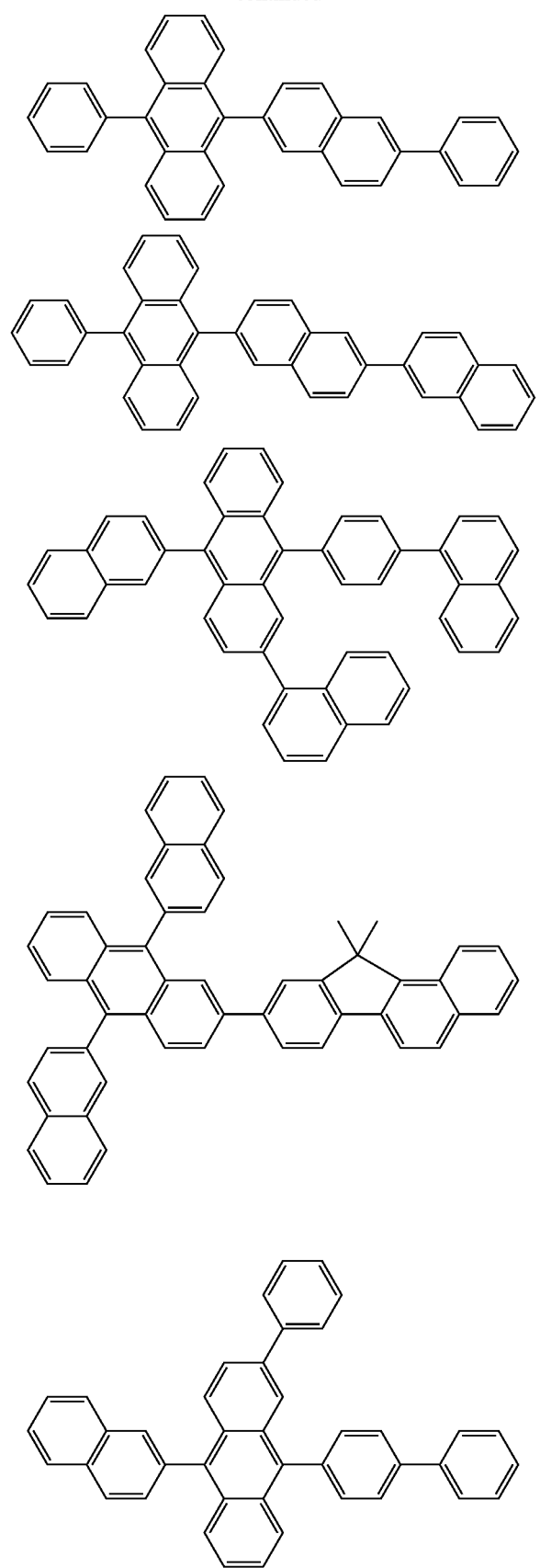
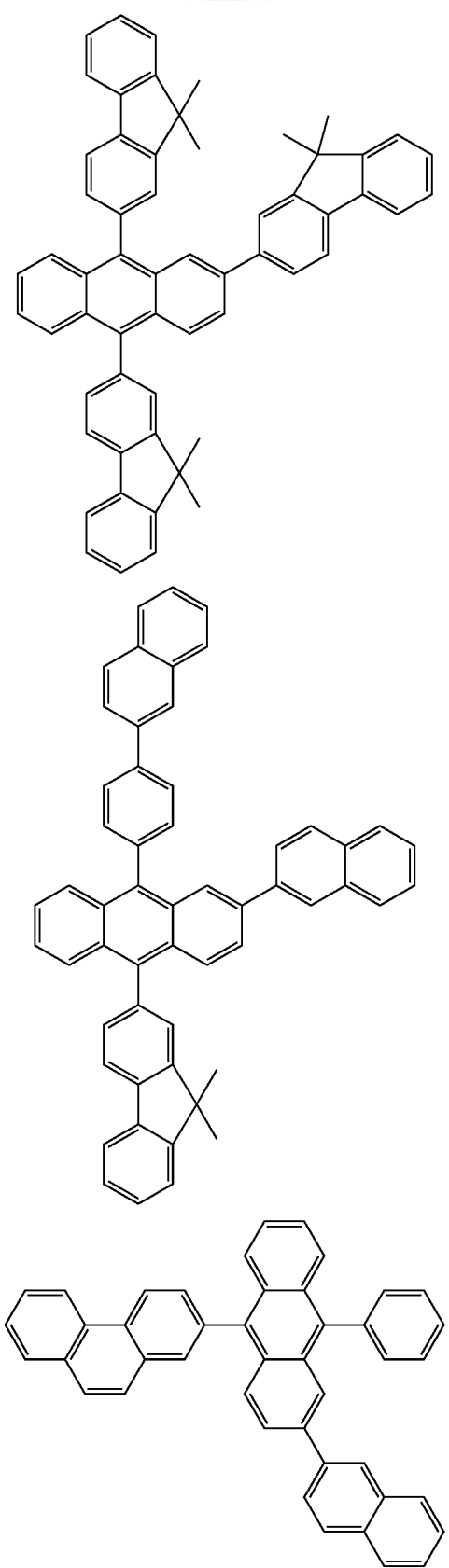

In an implementation, the host may include an anthracene-based compound represented by Formula 401 below.

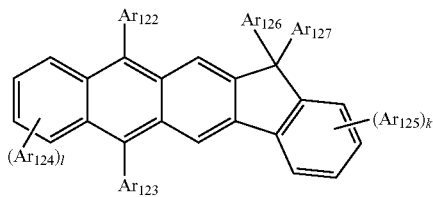

Formula 401

In Formula 401, $Ar_{122}$ to $Ar_{125}$ may be as defined above with reference to $Ar_{113}$ of Formula 400.

In Formula 401, $Ar_{126}$ and $Ar_{127}$ may be each independently a $C_1$-$C_{10}$ alkyl group, e.g., a methyl group, an ethyl group, or a propyl group.

In Formula 401, k and l may be each independently an integer of 0 to 4. For example, k and l may be 0, 1, or 2, respectively.

For example, the anthracene-based compound represented by Formula 401 may include one or the following compounds.

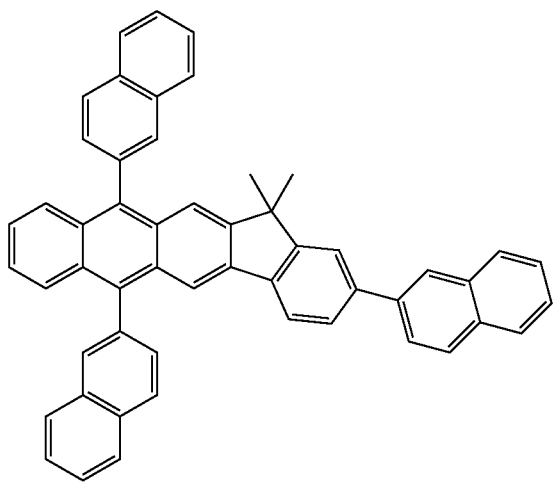

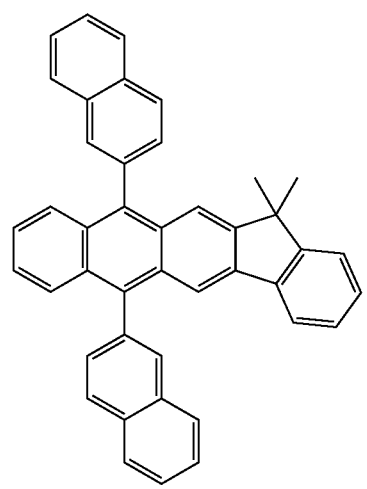

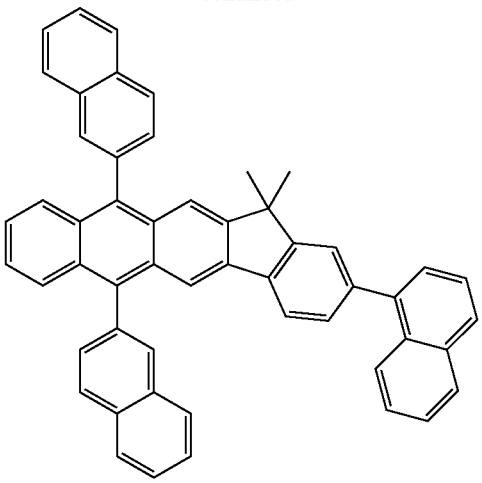

If the organic light-emitting device is a full-color organic light-emitting device, the EML may be patterned to a red EML, a green EML, and a blue EML.

In an implementation, at least one of the red, green, and blue EMLs may include the following dopant (ppy=phenylpyridine).

For example, the following compounds may be used as a blue dopant.

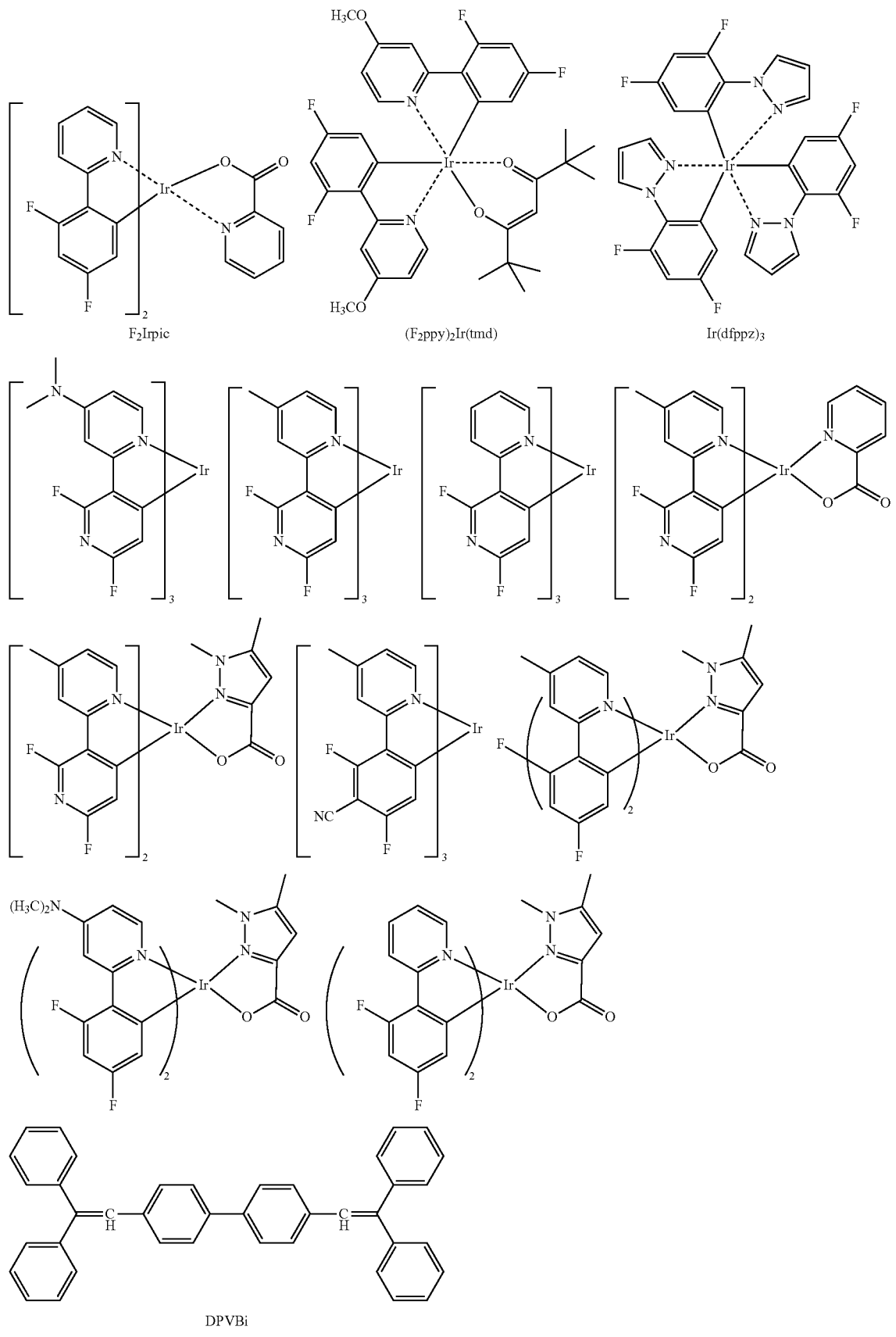

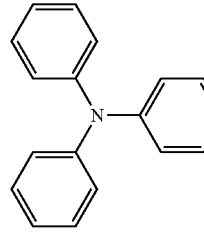
DPAVBi
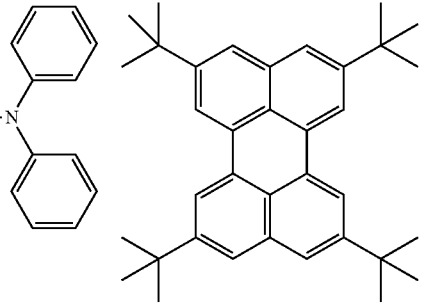
TBPe
For example, the following compounds may be used as a red dopant.
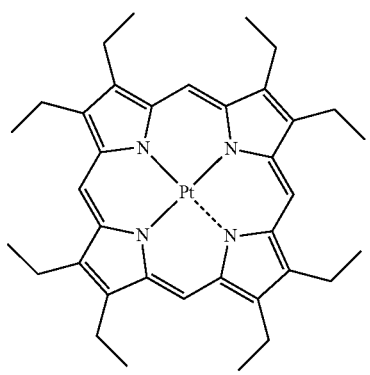
PtOEP
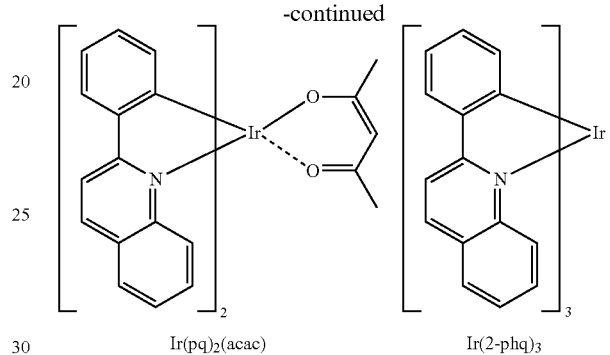
Ir(pq)₂(acac)    Ir(2-phq)₃
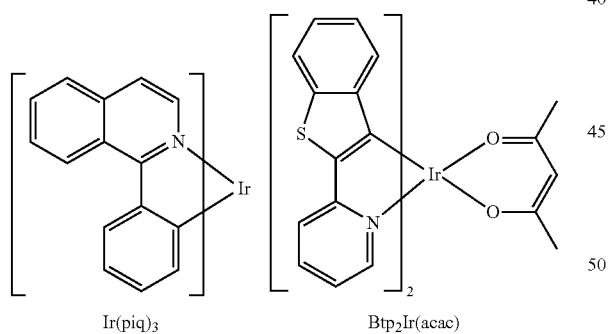
Ir(piq)₃    Btp₂Ir(acac)
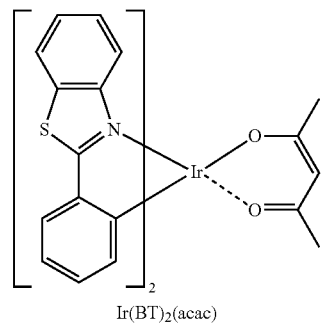
Ir(BT)₂(acac)
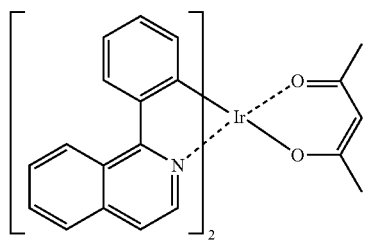
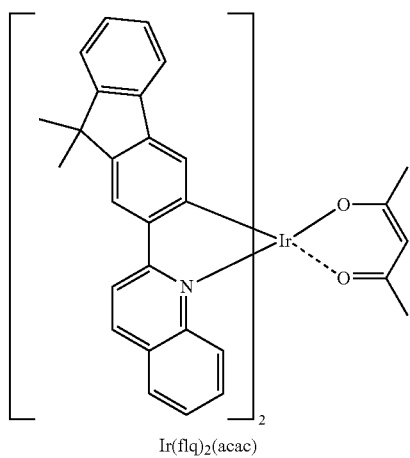
Ir(flq)₂(acac)

-continued
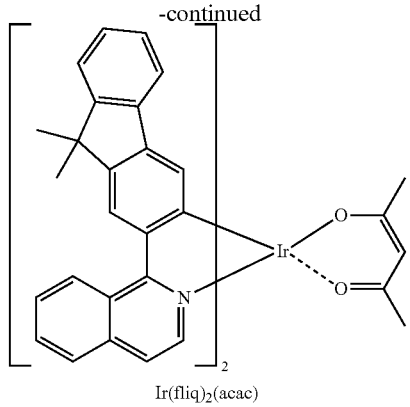
Ir(fliq)₂(acac)
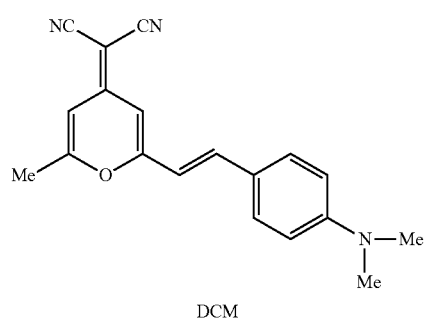
DCM
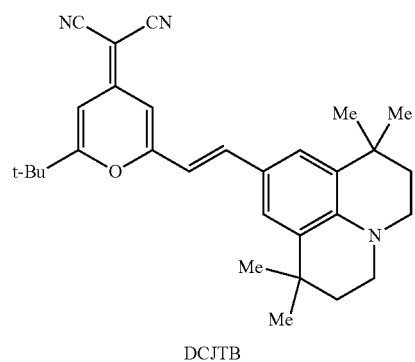
DCJTB
For example, the following compounds may be used as a green dopant.
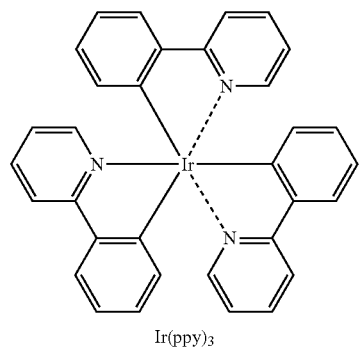
Ir(ppy)₃
-continued
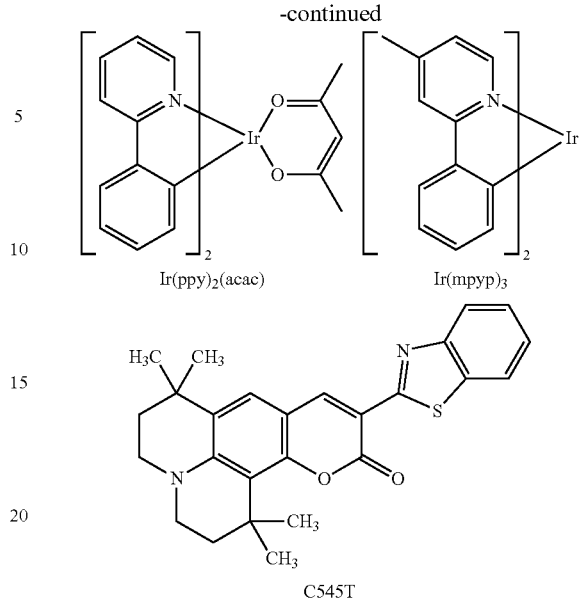
Ir(ppy)₂(acac)    Ir(mpyp)₃
C545T
In an implementation, the dopant used in the EML may be a complex, which will be described later.
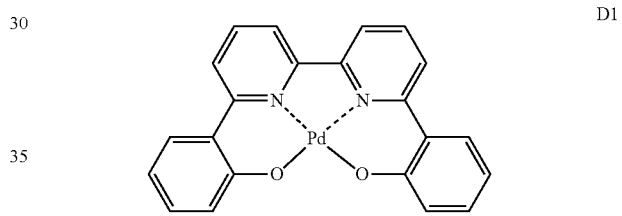
D1
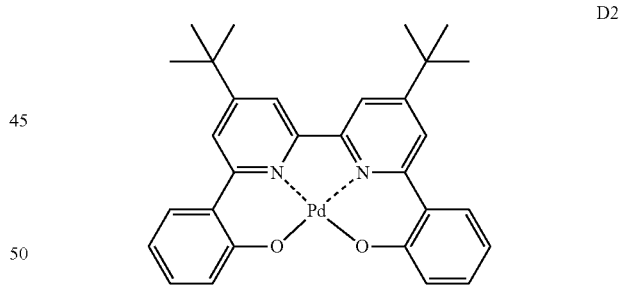
D2
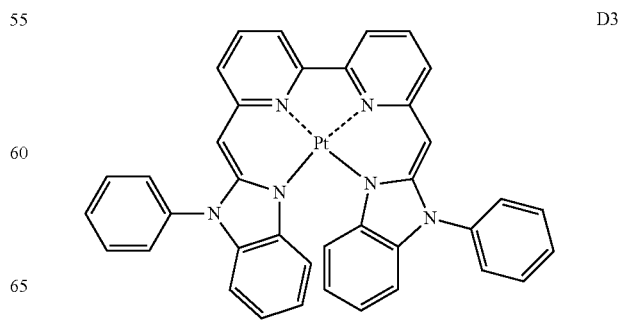
D3

D4
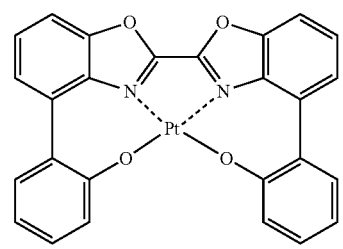
D5
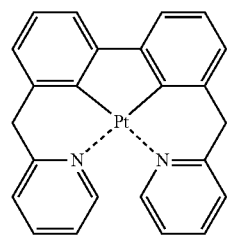
D6
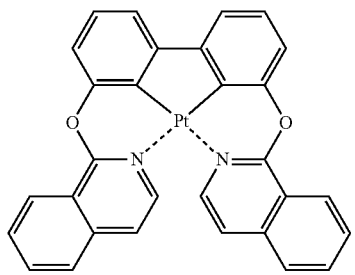
D7
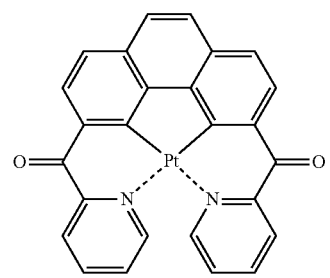
D8
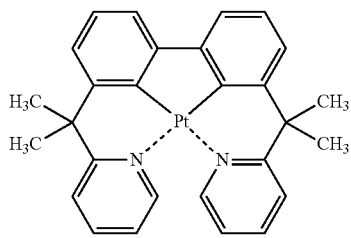
D9
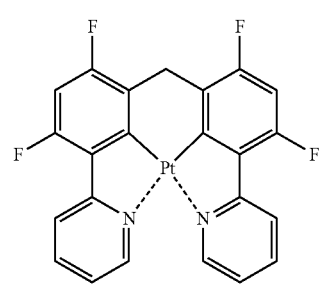
D10
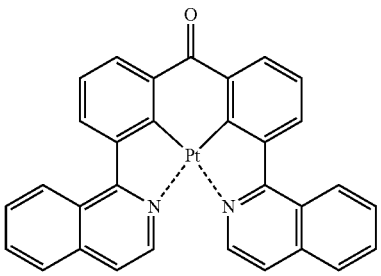
D11
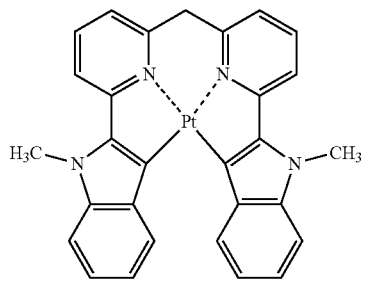
D12
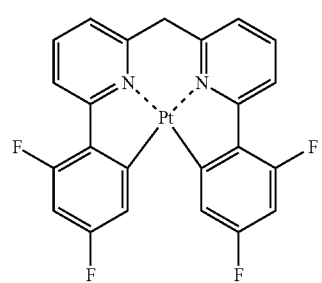
D13
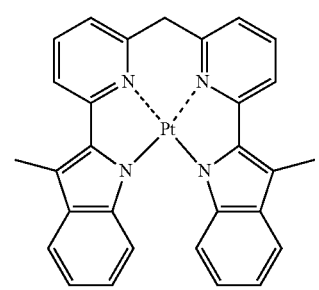
D14
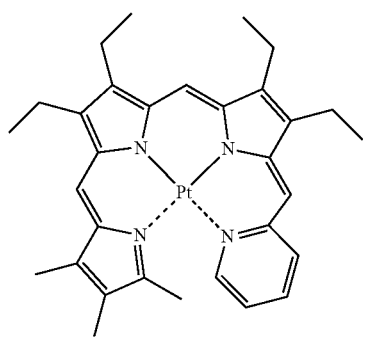

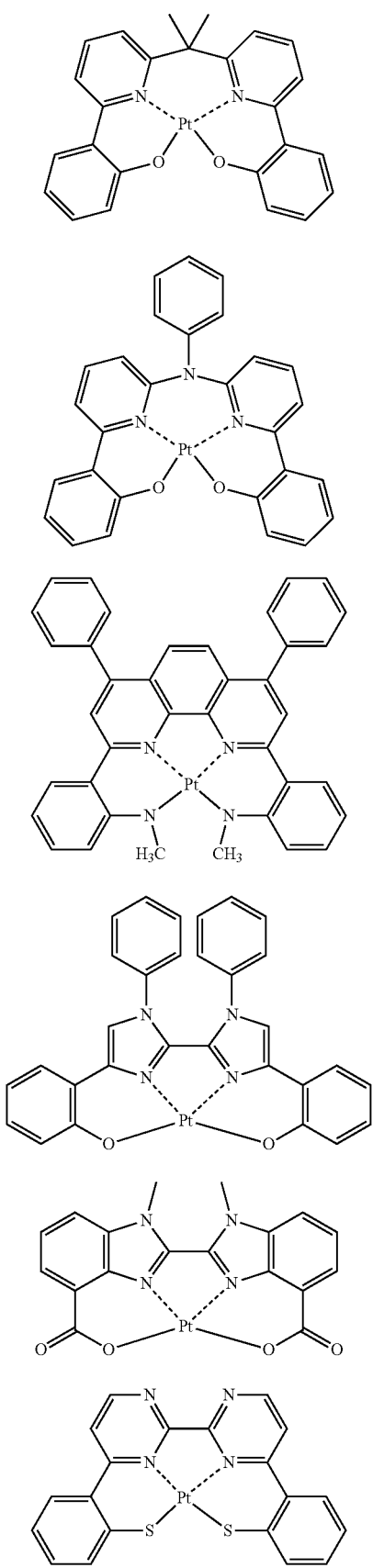
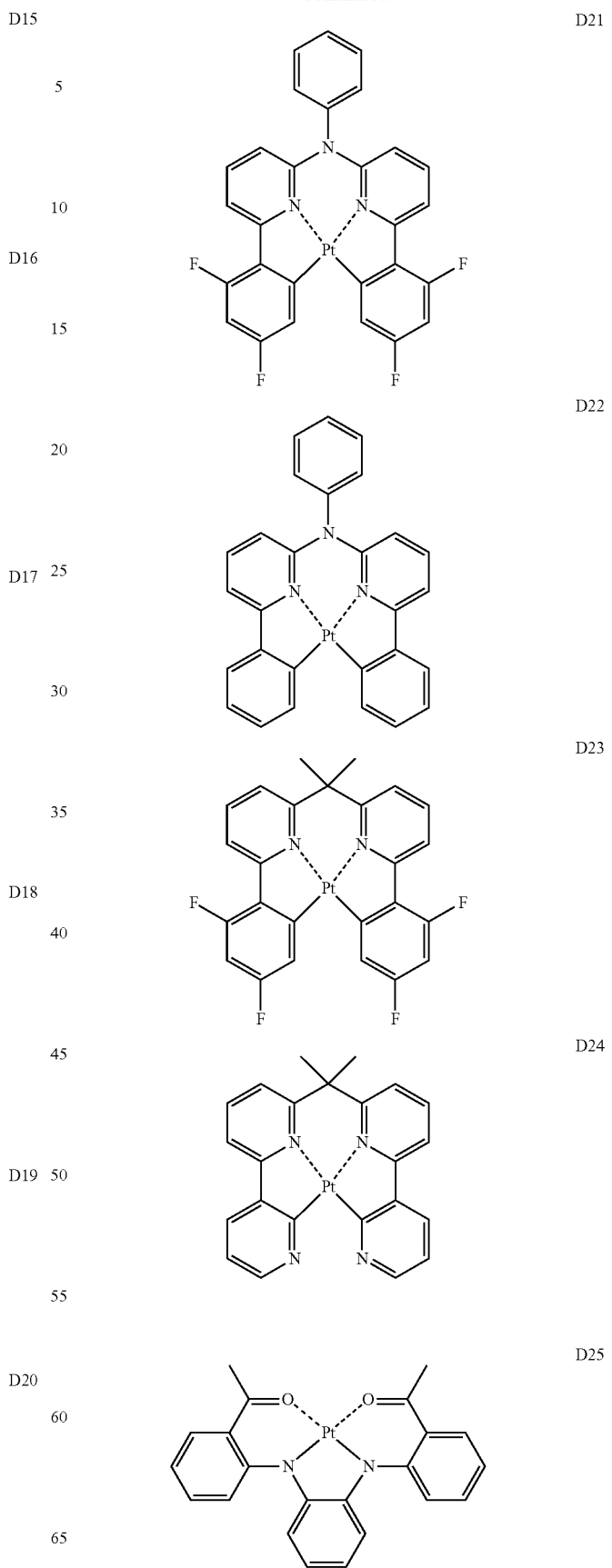

-continued
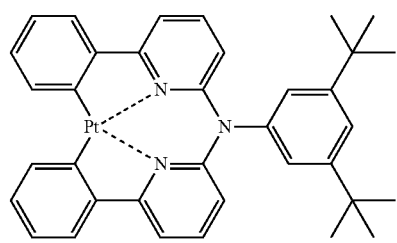
D26
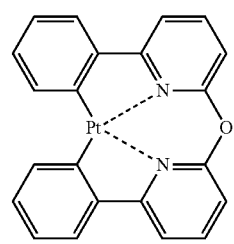
D27
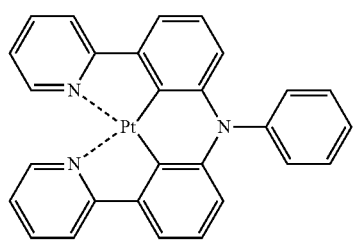
D28
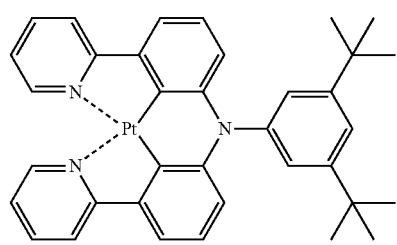
D29
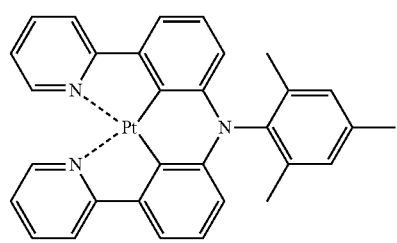
D30
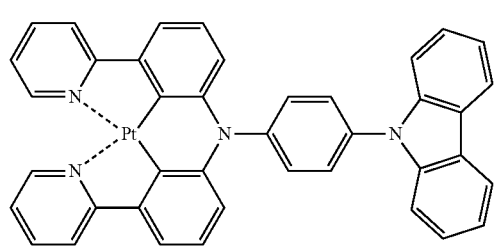
D31
-continued
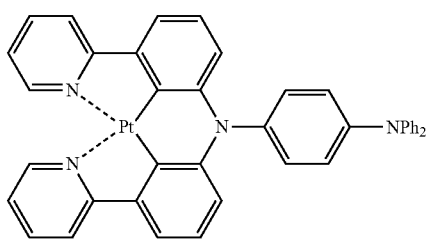
D32
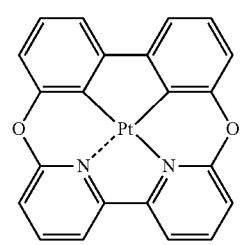
D33
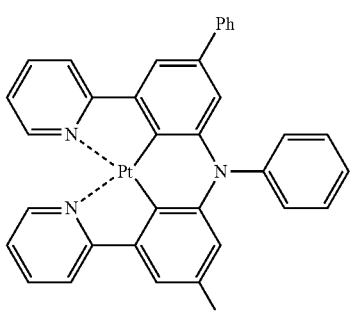
D34
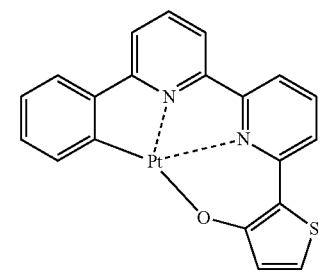
D35
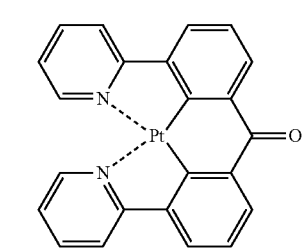
D36
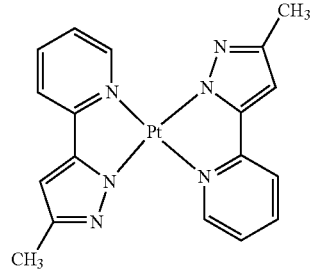
D43

D44
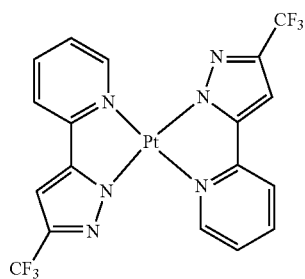
D45
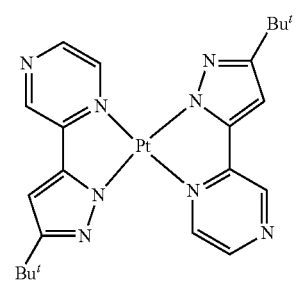
D46
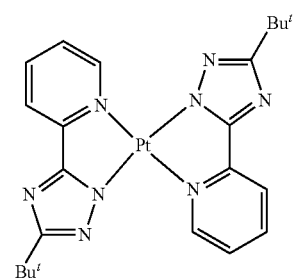
D47
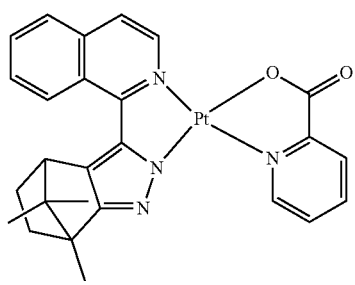
D48
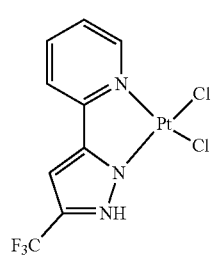
D49
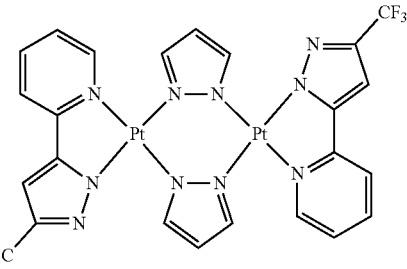
D50
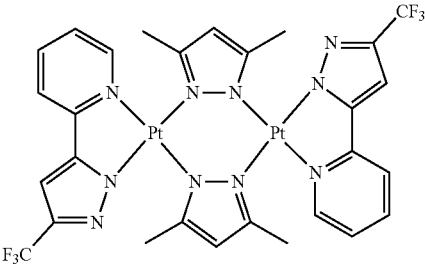
In addition, the dopant used in the EML may include an Os-complex, which will be described later.
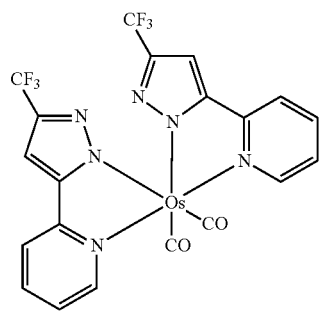
Os(fppz)$_2$(CO)$_2$
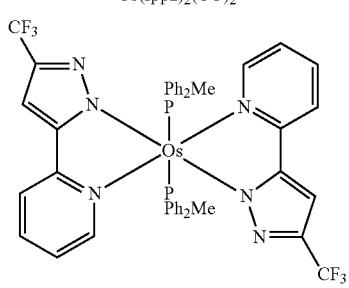
Os(fppz)$_2$(PPh$_2$Me)$_2$
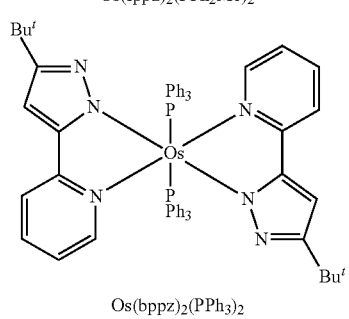
Os(bppz)$_2$(PPh$_3$)$_2$ -continued

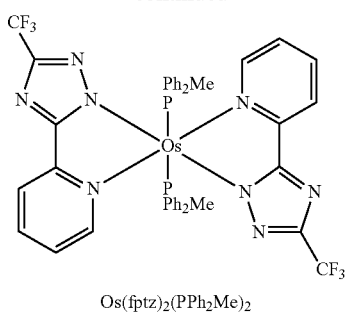

Os(fptz)₂(PPh₂Me)₂

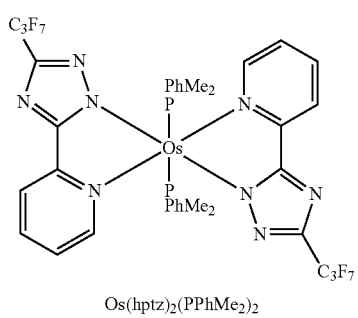

Os(hptz)₂(PPhMe₂)₂

If the EML includes a host and a dopant, an amount of the dopant may be, e.g., about 0.01 to about 15 parts by weight, based on 100 parts by weight of the host.

The thickness of the EML may be about 100 Å to about 1,000 Å, e.g., about 200 Å to about 600 Å. When the thickness of the EML is within this range, the EML may have excellent light emitting characteristics without a substantial increase in driving voltage.

Then, the ETL may be formed on the EML by vacuum deposition, spin coating, casting, or the like. When the ETL is formed by using vacuum deposition or spin coating, the deposition and coating conditions may be similar to those used to form the HIL, although the deposition and coating conditions may vary according to a compound that is used to form the ETL.

A material that is used to form the ETL may be a suitable material that stably transports electrons injected from the electron injecting electrode (cathode). Examples of suitable electron transporting materials may include quinoline derivatives, such as tris-(8-hydroxyquinoline)aluminum (Alq₃), TAZ, Balq, beryllium bis(benzoquinolin-10-olate) (Balq₂), ADN, Compound 201, and Compound 202.

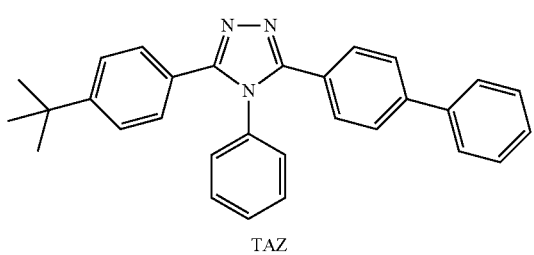

TAZ

-continued

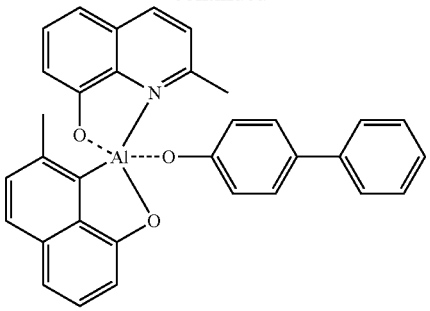

BAlq

Compound 201

Compound 202

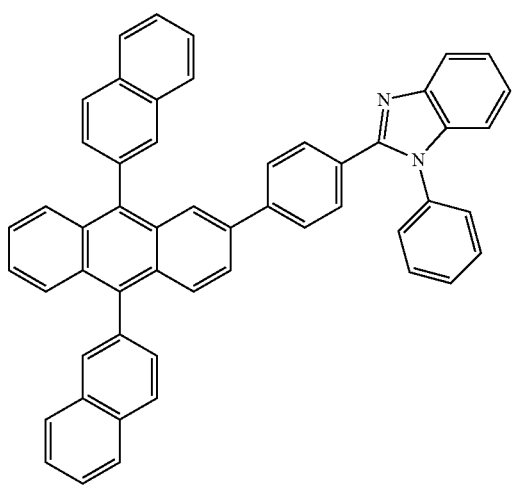

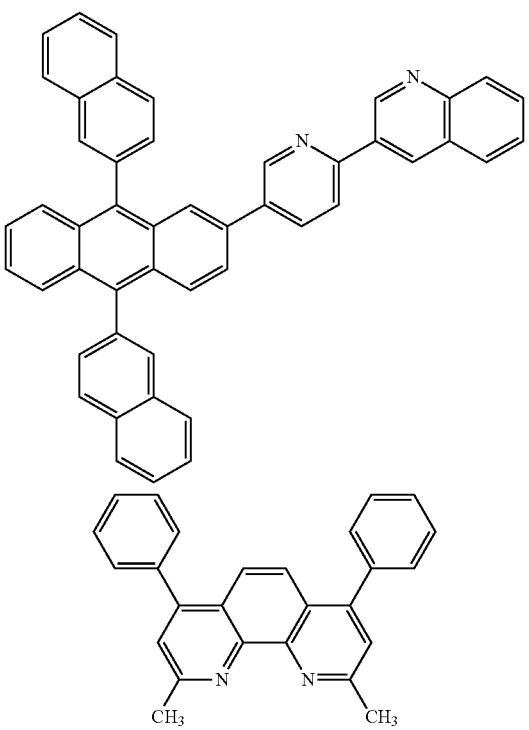

BCP

The thickness of the ETL may be about 100 Å to about 1,000 Å, e.g., about 150 Å to about 500 Å. When the thickness of the ETL is within this range, the ETL may have excellent electron transporting ability without a substantial increase in driving voltage.

In an implementation, the ETL may further include a metal-containing material in addition to suitable electron transporting organic compounds.

The metal-containing material may include a Li complex. Examples of the Li complex may include lithium quinolate (LiQ) or Compound 203 below.

Compound 203

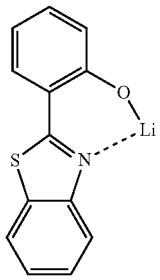

In an implementation, the EIL may be formed on the ETL using a suitable material that facilitates electron injection from the cathode.

Examples of materials for forming the EIL may include LiF, NaCl, CsF, $Li_2O$, and BaO. The conditions for deposition of the EIL may be similar to those for formation of the HIL, although the deposition conditions may vary according to a compound that is used to form the EIL.

The thickness of the EIL may be about 1 Å to about 100 Å, e.g., about 3 Å to about 90 Å. When the thickness of the EIL is within this range, the EIL may have excellent electron injecting ability without a substantial increase in driving voltage.

A second electrode may be disposed on the organic layer. The second electrode may be a cathode, which is an electron injecting electrode. A material used to form the second electrode may be a metal, an alloy, an electrically conductive compound, which have a low work function, or any mixture thereof. For example, the second electrode may be a transmissive electrode formed of lithium (Li), magnesium (Mg), aluminum (Al), an Al—Li alloy, calcium (Ca), an Mg—In alloy, or an Mg—Ag alloy in a thin film. In an implementation, in order to manufacture a top-emission type organic light-emitting device, a transmissive electrode formed of ITO or IZO may be used, and various modifications may be applied thereto In an implementation, when a phosphorescent dopant is used to form the EML, an HBL may be formed between the HTL and the EML or between the H-functional layer and the EML by using vacuum deposition, spin coating, casting, LB deposition, or the like, in order to prevent diffusion of triplet excitons or holes into the ETL. When the HBL is formed by vacuum deposition or spin coating, the conditions for deposition and coating may be similar to those for the formation of the HIL, although the conditions for the deposition and coating may vary according to the material that is used to form the HBL. A suitable hole blocking material may be used. Examples of hole blocking materials may include an oxadiazole derivative, a triazole derivative, and a phenanthroline derivative. For example, BCP may be used as the hole blocking material.

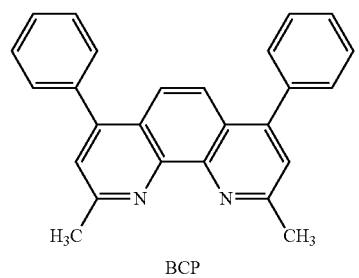

BCP

The thickness of the HBL may be about 20 Å to about 1,000 Å, e.g., about 30 Å to about 300 Å. When the thickness of the HBL is within this range, the HBL may have excellent hole blocking ability without a substantial increase in driving voltage.

The organic light-emitting device according to an embodiment may be applied to various types of flat panel display devices, such as a passive matrix organic light-emitting display device or an active matrix organic light-emitting display device. For example, when the organic light-emitting device is applied to an active matrix organic light-emitting display device, the first electrode formed on the substrate may function as a pixel electrode and may be electrically connected to a source electrode or a drain electrode of a thin-film transistor. Moreover, the organic light-emitting device may also be applied to a flat panel display device having a double-sided screen.

The organic layer of the organic light-emitting device according to an embodiment may be formed of the compound according to an embodiment by using a deposition method or a wet method of coating a solution of the compound according to an embodiment.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Synthesis Example 1

Synthesis of Compound 1

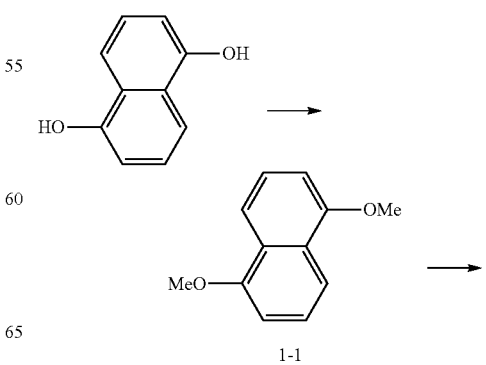

1-1

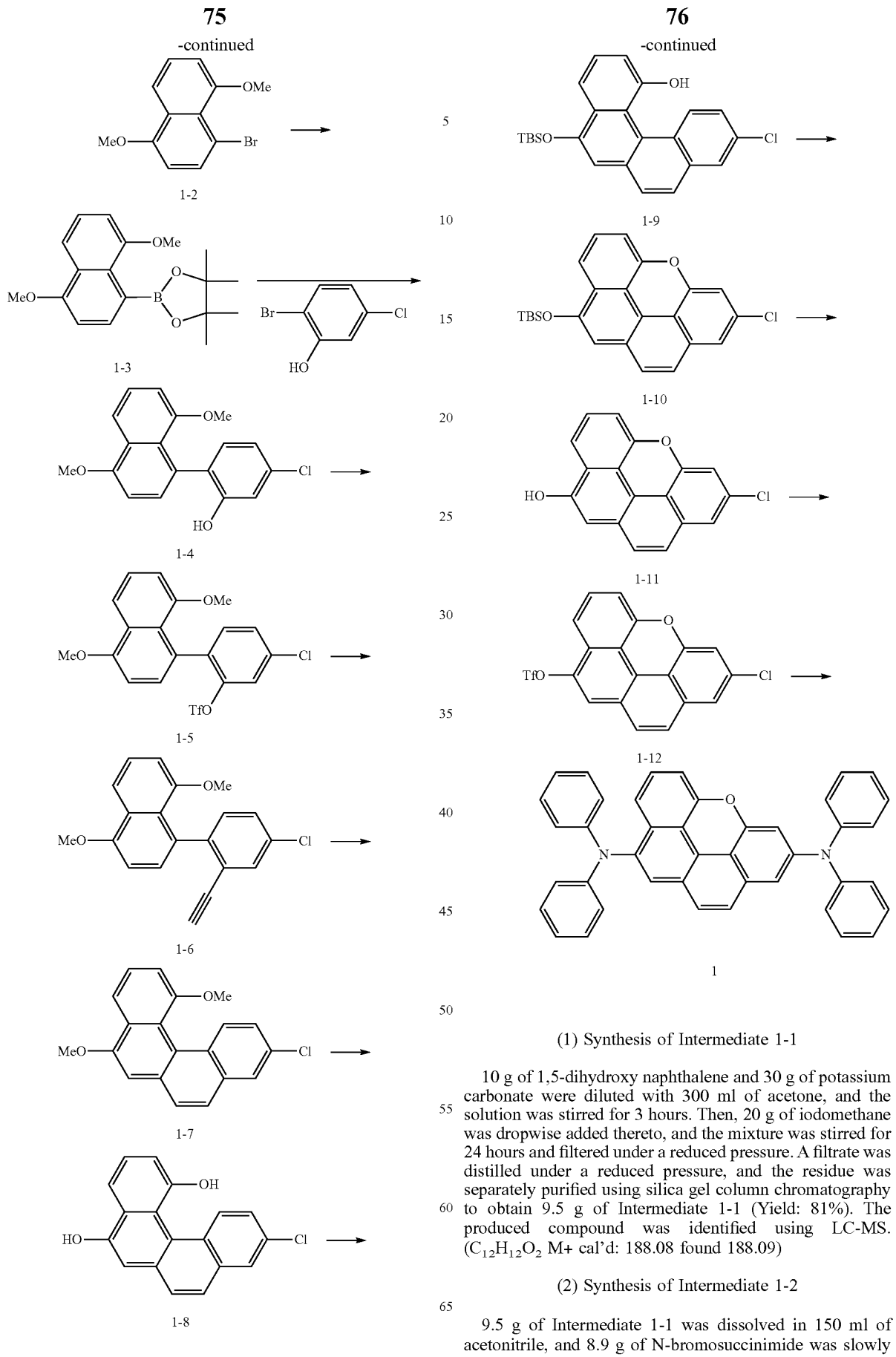

(1) Synthesis of Intermediate 1-1

10 g of 1,5-dihydroxy naphthalene and 30 g of potassium carbonate were diluted with 300 ml of acetone, and the solution was stirred for 3 hours. Then, 20 g of iodomethane was dropwise added thereto, and the mixture was stirred for 24 hours and filtered under a reduced pressure. A filtrate was distilled under a reduced pressure, and the residue was separately purified using silica gel column chromatography to obtain 9.5 g of Intermediate 1-1 (Yield: 81%). The produced compound was identified using LC-MS. ($C_{12}H_{12}O_2$ M+ cal'd: 188.08 found 188.09)

(2) Synthesis of Intermediate 1-2

9.5 g of Intermediate 1-1 was dissolved in 150 ml of acetonitrile, and 8.9 g of N-bromosuccinimide was slowly dropwise added thereto at 0° C. for 10 minutes. The reaction mixture was slowly heated from 0° C. to ambient temperature for 4 hours, and the reaction was terminated by adding water. The reaction mixture was distilled under a reduced pressure, and the residue was subjected to extraction three times using ethyl acetate. The resultant was dried using anhydrous magnesium sulfate and distilled under a reduced pressure, and the residue was separately purified using silica gel column chromatography to obtain 12.9 g of Intermediate 1-2 (Yield: 93%). The produced compound was identified using LC-MS. ($C_{12}H_{11}BrO_2$ M+ cal'd: 265.95 found 265.98)

(3) Synthesis of Intermediate 1-3

12.9 g of Intermediate 1-2 was dissolved in 4 ml of dimethyl formamide, 1.97 g of [1,1'-bis(diphenylphosphino)ferrocene]dichloropalladium (II), 12.2 g of bis(pinacolato)diboron and 14 g of potassium acetate were added thereto, and the mixture was refluxed while stirring at 80° C. for 2 hours. The reaction mixture was slowly cooled to ambient temperature, the reaction was terminated by adding water, and the resultant was subjected to extraction three times using ethyl acetate. A separated organic layer was dried using anhydrous magnesium sulfate and distilled under a reduced pressure, and the residue was separately purified using silica gel column chromatography to obtain 11.5 g of Intermediate 1-3 (Yield: 76%). The produced compound was identified using LC-MS. ($C_{18}H_{23}BO_4$ M+ cal'd: 314.17 found 314.18)

(4) Synthesis of Intermediate 1-4

11.5 g of Intermediate 1-4 and 8 g of 2-bromo-5-chlorophenol were diluted with 300 ml of tetrahydrofuran and 150 ml of water. Then, 2.1 g of $Pd(PPh_3)_4$ and 15 g of potassium carbonate were added thereto, and the mixture was refluxed while stirring at 70° C. After maintaining the reaction mixture for 15 hours, the reaction mixture was cooled to ambient temperature, and an organic layer was separated by using ethyl acetate. The separated organic layer was dried using anhydrous magnesium sulfate and concentrated under a reduced pressure, and the residue was separately purified using silica gel column chromatography to obtain 9.8 g of Intermediate 1-4 (Yield: 85%). The produced compound was identified using LC-MS. ($C_{18}H_{15}ClO_3$ M+ cal'd: 314.07 found 314.09)

(5) Synthesis of Intermediate 1-5

9.8 g of Intermediate 1-4 was diluted with 300 ml of dichloromethane, and 6.4 ml of triethylamine was dropwise added thereto. Continuously, 9.9 g of anhydrous trifuloroacetic acid was slowly dropwise added thereto. After stirring the reaction mixture for 3 hours, the reaction was terminated adding water, and an organic layer was separated. The separated organic layer was dried using anhydrous magnesium sulfate and concentrated under a reduced pressure, and the residue was separately purified using silica gel column chromatography to obtain 12.7 g of Intermediate 1-5 (Yield: 91%). The produced compound was identified using LC-MS. ($C_{19}H_{14}ClF_3O_5S$ M+ cal'd: 446.02 found 446.09)

(6) Synthesis of Intermediate 1-6

12.7 g of Intermediate 1-5, 5.6 g of trimethylsilylacetylene, 5.5 g of CuI, and 1.6 g of $Pd(PPh_3)$ were dissolved in 120 ml of triethylamine, and the mixture was refluxed while stirring at 70° C. for 6 hours. The reaction mixture was cooled to 0° C., neutralized by using 1 N HCl, and extracted three times using ethyl acetate. An extracted organic layer was dried using anhydrous magnesium sulfate and distilled under a reduced pressure, and the residue was separately purified using silica gel column chromatography to obtain 6.7 g of Intermediate 1-6 (Yield: 73%). The produced compound was identified using LC-MS. ($C_{20}H_{15}ClO_2$ M+ cal'd: 322.08 found 322.10)

(7) Synthesis of Intermediate 1-7

6.7 g of Intermediate 1-6 and 277 mg of $PtCl_2$ were diluted with 120 ml of toluene, and the solution was refluxed while stirring at 80° C. for 24 hours. The reaction was terminated adding water, and the reaction mixture was subjected to extraction three times using ethyl acetate. A separated organic layer was dried using anhydrous magnesium sulfate and distilled under a reduced pressure, and the residue was separately purified using silica gel column chromatography to obtain 5.7 g of Intermediate 1-7 (Yield: 85%). The produced compound was identified using LC-MS. ($C_{20}H_{15}ClO_2$ M+ cal'd: 322.08 found 322.09)

(8) Synthesis of Intermediate 1-8

5.7 g of Intermediate 1-7 was diluted with 100 ml of dichloromethane, and 13.2 g of tribromoboron was slowly dropwise added thereto. After maintaining the reaction mixture for 3 hours, the reaction was terminated adding a saturated sodium bicarbonate solvent, and layers were separated. A separated organic layer was dried using anhydrous magnesium sulfate and concentrated under a reduced pressure, and the residue was separately purified using silica gel column chromatography to obtain 4.7 g of Intermediate 1-8 (Yield: 91%). The produced compound was identified using LC-MS. ($C_{18}H_{11}ClO_2$ M+ cal'd: 294.04 found 294.05)

(9) Synthesis of Intermediate 1-9

4.7 g of Intermediate 1-8 was diluted with 100 ml of dichloromethane, and 4.4 ml of triethylamine and 2.6 g of tert-butyldimethylchlorosilane were slowly dropwise added thereto. After maintaining the reaction mixture for 3 hours, the reaction was terminated adding water, and an organic layer was separated. The separated organic layer was dried using anhydrous magnesium sulfate and concentrated under a reduced pressure, and the residue was separately purified using silica gel column chromatography to obtain 6.3 g of Intermediate 1-9 (Yield: 93%). The produced compound was identified using LC-MS. ($C_{24}H_{25}ClO_2Si$ M+ cal'd: 408.13 found 408.17)

(10) Synthesis of Intermediate 1-10

6.3 g of Intermediate 1-9 was diluted with 150 ml of nitrobenzene, and 3.7 g of Cu(I)O was dropwise added thereto, and then the mixture was refluxed while stirring at 180° C. After maintaining the reaction mixture for 48 hours, the reaction mixture was cooled to ambient temperature and distilled under a reduced pressure to remove nitrobenzene. The residue was separately purified using silica gel column chromatography to obtain 4.8 g of Intermediate 1-10 (Yield: 76%). The produced compound was identified using LC-MS. ($C_{24}H_{23}ClO_2Si$ M+ cal'd: 406.12 found 406.15)

(11) Synthesis of Intermediate 1-11

4.8 g of Intermediate 1-10 was diluted with 80 ml of tetrahydrofuran, and 23.4 ml of 1 M TBAF was slowly dropwise added thereto at 0° C., and then the reaction mixture was stirred at ambient temperature. After maintaining the reaction mixture for 5 hours, the reaction mixture was distilled under a reduced pressure, and the residue was separately purified using silica gel column chromatography to obtain 2.4 g of Intermediate 1-11 (Yield: 99%). The produced compound was identified using LC-MS. ($C_{18}H_9ClO_2$ M+ cal'd: 292.03 found 292.08)

(12) Synthesis of Intermediate 1-12

3.3 g of Intermediate 1-12 (Yield: 93%) was synthesized in the same manner as the synthesis of Intermediate 1-5, except that 2.4 g of Intermediate 1-11 was used. The produced compound was identified using LC-MS. ($C_{19}H_8ClF_3O_4S$ M+ cal'd: 423.98 found 424.02)

(13) Synthesis of Compound 1

1 g of Intermediate 1-12, 1 g of diphenylamine, 0.09 g of $Pd_2(dba)_3$, 0.02 g of $PtBu_3$, and 0.56 g of KOtBu were dissolved in 75 ml of toluene, and the mixture was stirred at 85° C. for 2 hours. The reaction was terminated adding water at ambient temperature and the resultant was subjected to extraction three times using ethyl acetate. A separated organic layer was dried using anhydrous magnesium sulfate and distilled under a reduced pressure, and the residue was separately purified using silica gel column chromatography to obtain 1.1 g of Compound 1 (Yield: 82%).

Synthesis Example 2

Synthesis of Compound 7

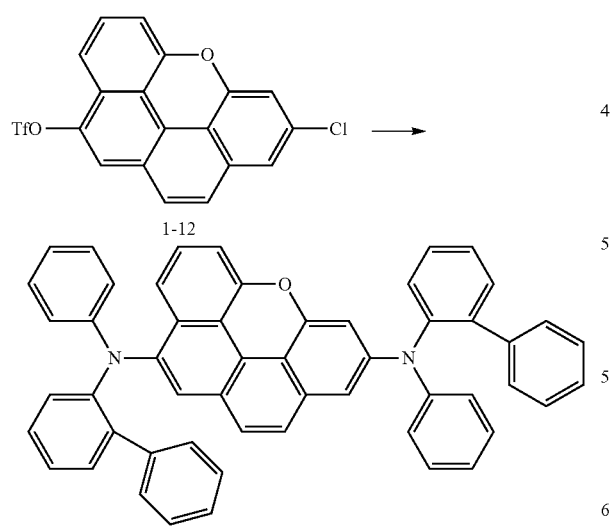

1.5 g of Compound 7 (Yield: 86%) was synthesized in the same manner as the synthesis of Compound 1, except that 1 g of Intermediate 1-12 and 1.3 g of N-phenyl-[1,1'-biphenyl]-2-amine were used.

Synthesis Example 3

Synthesis of Compound 13

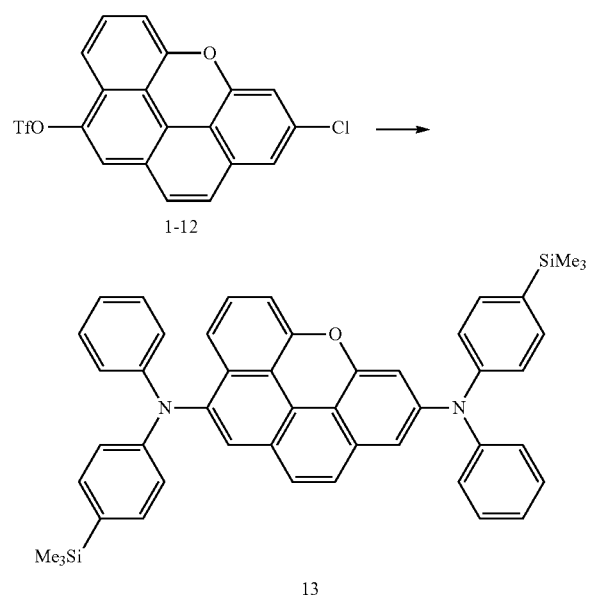

1.1 g of Compound 13 (Yield: 65%) was synthesized in the same manner as the synthesis of Compound 1, except that 1 g of Intermediate 1-12 and 1.2 g of N-phenyl-4-(trimethylsilyl)aniline were used.

Synthesis Example 4

Synthesis of Compound 18

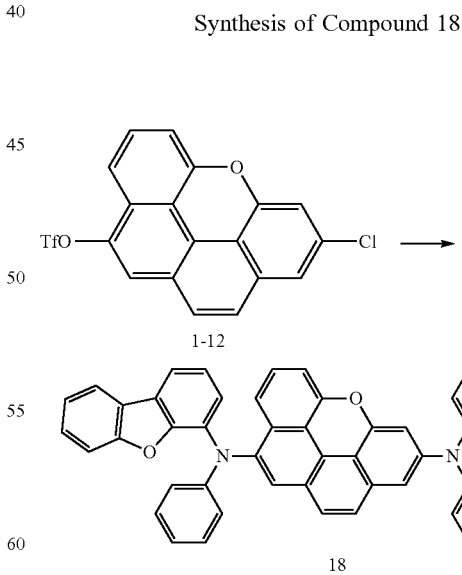

1.4 g of Compound 18 (Yield: 78%) was synthesized in the same manner as the synthesis of Compound 1, except that 1 g of Intermediate 1-12 and 1.3 g of N-phenyldibenzo[b,d]furan-4-amine were used.

Synthesis Example 5

Synthesis of Compound 19

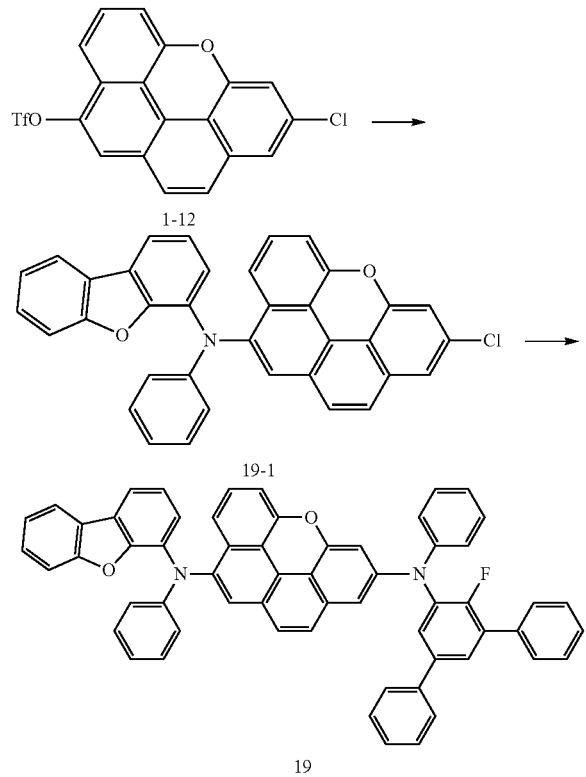

Synthesis of Intermediate 19-1

0.8 g of Intermediate 19-1 (Yield: 71%) was synthesized in the same manner as the synthesis of Compound 1, except that 1 g of Intermediate 1-12 and 0.6 g of N-phenyldibenzo[b,d]furan-4-amine were used. The produced compound was identified using LC-MS. ($C_{36}H_{20}ClNO_2$ M+ cal'd: 533.12 found 533.17)

Synthesis of Compound 19

1 g of Compound 19 (Yield: 79%) was synthesized in the same manner as the synthesis of Compound 1, except that 0.8 g of Intermediate 19-1 and 0.6 g of 4'-fluoro-N-phenyl-[1,1':3',1''-terphenyl]-5'-amine were used.

Synthesis Example 6

Synthesis of Compound 28

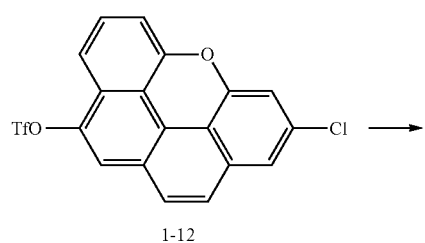

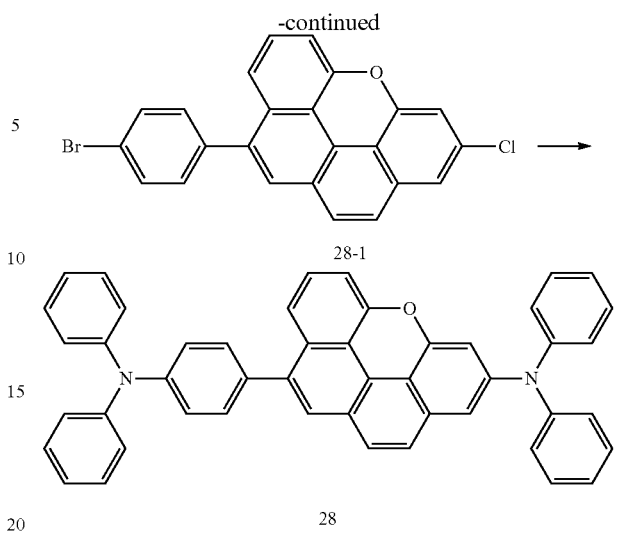

Synthesis of Intermediate 28-1

1.1 g of Compound 28-1 (Yield: 56%) was synthesized in the same manner as the synthesis of Intermediate 1-4, except that 2 g of Intermediate 1-12 and 0.45 g of (4-bromophenyl)boronic acid were used. The produced compound was identified using LC-MS. $C_{24}H_{12}BrClO$ M+ cal'd: 429.98 found 430.02)

Synthesis of Compound 28

1.4 g of Compound 28 (Yield: 83%) was synthesized in the same manner as the synthesis of Compound 1, except that 1.1 g of Intermediate 28-1 was used.

Synthesis Example 7

Synthesis of Compound 34

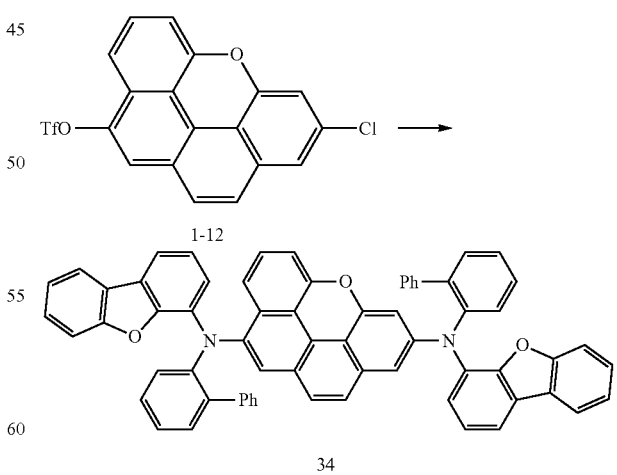

1.4 g of Compound 34 (Yield: 67%) was synthesized in the same manner as the synthesis of Compound 1, except that 1.1 g of Intermediate 28-1 and 1.7 g of N-([1,1'biphenyl]-2-yl)dibenzo[b,d]furan-4-amine were used.

Synthesis Example 8

Synthesis of Compound 38

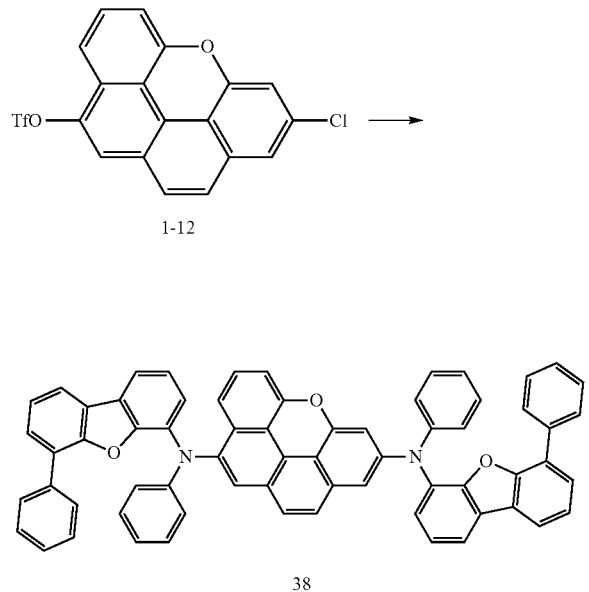

1.3 g of Compound 38 (Yield: 61%) was synthesized in the same manner as the synthesis of Compound 1, except that 1.1 g of Intermediate 28-1 and 1.7 g of N,6-diphenyldibenzo[b,d]furan-4-amine were used.

Synthesis Example 9

Synthesis of Compound 83

1.2 g of Compound 83 (Yield: 87%) was synthesized in the same manner as the synthesis of Compound 1, except that 1 g of Intermediate 19-1 and 0.5 g of 4'-fluoro-N-phenyl-[1,1':3',1''-terphenyl]-5'-amine were used.

Spectral data of the synthesized compounds are shown in Table 1 below.

TABLE 1

| Compound | $^1$H NMR (CDCl$_3$, 400 MHz) | LC/MS found | LC/MS calc. |
|---|---|---|---|
| 1 | 7.74(d, 1H), 7.60(d, 1H), 7.48(dd, 1H), 7.37(t, 1H), 7.30(dd, 1H), 7.10-7.02(m, 9H) 6.66-6.59(m, 6H), 6.33-6.27(m, 4H), 6.15-6.05(m, 4H) | 576.25 | 576.22 |
| 7 | 7.91(dd, 1H), 7.76(d, 1H), 7.65(d, 1H), 7.60-7.43(m, 6H), 7.40(t, 1H), 7.20-7.11(m, 4H) 7.08-6.95(m, 6H), 6.85-6.78(m, 3H), 6.66-6.58(m, 3H), 6.55(dd, 1H), 6.48(d, 1H), 6.18-6.12(m, 4H), 5.99-5.94(m, 4H) | 728.24 | 728.28 |
| 13 | 7.74(d, 1H), 7.60(d, 1H), 7.47(dd, 1H), 7.42-7.34(m, 5H), 7.35(dd, 1H), 7.24(d, 1H), 7.10-7.01(m, 4H), 6.72-6.59(m, 4H), 6.55(m, 4H), 6.35-6.33(m, 2H), 6.20-6.14(m, 2H), 0.22(s, 18H) | 720.37 | 720.30 |
| 18 | 7.83-7.76(m, 3H), 7.77-7.62(m, 4H), 7.51-7.35(m, 6H), 7.16(d, 1H) 7.09-6.92(m, 5H), 6.76(dd, 1H), 6.66-6.58(m, 4H), 6.35-6.31(m, 4H), 6.24-6.19(m, 4H) | 756.29 | 756.24 |
| 19 | 7.83(dd, 1H), 7.76(d, 1H), 7.70-7.58(m, 5H), 7.55-7.38(m, 7H), 7.30(dd, 2H), 7.16-6.91(m, 6H), 6.89(dd, 2H), 6.69(dd, 1H), 6.65-6.59(m, 4H), 6.36-6.25(m, 4H), 6.20-6.18(m, 4H) | 836.21 | 836.28 |
| 28 | 8.33(s, 1H), 8.18(d, 1H), 7.71(d, 1H) 7.64(d, 1H), 7.56(t, 1H), 7.51-7.46(m, 4H), 7.37(d, 1H), 7.10-7.00(m, 6H) 6.95-6.92(m, 4H), 6.66-6.61(m, 4H), 6.31-6.24(m, 4H), 6.18-6.13(m, 4H) | 652.28 | 652.25 |
| 34 | 7.84-7.80(m, 4H), 7.73-7.63(m, 4H), 7.61-7.53(m, 6H), 7.48m, (1H), 7.43-7.37(m, 4H), 7.30(dd, 2H), 7.28(d, 1H), 7.21(d, 1H), 7.18(t, 1H), 7.17-7.11(m, 4H), 7.18(dd, 1H), 7.08(d, 1H), 7.05(d, 1H), 7.03(d, 1H), 7.01-6.87(m, 6H)6.59(m, 2H) | 903.31 | 908.30 |
| 38 | 7.85-7.78(m, 2H), 7.77(d, 1H), 7.74(d, 1H), 7.68-7.62(m, 3H), 7.51(m, 1H), 7.40-7.31(m, 6H), 7.25-7.21(m, 4H), 7.10-7.02(m, 4H), 6.99(m, 2H) 6.96(d, 1H), 6.92(d, 1H), 6.85(d, 1H), 6.76(m, 1H), 6.65-6.60(m, 4H), 6.36-6.33(m, 4H), 6.23-6.15(m, 4H) | 908.39 | 908.30 |
| 83 | 7.83-7.81(m, 2H), 7.75(dd, 1H), 7.72-7.65(m, 3H), 7.58-7.55(m, 3H), 7.50-7.43(m, 5H), 7.43-7.37(m, 2H), 7.19-7.15(m, 2H), 7.08-6.93(m, 9H), 6.85-6.75(m, 2H), 6.65-6.60(m, 4H), 6.55(d, 1H) | 742.23 | 742.26 |

Example 1

An anode was prepared by cutting a Corning 15 Ω/cm² (1,200 Å) ITO glass substrate to a size of 50 mm×50 mm×0.7 mm, ultrasonically cleaning the glass substrate using isopropyl alcohol and pure water for five minutes each, and then irradiating UV light for 30 minutes and exposing to ozone to clean. Then, the glass substrate was disposed in a vacuum deposition apparatus.

Then, 2-TNATA, which is a material for forming an HIL, was vacuum deposited on the glass substrate to form an HIL having a thickness of 600 Å, and then 4,4'-bis[N-(1-naphthyl)-N-phenylamino]biphenyl (NPB), as a hole transporting compound, was vacuum deposited on the HIL to form an HTL having a thickness of 300 Å.

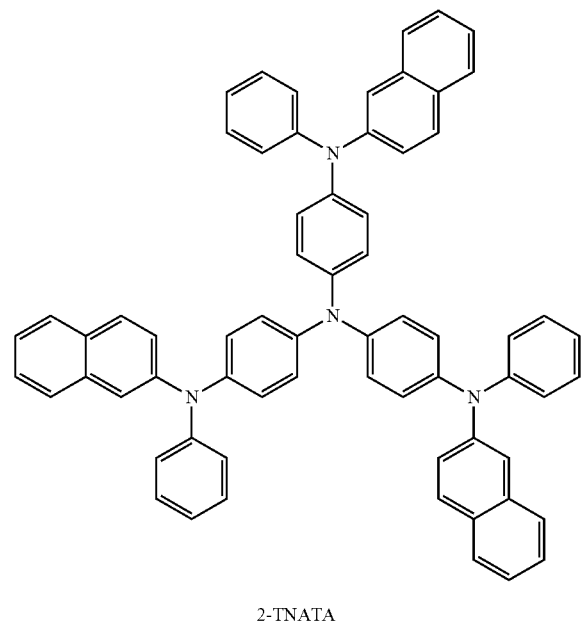

2-TNATA

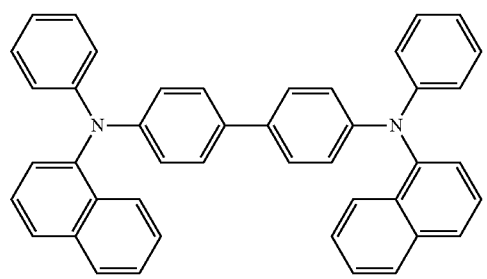

NPB

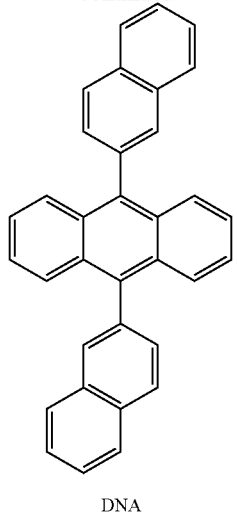

DNA

Then, 9,10-di-naphthalene-2-yl-anthracene (DNA), as a blue fluorescent host, and Compound 1 according to an embodiment, as a blue fluorescent dopant, were co-deposited with a weight ratio of 98:2 on the HTL to form an EML having a thickness of 300 Å.

Then, Alq₃ was deposited on the EML to form an ETL having a thickness of 300 Å, and then LiF, which is a halogenated alkali metal, was deposited on the ETL to form an EIL having a thickness of 10 Å. Then, Al was vacuum deposited on the EIL to form a cathode having a thickness of 3,000 Å, thereby forming an LiF/Al electrode. As a result, an organic light-emitting device was manufactured.

Example 2

An organic light-emitting device was manufactured in the same manner as in Example 1, except that Compound 7 was used to form the EML instead of Compound 1.

Example 3

An organic light-emitting device was manufactured in the same manner as in Example 1, except that Compound 13 was used to form the EML instead of Compound 1.

Example 4

An organic light-emitting device was manufactured in the same manner as in Example 1, except that Compound 18 was used to form the EML instead of Compound 1.

Example 5

An organic light-emitting device was manufactured in the same manner as in Example 1, except that Compound 19 was used to form the EML instead of Compound 1.

Example 6

An organic light-emitting device was manufactured in the same manner as in Example 1, except that Compound 28 was used to form the EML instead of Compound 1.

Example 7

An organic light-emitting device was manufactured in the same manner as in Example 1, except that Compound 34 was used to form the EML instead of Compound 1.

Example 8

An organic light-emitting device was manufactured in the same manner as in Example 1, except that Compound 38 was used to form the EML instead of Compound 1.

Example 9

An organic light-emitting device was manufactured in the same manner as in Example 1, except that Compound 83 was used to form the EML instead of Compound 1.

Comparative Example 1

An organic light-emitting device was manufactured in the same manner as in Example 1, except that N,N,N',N'-tetraphenyl-pyrene-1,6-diamine (Compound A), which is a blue fluorescent dopant, was used when forming the EML, instead of Compound 1.

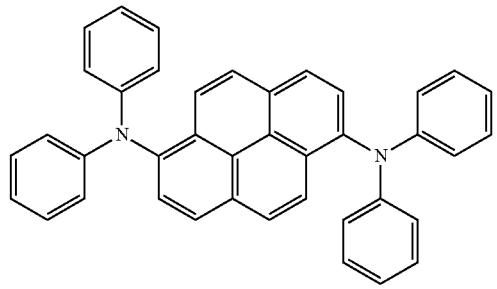

A

When the compounds having the structure of Formula 1 according to the embodiments were used as a dopant material of a blue emission layer, driving voltage was reduced and efficiency was considerably improved, thereby having excellent I-V-L characteristics, compared to N,N,N',N'-tetraphenyl-pyrene-1,6-diamine (Compound A), as a comparative material, and lifespan was considerably increased. Characteristics and lifespan test results are shown in Table 2 below.

As described above, according to the one or more of the above embodiments, the compound of Formula 1 may efficiently be used as a dopant material with excellent light emitting characteristics and stability. By using the compound of Formula 1, an organic light-emitting device having high efficiency, low driving voltage, high brightness, and long lifespan may be manufactured.

The embodiments may provide a material having excellent electrical stability, higher charge transporting ability, or higher light-emitting capability, and higher glass transition temperature (compared to other organic single-molecule substances) and may be capable of preventing crystallization.

The embodiments may provide compounds suitable for an all color fluorescent or phosphorescent device such as red, green, blue, and white devices having excellent electrical properties, high charge transporting capability, light-emitting capability and high glass transition temperature, and capable of preventing crystallization, and organic light-emitting devices including the same and having high luminous efficiency, low driving voltage, high brightness, and long lifespan.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound represented by Formula 1, below:

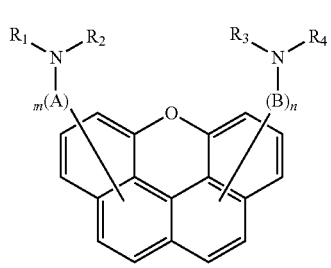

Formula 1

TABLE 2

| | Material | Driving voltage (V) | Current density (mA/cm$^2$) | Brightness (cd/m$^2$) | Efficiency (cd/A) | Color | Half-life span (hr @ 100 mA/cm$^2$) |
|---|---|---|---|---|---|---|---|
| Example 1 | Compound 1 | 6.89 | 50 | 3725 | 7.45 | blue | 280 |
| Example 2 | Compound 7 | 6.92 | 50 | 3980 | 8.06 | blue | 269 |
| Example 3 | Compound 13 | 6.78 | 50 | 4025 | 8.15 | blue | 272 |
| Example 4 | Compound 18 | 6.81 | 50 | 4020 | 8.04 | blue | 262 |
| Example 5 | Compound 19 | 6.69 | 50 | 4005 | 8.01 | blue | 268 |
| Example 6 | Compound 28 | 6.79 | 50 | 3700 | 7.46 | blue | 246 |
| Example 7 | Compound 34 | 6.83 | 50 | 4210 | 8.42 | blue | 276 |
| Example 8 | Compound 38 | 6.86 | 50 | 4065 | 8.13 | blue | 267 |
| Example 9 | Compound 83 | 6.88 | 50 | 4030 | 8.06 | blue | 257 |
| Comparative Example 1 | Compound A | 7.01 | 50 | 2645 | 5.29 | blue | 258 | wherein $R_1$ to $R_4$ are each independently a substituted or unsubstituted $C_6$-$C_{60}$ aryl group, a substituted or unsubstituted $C_1$-$C_{60}$ heteroaryl group, or a substituted or unsubstituted $C_6$-$C_{60}$ condensed polycyclic group, A and B are each independently a substituted or unsubstituted $C_6$-$C_{60}$ arylene group or a substituted or unsubstituted $C_1$-$C_{60}$ heteroarylene group, and m and n are each independently an integer of 0 or 1.

2. The compound as claimed in claim 1, wherein $R_1$ to $R_4$ are each independently selected from the group of moieties represented by Formulae 2a to 2d below:

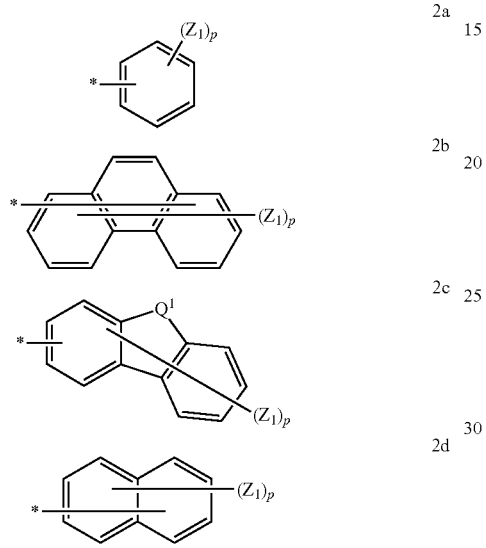

wherein $Q_1$ is —$C(R_{31})(R_{32})$—, —S—, or —O—;

$Z_1$, $R_{31}$, and $R_{32}$ are each independently, a hydrogen atom, a deuterium atom, a substituted or unsubstituted $C_1$-$C_{20}$ alkyl group, a $C_1$-$C_{20}$ alkylsilyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen-containing group, a cyano group, a nitro group, a hydroxyl group, or a carboxyl group;

P is an integer of 1 to 9; and

* is a binding site.

3. The compound as claimed in claim 1, wherein A and B are each independently a moiety represented by Formula 3a below:

wherein $Z_1$ is a hydrogen atom, a deuterium atom, a substituted or unsubstituted $C_1$-$C_{20}$ alkyl group, a substituted or unsubstituted $C_6$-$C_{20}$ aryl group, a substituted or unsubstituted $C_1$-$C_{20}$ heteroaryl group, a substituted or unsubstituted $C_6$-$C_{20}$ condensed polycyclic group, a halogen-containing group, a cyano group, a nitro group, a hydroxyl group, or a carboxyl group;

P is an integer of 1 to 4; and

* is a binding site.

4. The compound as claimed in claim 1, wherein the compound represented by Formula 1 is represented by Formula 2 below:

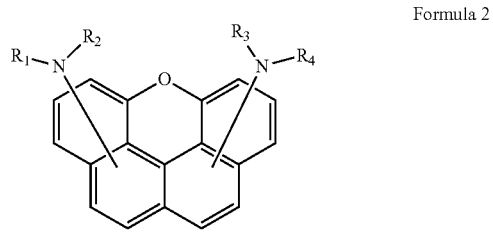

wherein $R_1$ to $R_4$ are each independently a substituted or unsubstituted $C_6$-$C_{60}$ aryl group, a substituted or unsubstituted $C_1$-$C_{60}$ heteroaryl group, or a substituted or unsubstituted $C_6$-$C_{60}$ condensed polycyclic group.

5. The compound as claimed in claim 1, wherein the compound represented by Formula 1 is represented by Formula 3 below:

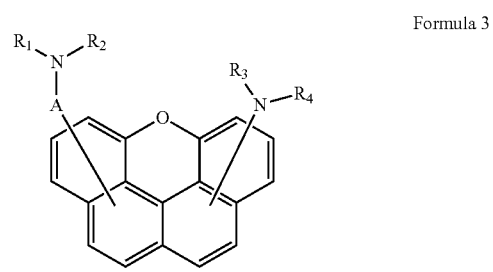

wherein:

$R_1$ to $R_4$ are each independently a substituted or unsubstituted $C_6$-$C_{60}$ aryl group, a substituted or unsubstituted $C_1$-$C_{60}$ heteroaryl group, or a substituted or unsubstituted $C_6$-$C_{60}$ condensed polycyclic group, and A is a substituted or unsubstituted $C_6$-$C_{60}$ arylene group or a substituted or unsubstituted $C_1$-$C_{60}$ heteroarylene group.

6. The compound as claimed in claim 1, wherein the compound represented by Formula 1 is represented by Formula 4 below:

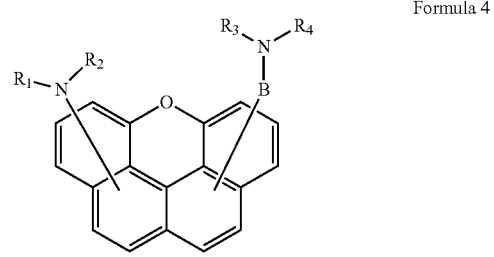

wherein:

$R_1$ to $R_4$ are each independently a substituted or unsubstituted $C_6$-$C_{60}$ aryl group, a substituted or unsubstituted $C_1$-$C_{60}$ heteroaryl group, or a substituted or unsubstituted $C_6$-$C_{60}$ condensed polycyclic group, and B is a substituted or unsubstituted $C_6$-$C_{60}$ arylene group or a substituted or unsubstituted $C_1$-$C_{60}$ heteroarylene group.

7. The compound as claimed in claim 1, wherein the compound represented by Formula 1 is represented by Formula 5 below:

Formula 5

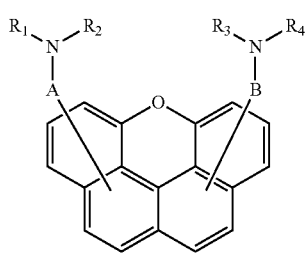

wherein:

R$_1$ to R$_4$ are each independently a substituted or unsubstituted C$_6$-C$_{60}$ aryl group, a substituted or unsubstituted C$_1$-C$_{60}$ heteroaryl group, or a substituted or unsubstituted C$_6$-C$_{60}$ condensed polycyclic group, and A and B are each independently a substituted or unsubstituted C$_6$-C$_{60}$ arylene group or a substituted or unsubstituted C$_1$-C$_{60}$ heteroarylene group.

8. The compound as claimed in claim 1, wherein the compound represented by Formula 1 is one of the following Compounds 1-102:

1

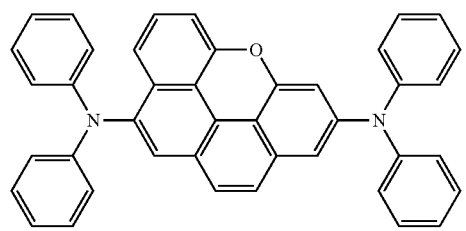

2

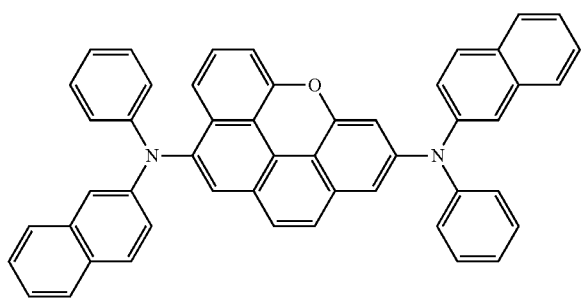

3

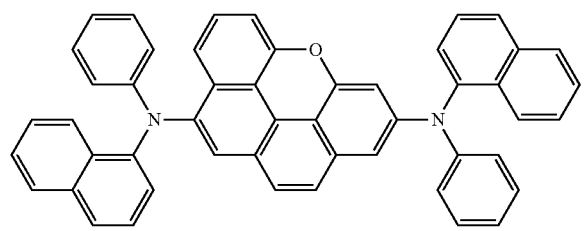

4

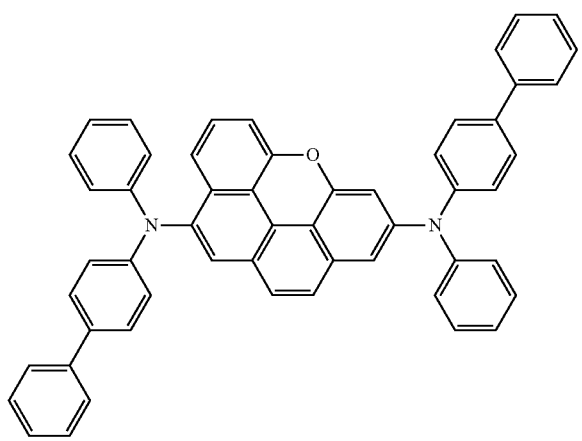

5

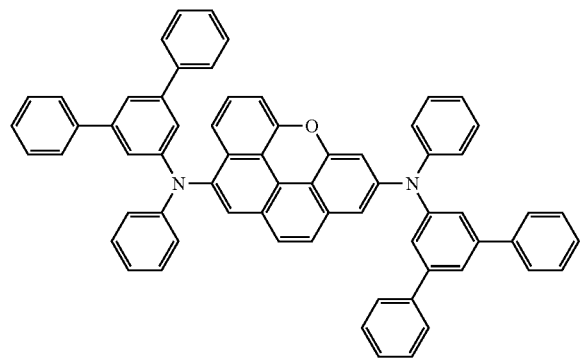

6

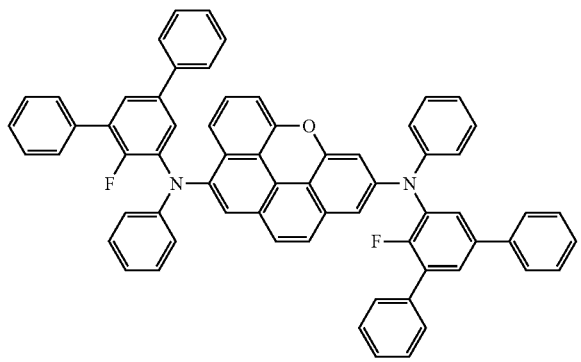

-continued
7
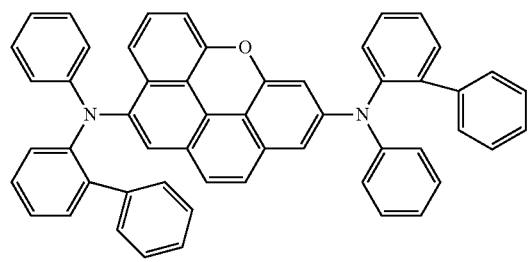
8
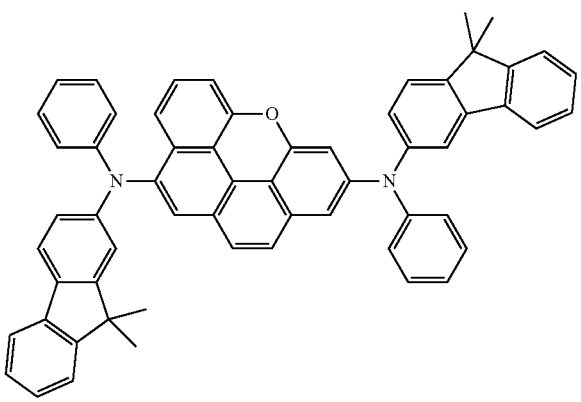
9
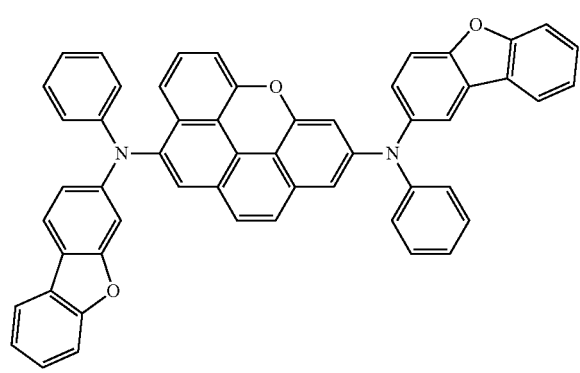
10
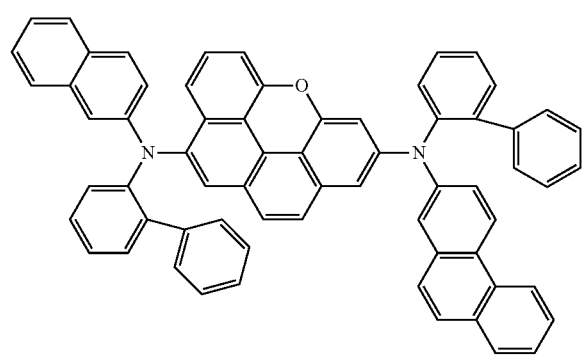
11
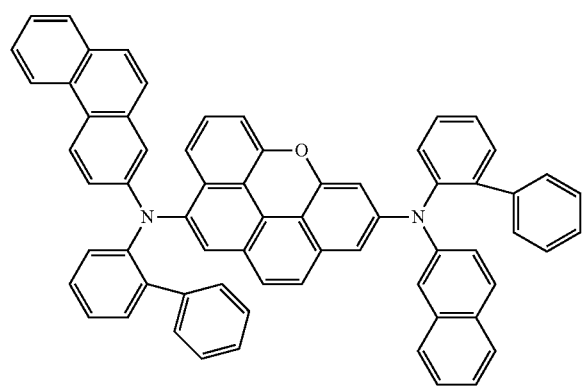
12
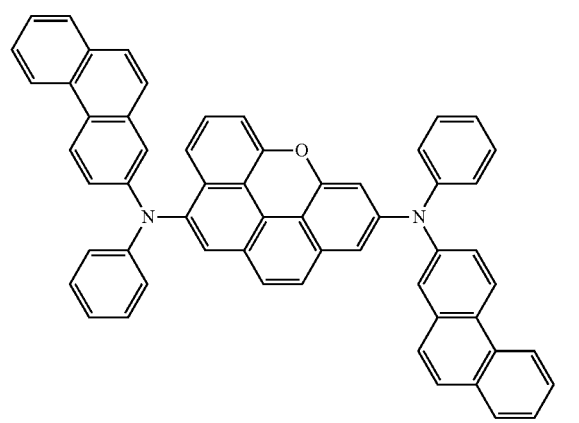
13
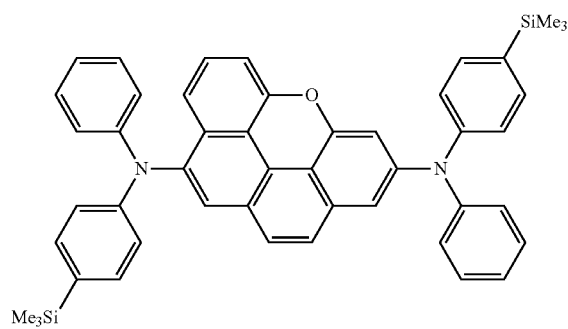
14
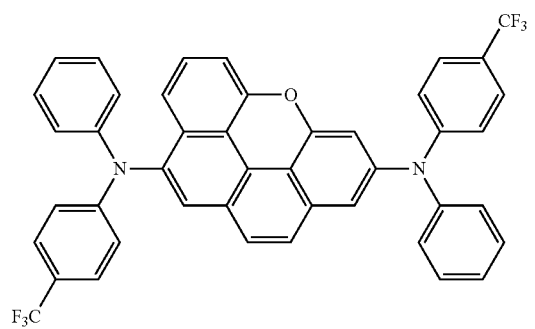

-continued
15
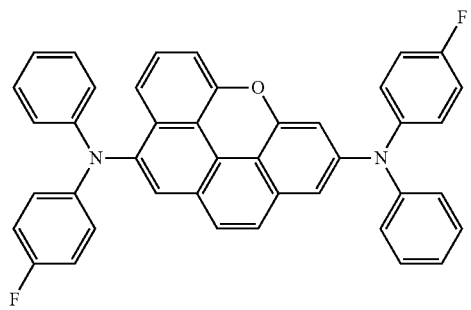
16
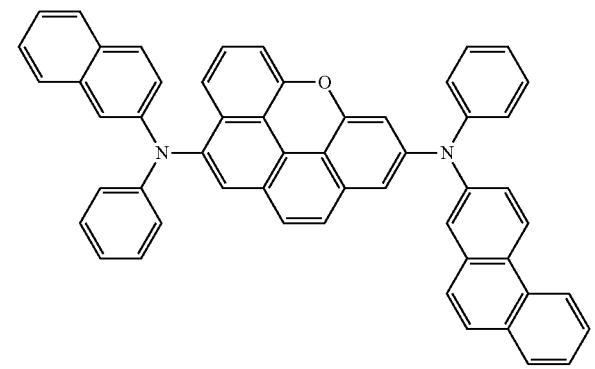
17
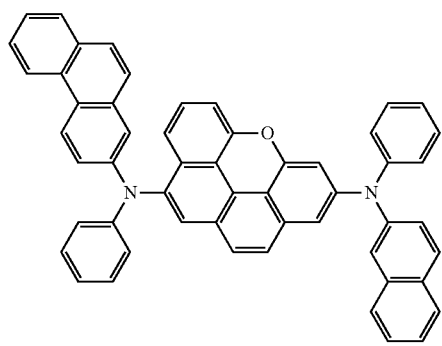
18
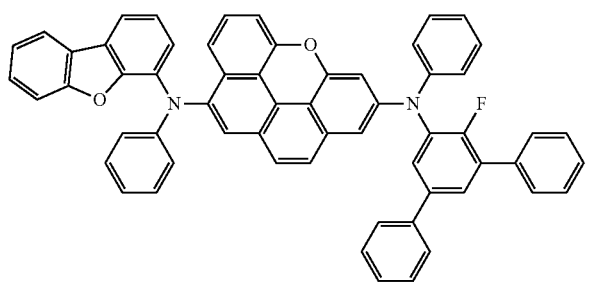
19
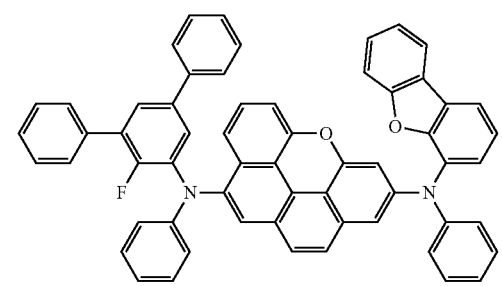
20
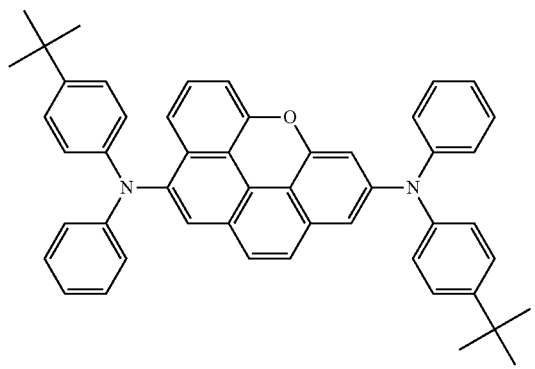
21
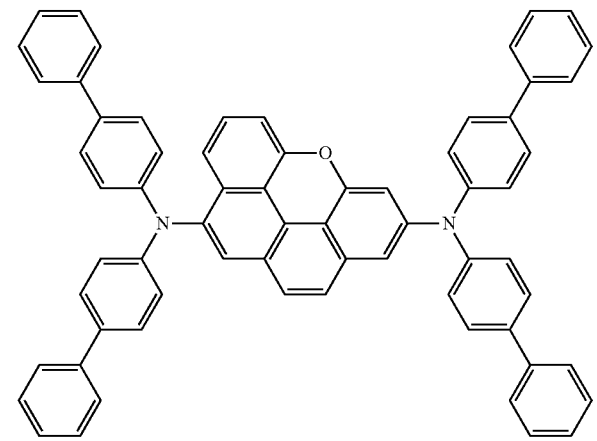
22

-continued
23
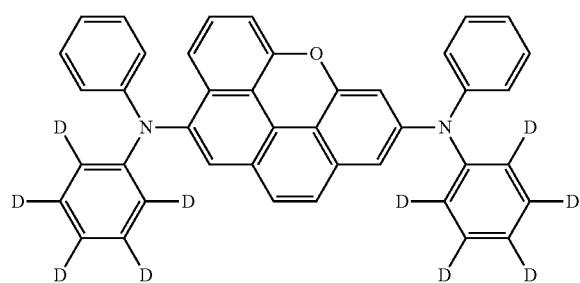
24
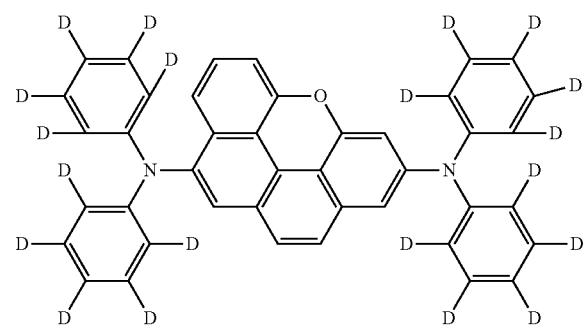
25
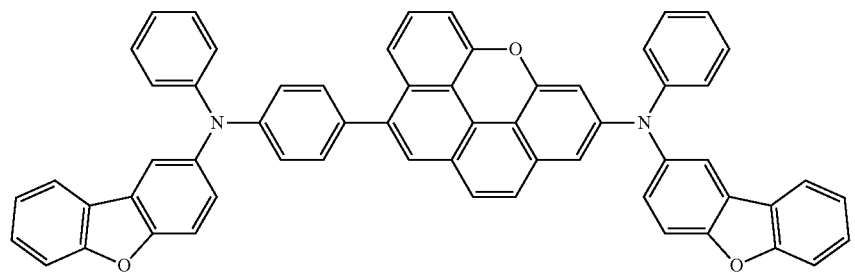
26
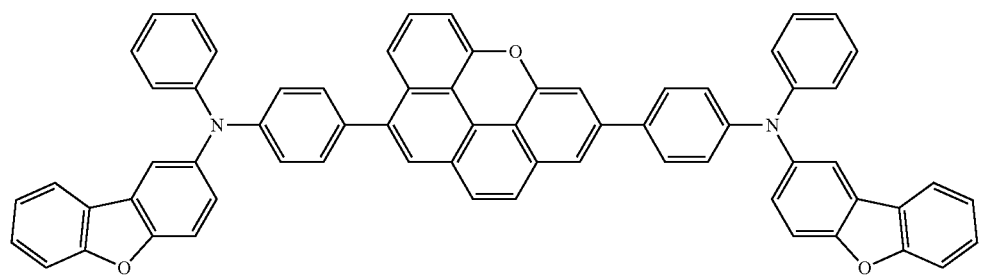
27
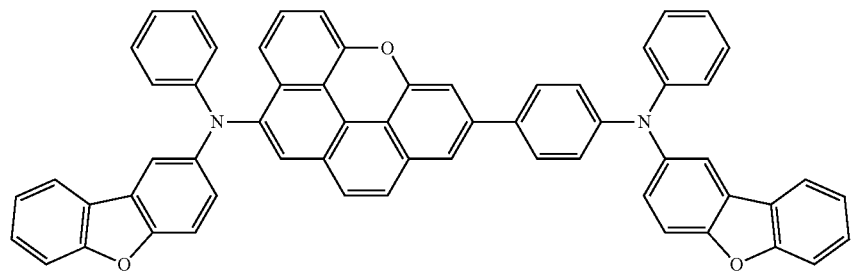
28
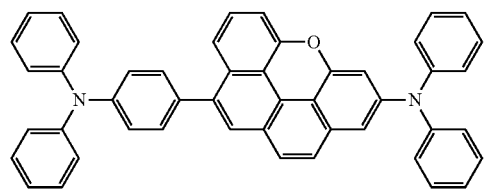
29
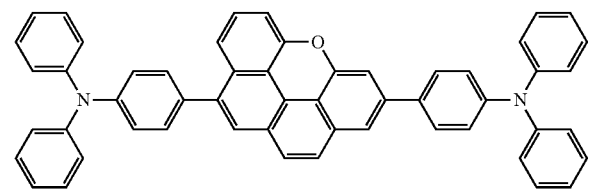
30
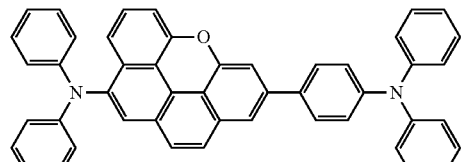
31
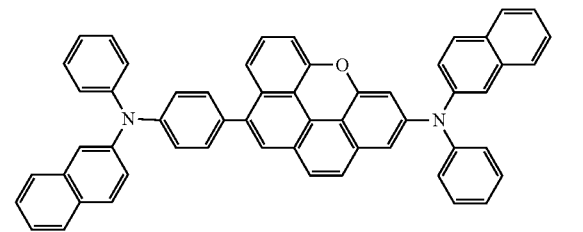

-continued
32
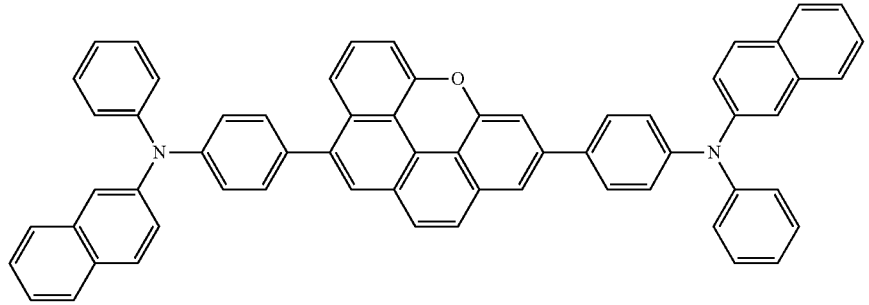
33
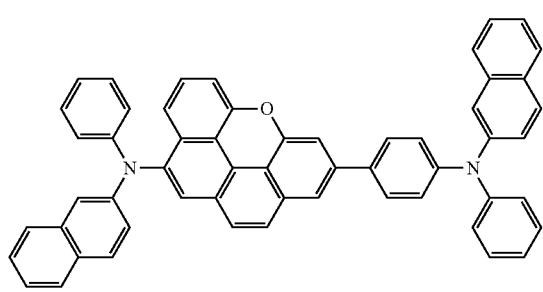
34
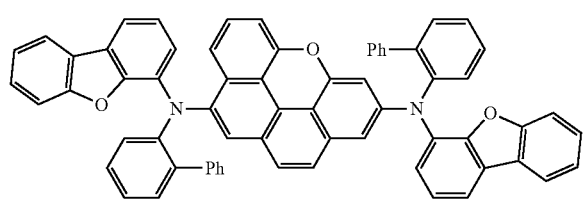
35
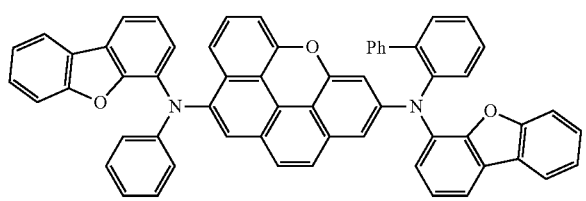
36
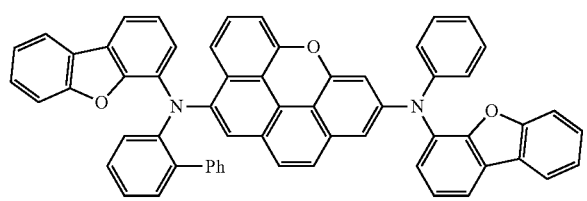
37
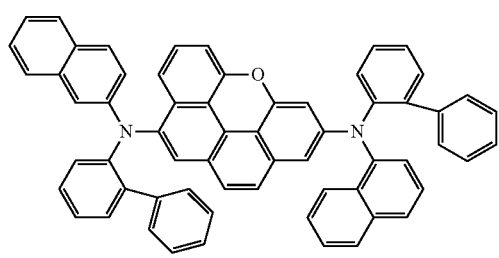
38
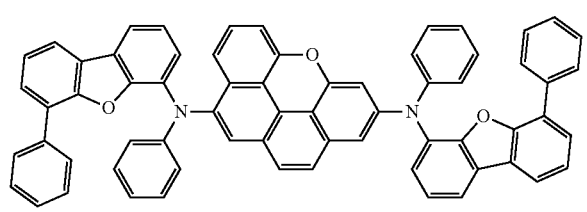
39
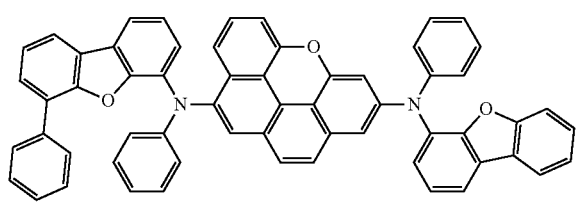
40
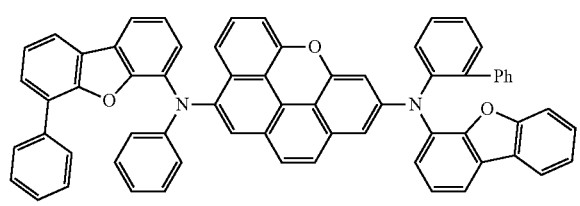
41
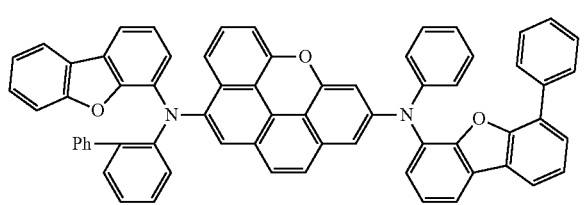
42
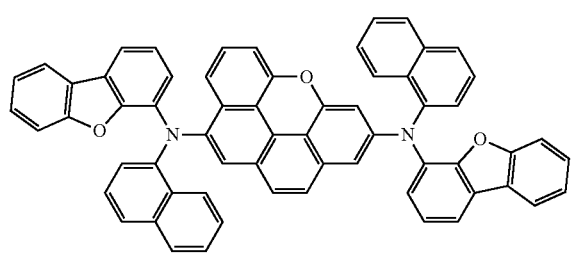

-continued
43
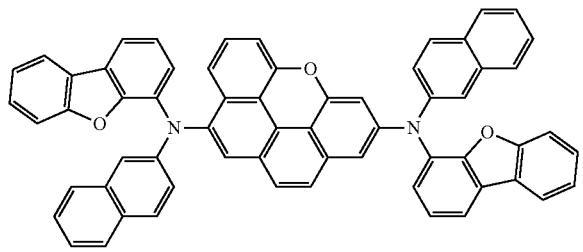
44
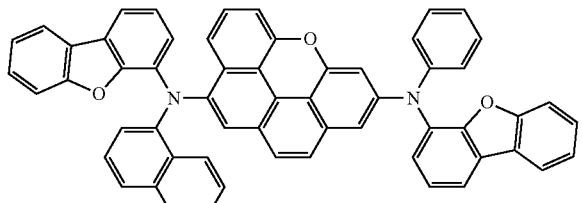
45
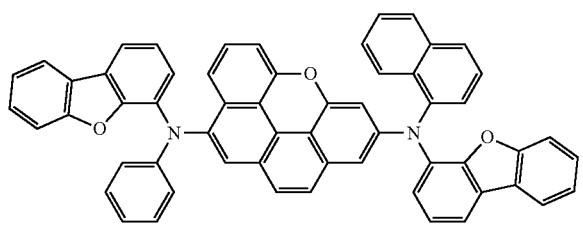
46
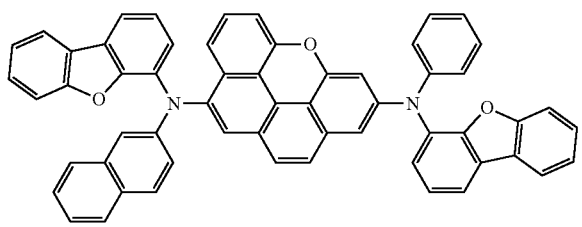
47
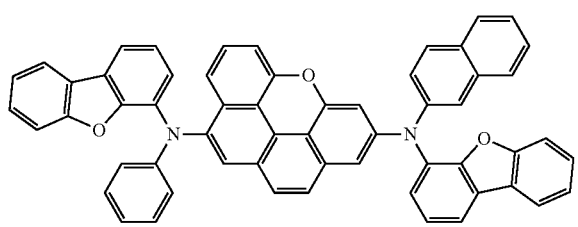
48
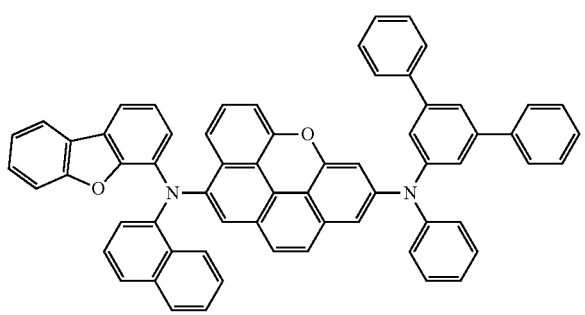
49
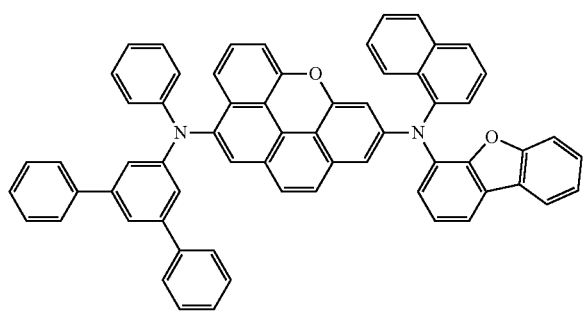
50
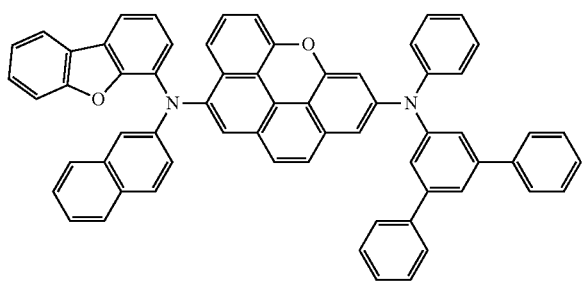
51
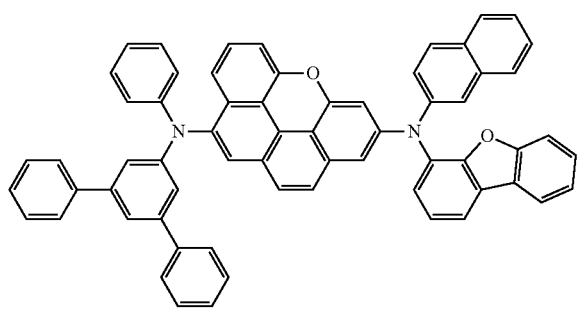
52
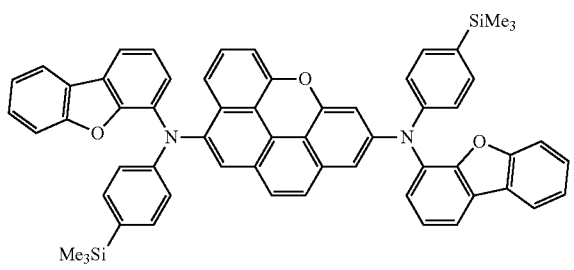

-continued
53
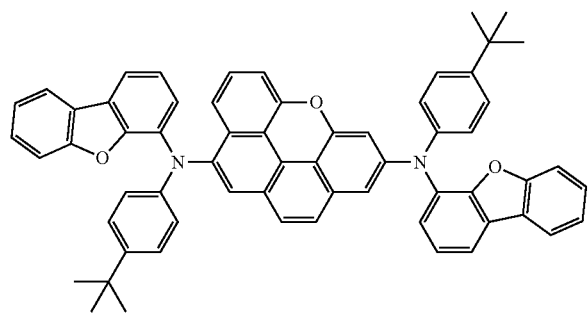
54
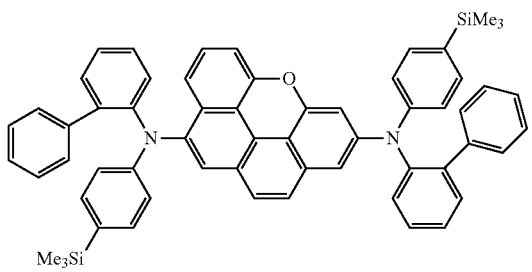
55
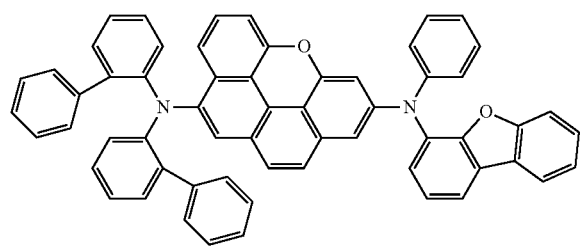
56
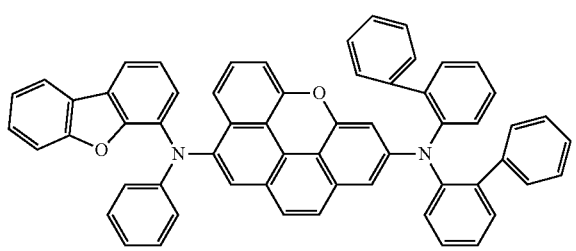
57
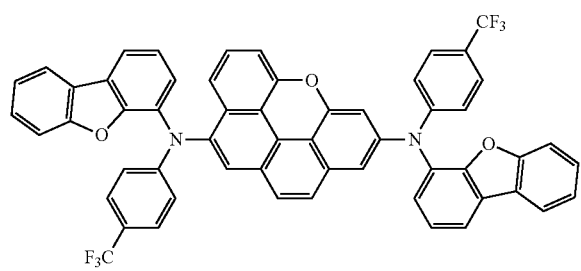
58
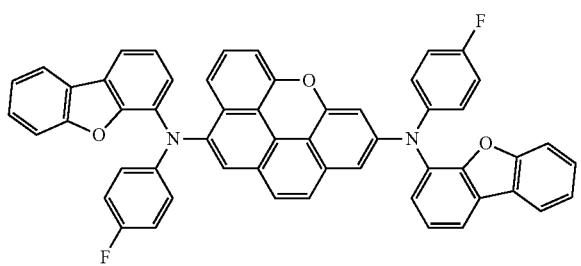
59
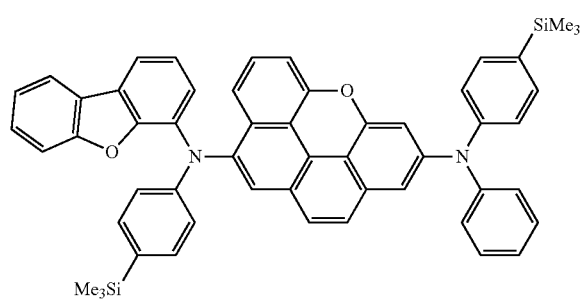
60
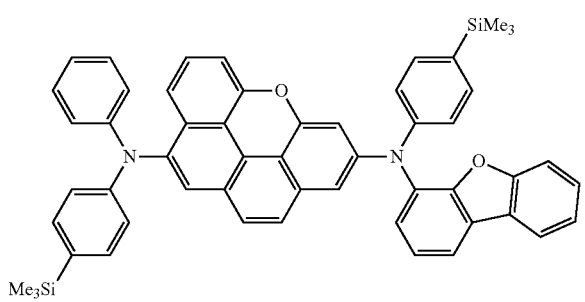
61
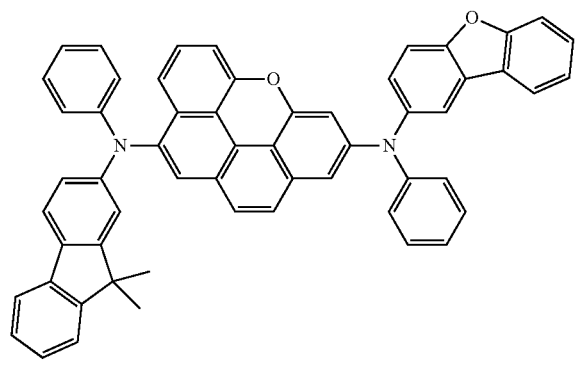
62
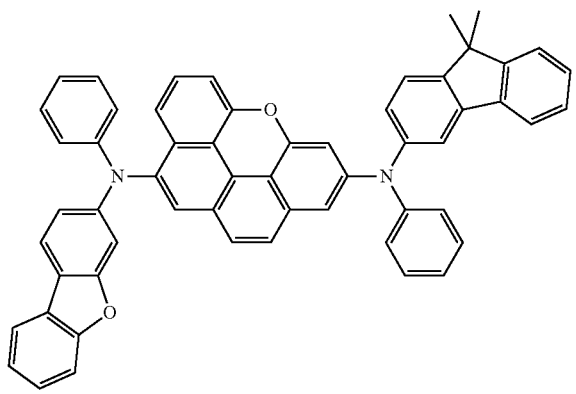

-continued
63
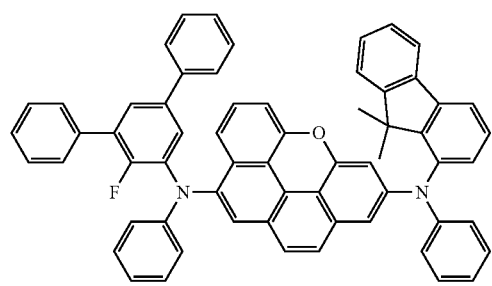
64
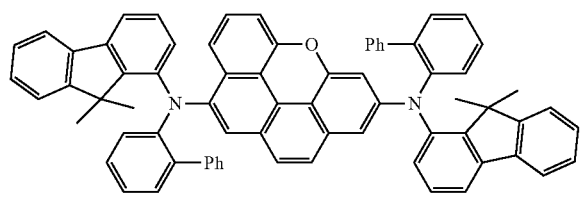
65
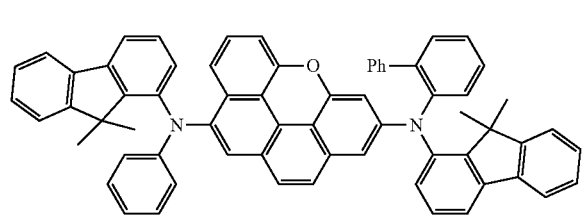
66
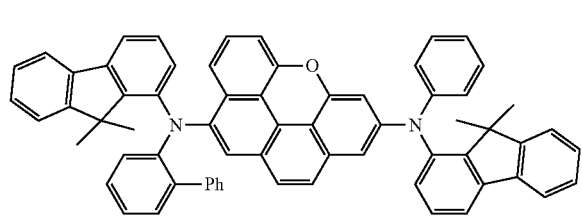
67
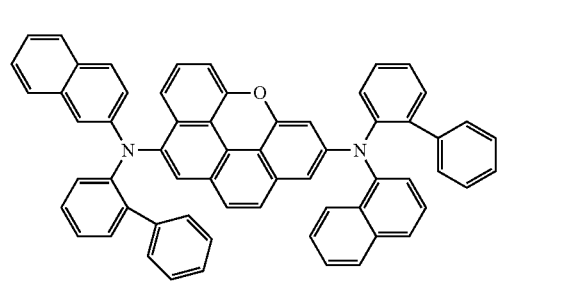
68
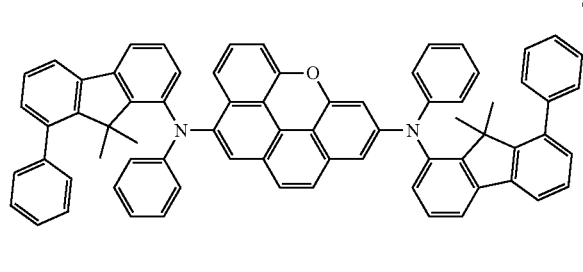
69
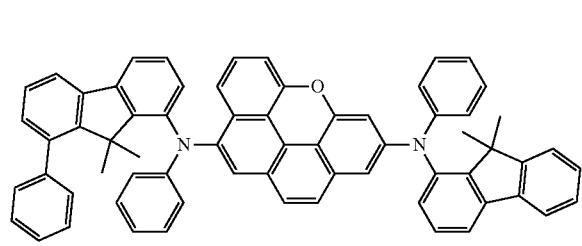
70
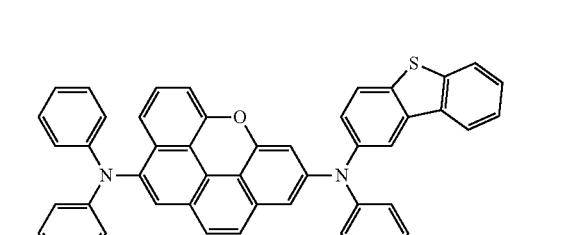
71
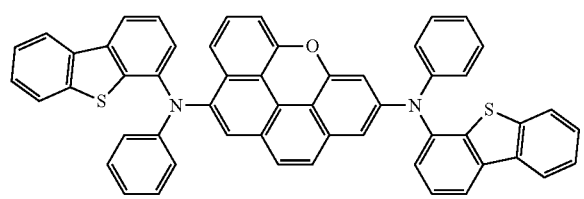
72
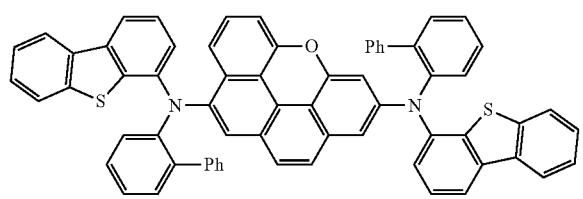
73
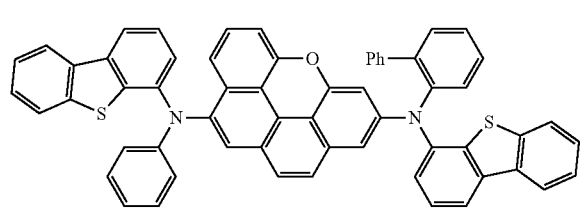
74
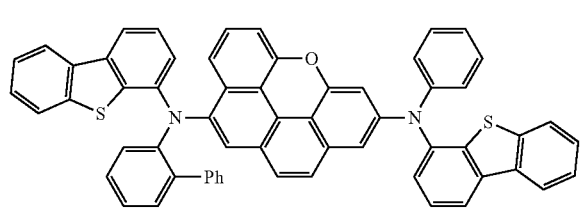

-continued
75
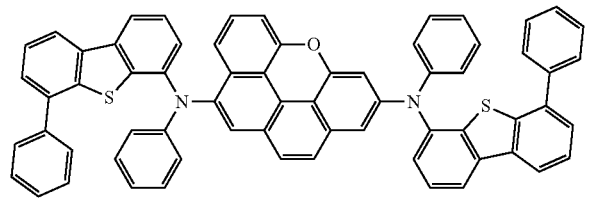
76
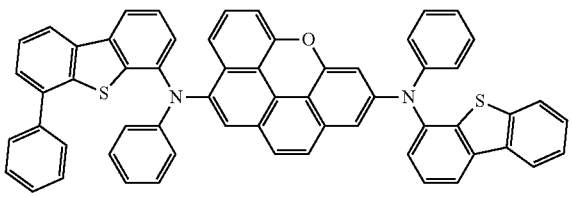
77
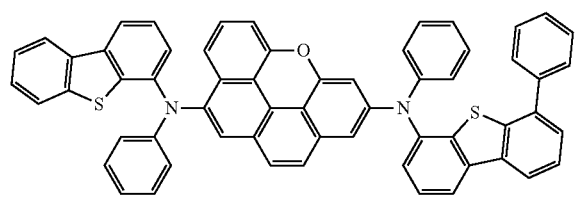
78
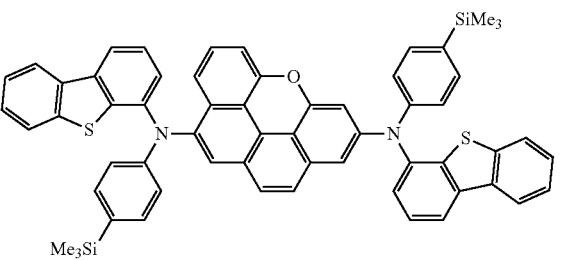
79
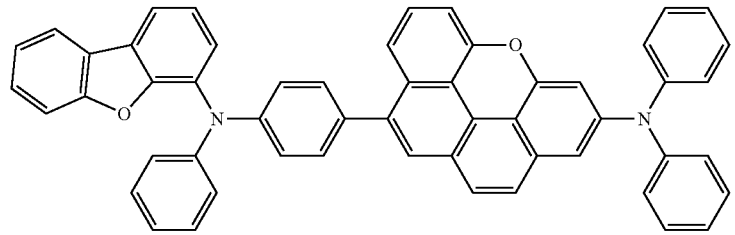
80
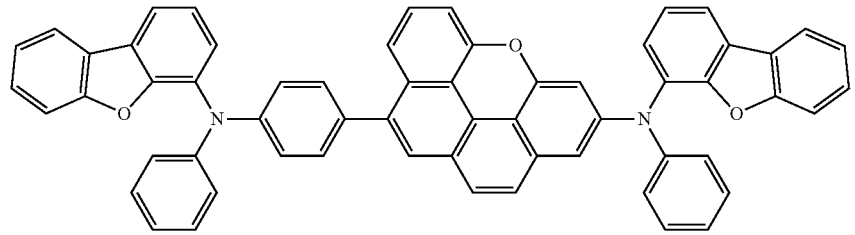
81
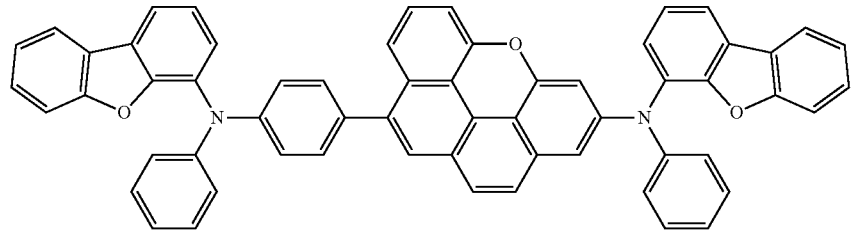
82
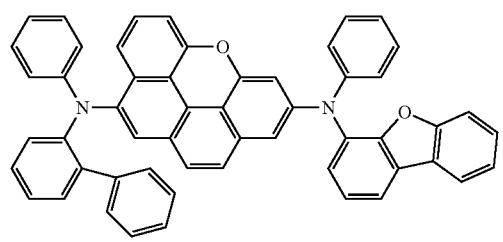
83
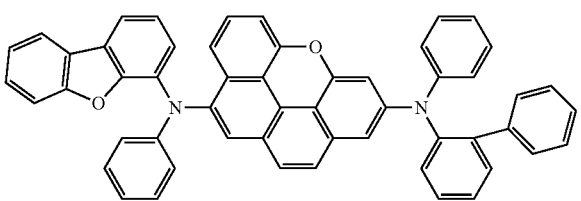

-continued
84
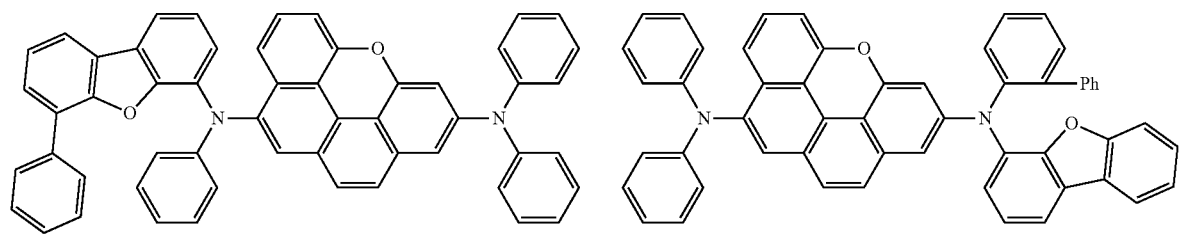
85
86
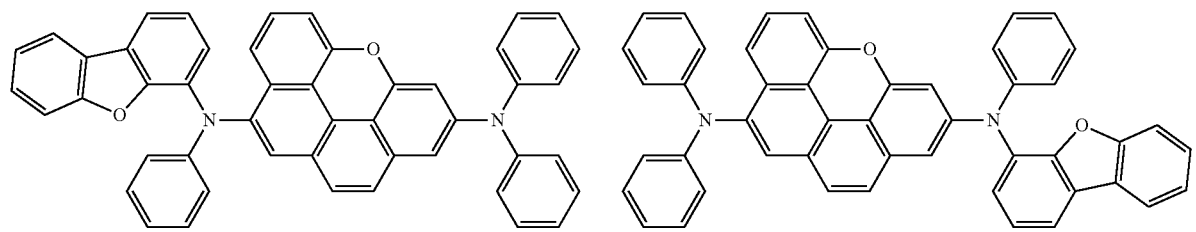
87
88
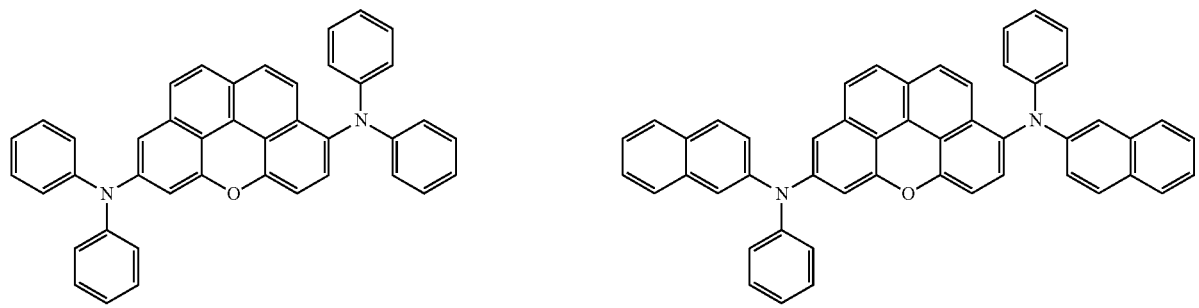
89
90
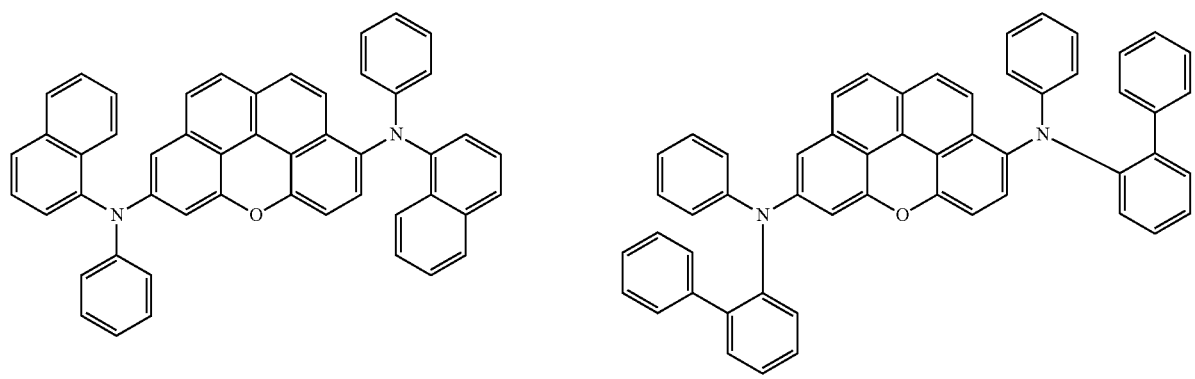
91
92
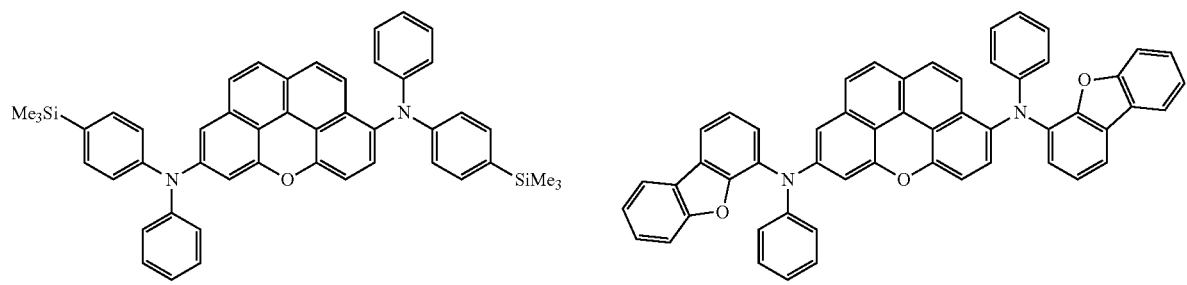
93

-continued
94
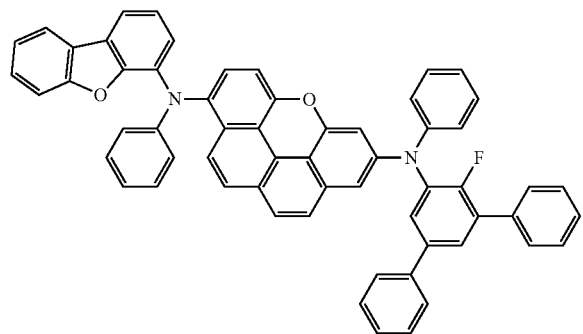
95
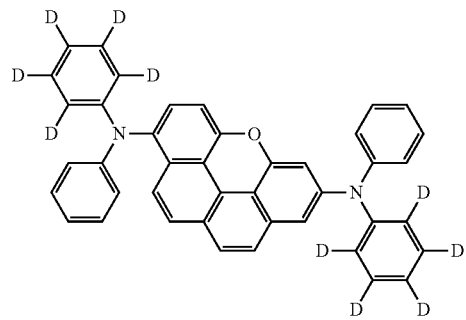
96
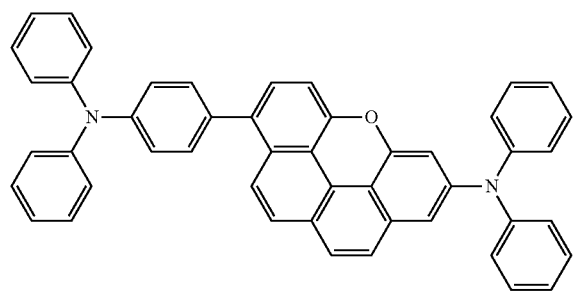
97
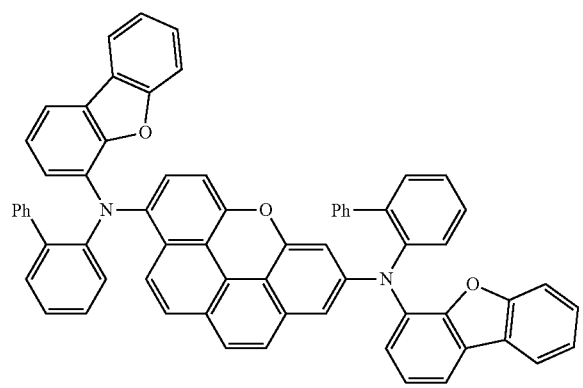
98
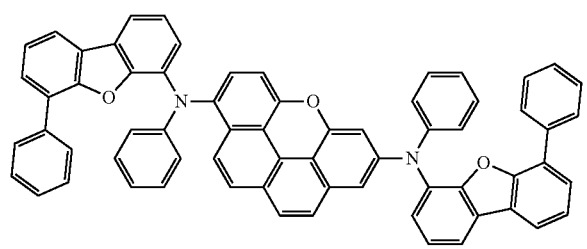
99
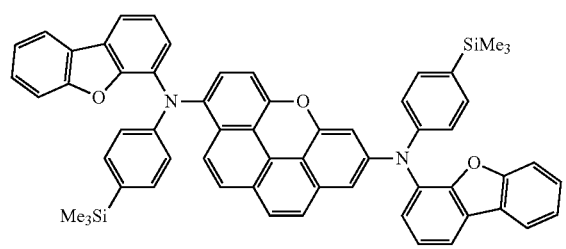
100
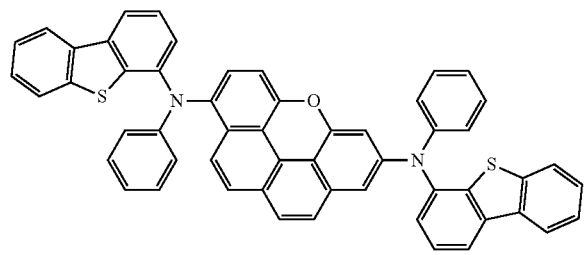
101
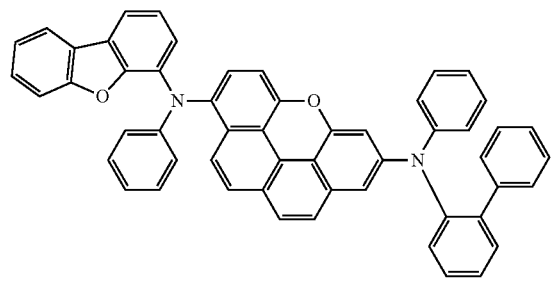

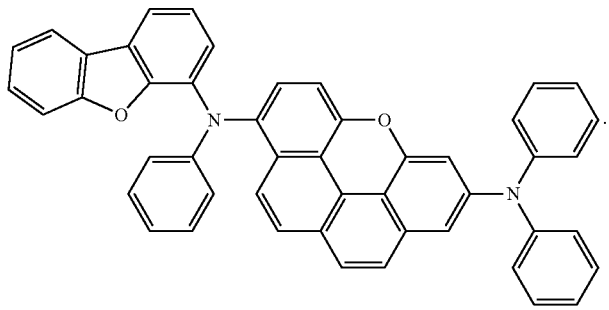

9. The compound as claimed in claim 1, wherein the compound is represented by Formula 1-a below,

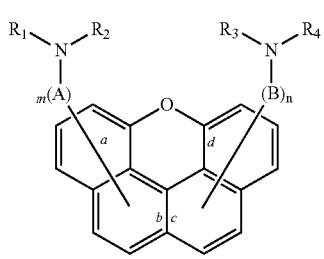

Formula 1-a wherein, a first aryl group includes the moiety -(A)$_m$NR$_1$R$_2$ and a second aryl group includes the moiety -(B)$_n$NR$_3$R$_4$,
the first aryl group is bonded to ring a or ring b,
when the first aryl group is bonded to ring a, the second aryl group is bonded to ring c, and
when the first aryl group is bonded to ring b, the second aryl group is bonded to ring d.

10. An organic light-emitting device, comprising:
a first electrode;
a second electrode; and
an organic layer between the first electrode and second electrode,
wherein the organic layer includes the compound as claimed in claim 1.

11. The organic light-emitting device as claimed in claim 10, wherein the organic layer includes an emission layer.

12. The organic light-emitting device as claimed in claim 10, wherein the organic layer includes an emission layer, and the compound is a dopant.

13. The organic light-emitting device as claimed in claim 10, wherein the organic layer includes an emission layer, and the compound is a blue fluorescent dopant.

14. The organic light-emitting device as claimed in claim 10, wherein:
the organic layer includes an emission layer, and further includes at least one of an electron injection layer, an electron transport layer, a functional layer having both electron injecting and electron transporting capabilities, a hole injection layer, a hole transport layer, or a functional layer having both hole injecting and hole transporting capabilities, and
the emission layer includes an anthracene-based compound, arylamine-based compound, or a styryl-based compound.

15. The organic light-emitting device as claimed in claim 10, wherein:
the organic layer includes an emission layer, and further includes at least one of an electron injection layer, an electron transport layer, a functional layer having both electron injecting and electron transporting capabilities, a hole injection layer, a hole transport layer, or a functional layer having both hole injecting and hole transporting capabilities, and
a red layer, a green layer, a blue layer, or a white layer of the emission layer includes a phosphorescent compound.

16. The organic light-emitting device as claimed in claim 10, wherein the organic layer is formed by a wet process.

17. A flat panel display device comprising the organic light-emitting device of claim 10, wherein the first electrode of the organic light-emitting device is electrically connected to a source electrode or a drain electrode of a thin-film transistor.

18. The organic light-emitting device as claimed in claim 10, wherein the organic layer includes an electron transport layer, the electron transport layer including a metal complex.

19. The organic light-emitting device as claimed in claim 18, wherein the metal complex is a Li complex.

20. The organic light-emitting device as claimed in claim 18, wherein the metal complex is lithium quinolate (LiQ).

21. The organic light-emitting device as claimed in claim 18, wherein the metal complex is Compound 203, below:

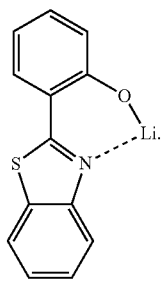

Compound 203

* * * * *